US006292413B1

United States Patent
Kato et al.

(10) Patent No.: US 6,292,413 B1
(45) Date of Patent: *Sep. 18, 2001

(54) SEMICONDUCTOR DEVICE, SEMICONDUCTOR MEMORY DEVICE AND SEMICONDUCTOR INTEGRATED CIRCUIT DEVICE

(75) Inventors: Hiroshi Kato; Hideto Hidaka; Tsukasa Ooishi, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 61 days.

(21) Appl. No.: 09/288,962

(22) Filed: Apr. 9, 1999

(30) Foreign Application Priority Data

| May 26, 1998 | (JP) | 10-144084 |
| Jun. 17, 1998 | (JP) | 10-169956 |
| Aug. 26, 1998 | (JP) | 10-240108 |
| Nov. 12, 1998 | (JP) | 10-322077 |

(51) Int. Cl.$^7$ .................................................. G11C 7/00
(52) U.S. Cl. ................. 365/200; 365/230.03; 365/230.06
(58) Field of Search ..................... 365/226, 200, 365/230.06, 230.03

(56) References Cited

U.S. PATENT DOCUMENTS

| 5,677,880 | * | 10/1997 | Horiguchi et al. | 365/200 |
| 5,848,009 | * | 12/1998 | Lee et al. | 365/200 |
| 5,963,467 | * | 10/1999 | Miyatake et al. | 365/149 |
| 6,011,735 | * | 1/2000 | Ooishi et al. | 365/200 |

FOREIGN PATENT DOCUMENTS

| 06-203558 | 7/1994 | (JP) . |
| 06-237164 | 8/1994 | (JP) . |
| 08-083487 | 3/1996 | (JP) . |

OTHER PUBLICATIONS

"Advanced Electronics Series, VLSI Memory", by Kiyoo Ito, Baifukan, Nov. 5, 1994, pp. 350–371. (with English comment).

* cited by examiner

Primary Examiner—Richard Elms
Assistant Examiner—Hien Nguyen
(74) Attorney, Agent, or Firm—McDermott, Will & Emery

(57) ABSTRACT

In an SDRAM, a column decoder is split into four blocks, and a specific predecode signal is allocated to each block. A sub power supply line is provided in correspondence to each block, and a P-channel MOS transistor, having a relatively high threshold voltage, rendered conductive in response to the corresponding predecode signal is connected between the sub power supply line and a main power supply line. A power supply potential is supplied to only a selected block, for reducing a leakage current.

29 Claims, 56 Drawing Sheets

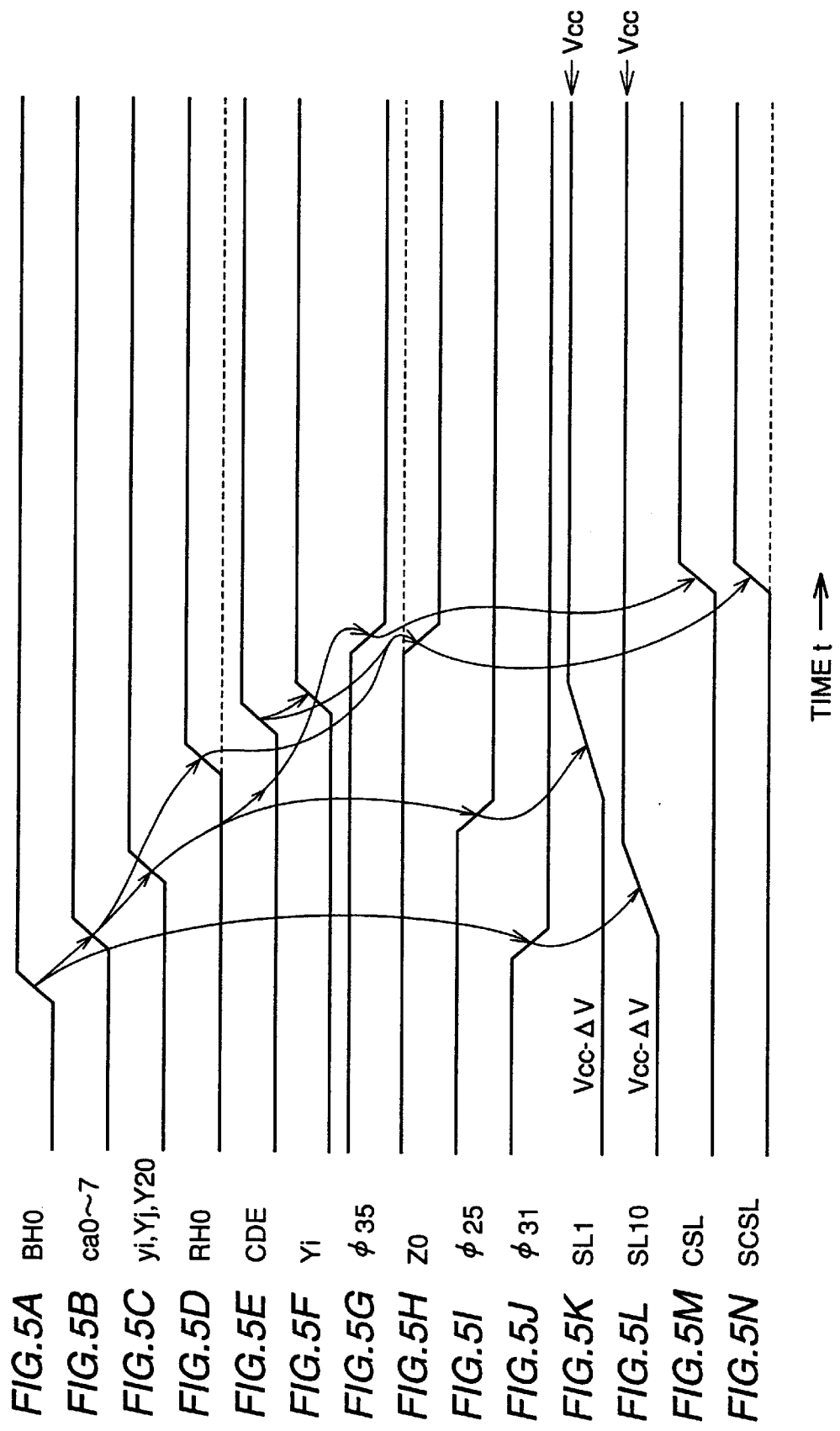

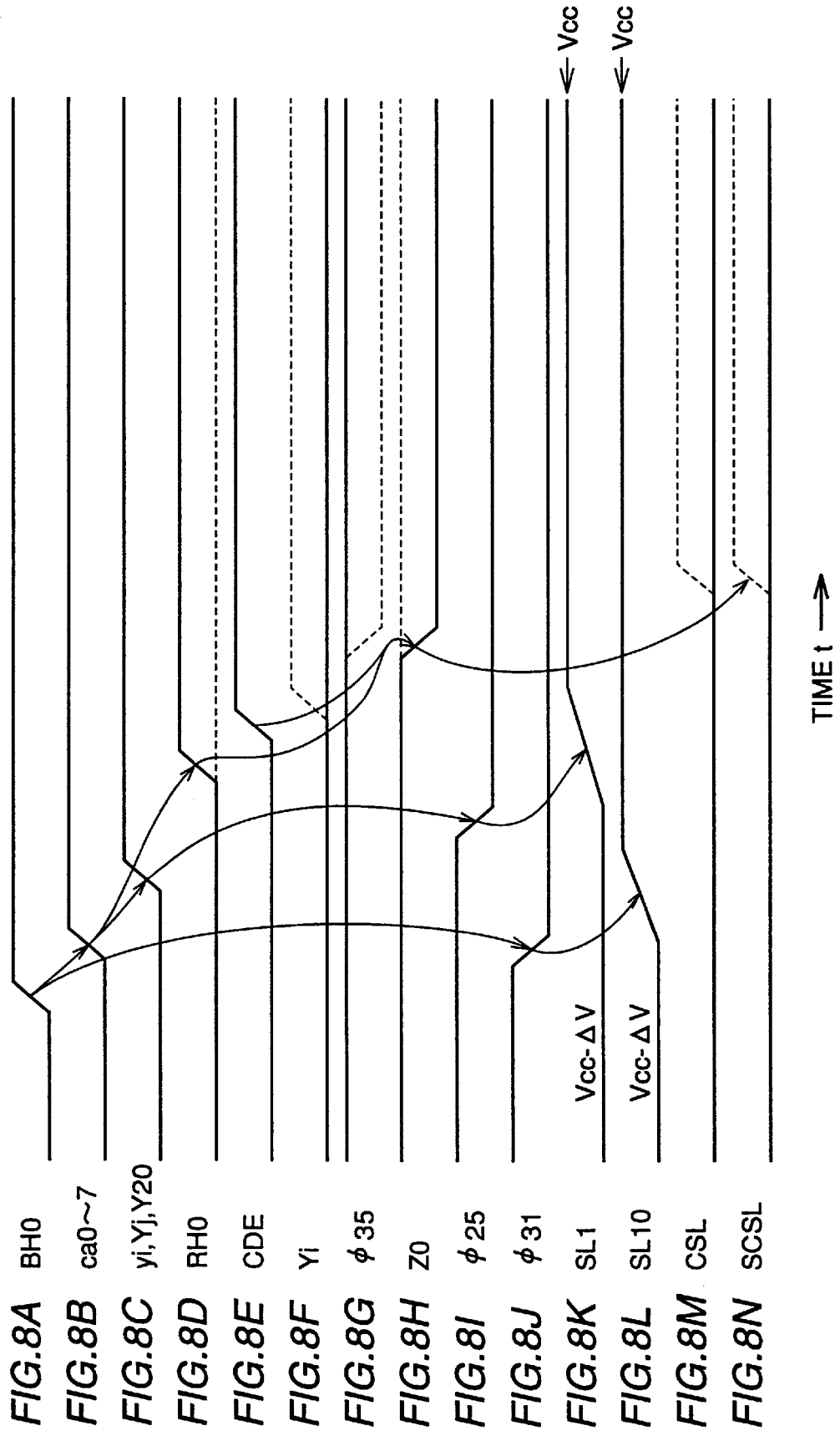

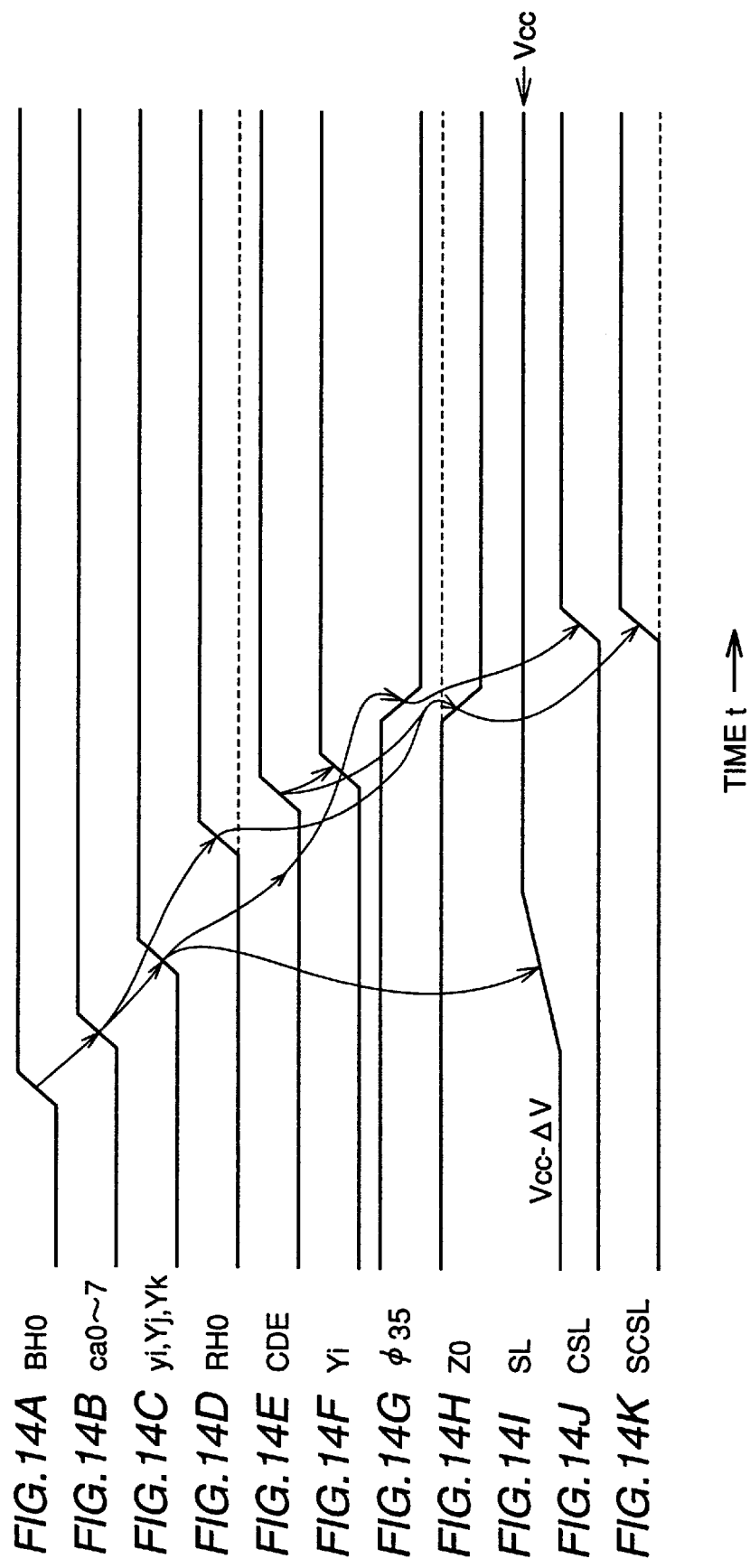

REDUNDANCY PART (RCD)

NORMAL PART (DB1~4)

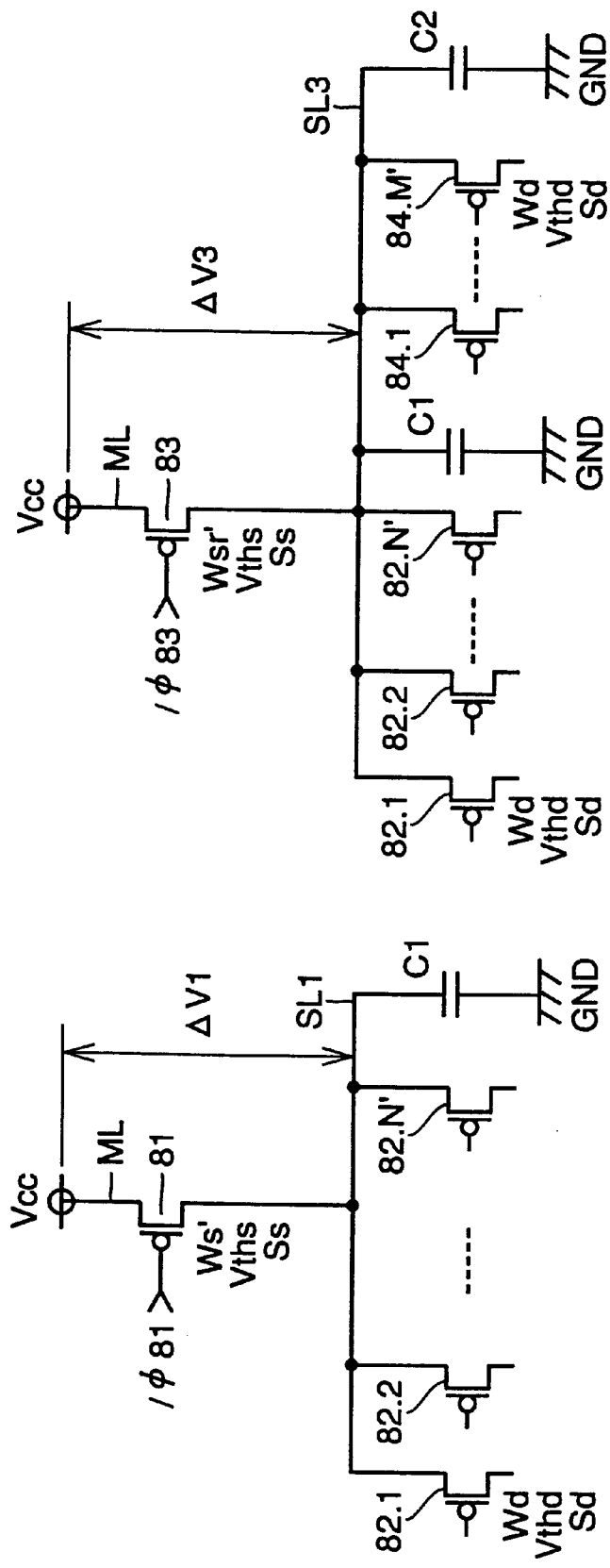
FIG.28B REDUNDANCY + NORMAL PART (DB4',5')
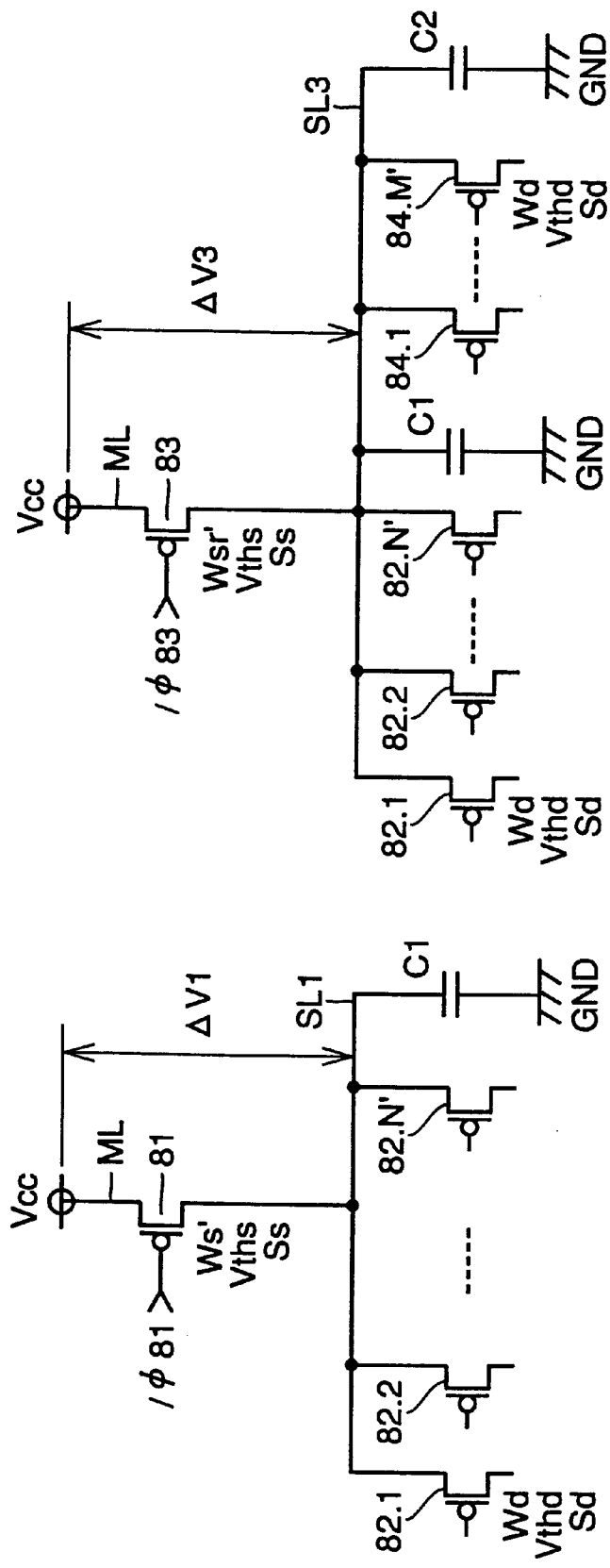
FIG.28A NORMAL PART (DB1~3,6~8)

REDUNDANCY PART (RCD)

NORMAL PART (DB1~4)

REDUNDANCY + NORMAL PART (DB4',5')

NORMAL PART (DB1~3,6~8)

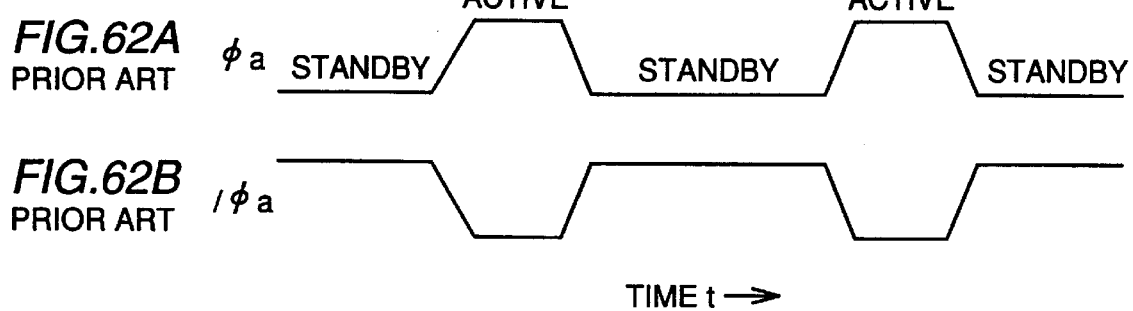

US 6,292,413 B1

SEMICONDUCTOR DEVICE, SEMICONDUCTOR MEMORY DEVICE AND SEMICONDUCTOR INTEGRATED CIRCUIT DEVICE

BACKGROUND OF THE INVENTION

1. Field of the Invention

The present invention relates to a semiconductor device, and more specifically, it relates to a semiconductor memory device having a split hierarchical power supply structure.

2. Description of the Prior Art (1) Prior Art 1

In a recent CMOS semiconductor integrated circuit device, a device such as a MOS transistor is now being refined while the power supply voltage therefor is reduced in order to improve the reliability of the refined device and reduce power consumption. The threshold voltage Vth of the MOS transistor is also reduced for performing a high-speed operation with the low power supply voltage.

If the threshold voltage Vth of the MOS transistor is reduced, however, a subthreshold leakage current flowing between its source and drain is increased when the MOS transistor is non-conductive. This leads to increase of the direct current consumed by the overall CMOS semiconductor integrated circuit device, particularly in a standby state. In order to solve this problem, an MT-CMOS (multi-threshold CMOS) system has been proposed.

FIG. 60 is a circuit diagram showing a principal part of a CMOS semiconductor integrated circuit device employing the MT-CMOS system. Referring to FIG. 60, the CMOS semiconductor integrated circuit device includes a CMOS logic circuit (invertor)INV in FIG. 60) formed by a P-channel MOS transistor QP1 and an N-channel MOS transistor QN1 having low threshold voltages LVthp and LVthn respectively and a P-channel MOS transistor QP2 having a relatively high threshold voltage MVthp.

The P-channel MOS transistor QP1 and the N-channel MOS transistor QN1 are serially connected between a power supply node N1 and a ground node N2 of the invertor INV while the gates thereof are connected to an input node N3 of the invertor INV and the drains thereof form an output node N4 of the invertor INV. The P-channel MOS transistor QP2 is connected between a line of a power supply potential Vcc and the power supply node N1 of the inverter INV, and its receives a chip selection signal /CS. The ground node N2 of the invertor INV is connected to a line of a ground potential GND.

In an active state, the signal /CS goes low for activation and the P-channel MOS transistor QP2 is rendered conductive for supplying the power supply potential Vcc to the power supply node N1 of the invertor INV. When an input signal VI for the invertor INV falls from a high level to a low level, the P-channel MOS transistor QP1 is rendered conductive and the N-channel MOS transistor QN1 is rendered non-conductive so that an output signal VO from the invertor INV goes high. At this time, a high-speed operation is attained due to the low threshold voltages LVthp and LVthn of the P-channel MOS transistor QP1 and the N-channel MOS transistor QN1.

In a standby state, the signal /CS goes high for inactivation and the P-channel MOS transistor QP2 is rendered non-conductive for stopping the supply of the power supply potential Vcc to the power supply node N1 of the invertor INV. The input signal VI rises from the low level to a high level, the P-channel MOS transistor QP1 is rendered non-conductive and the N-channel MOS transistor QN1 is rendered conductive so that the output signal VO goes high. While a subthreshold leakage current flows from the line of the power supply potential Vcc to the line of the ground potential GND through the MOS transistors QP2, QP1 and QN1 at this time, this subthreshold leakage current is suppressed low due to the presence of the P-channel MOS transistor QP2 having the relatively high threshold voltage MVthp.

(2) Prior Art 2

When the threshold value of a transistor is reduced following refinement of the transistor and reduction of a power supply voltage, the value of a subthreshold current flowing in an OFF state of the transistor is increased. Japanese Patent Laying-Open No. 6-237164 (1994) discloses an SCRC (subthreshold current reduction control) technique for reducing such a subthreshold current. According to this SCRC technique, switches are inserted between a CMOS invertor circuit and a power source and between the CMOS invertor circuit and the ground respectively. In an active state, both switches are turned on so that the invertor circuit supplies an output signal in response to an input signal as general. When the invertor circuit supplies an output signal of a high logical level in a standby state, the switch for the power source is turned on while that for the ground is turned off.

A subthreshold current flowing through an N-channel MOS transistor provided in the invertor circuit is reduced since the switch for the ground is turned off. When the invertor circuit supplies an output signal of a low logical level in the standby state, on the other hand, the switch for the power source is turned off and that for the ground is turned on. In this case, a subthreshold current flowing through a P-channel MOS transistor provided in the invertor circuit is reduced since the switch for the power source is turned off.

Japanese Patent Laying-Open No. 6-203558 (1994) discloses a dynamic random access memory (DRAM) employing the aforementioned SCRC technique. In this DRAM, a word line driver is split into blocks, so that each block is provided with a plurality of word line drivers and a sub power supply line connected to these word line drivers in common. Each sub power supply line is connected to a main power supply line in common through a selection transistor. Each selection transistor is turned on when the corresponding block is in an active state, and turned off when in a standby state. In a block of a standby state, therefore, subthreshold currents flowing through the word line drivers are reduced.

(3) Prior Art 3

FIG. 61 is a circuit diagram showing a principal part of a CMOS semiconductor integrated circuit device employing the so-called hierarchical power supply system. Referring to FIG. 61, the CMOS semiconductor integrated circuit device includes main power supply lines ML, main ground lines ML', a sub power supply line SL, a sub ground line SL', a P-channel MOS transistor QP5, an N-channel MOS transistor QN5 and a plurality of invertors INV1, INV2, . . . The P-channel MOS transistor QP5 and the N-channel MOS transistor QN5 have relatively high threshold voltages MVthp and MVthn respectively. The invertors INV1, INV2, . . . are formed by P-channel MOS transistors and N-channel MOS transistors having relatively low threshold voltages LVthp and LVthn respectively, similarly to the invertor INV shown in FIG. 60.

Each main power supply line ML is externally supplied with a power supply potential Vcc. The P-channel MOS transistor QP5 is connected between the main power supply line ML and the sub power supply line SL, and its gate receives an inverted signal /φa of an activation signal φa.

Each main ground line ML' is externally supplied with a ground potential GND. The N-channel MOS transistor Qn5 is connected between the main ground line ML' and the sub ground line SL', and its gate receives the activation signal φa.

As shown in FIGS. 62A and 62B, the activation signal φa goes low in a standby state and high in an active state. The MOS transistors QP5 and QN5 are turned off in the standby state to disconnect the sub power supply line SL and the sub ground line SL' from the main power supply line ML and the main ground line ML' respectively, while the MOS transistors QP5 and QN5 are turned on in the active state to connect the sub power supply line SL and the sub ground line SL' to the main power supply line ML and the main ground line ML' respectively.

The invertors INV1, INV2, ... are serially connected with each other. A signal VI is inputted in the initial-stagelinvertov INV1. The signal VI goes low in the standby state and high in the active state.

Power supply nodes of the odd-stage invertor INV1, INV3, ... whose P-channel MOS transistors are rendered conductive in the standby state to output high levels are connected to the main power supply lines ML, and ground nodes thereof are connected to the sub ground line SL'.

Power supply nodes of the even-stage invertors INV2, INV4, ... whose N-channel MOS transistors are rendered conductive in the standby state to output low levels are connected to the sub power supply line SL and ground nodes thereof are connected to the main ground lines ML'.

In the standby state, the main power supply lines ML and the main ground lines ML' are disconnected from the sub power supply line SL and the sub ground line SL' respectively, to reduce standby currents, i.e., subthreshold leakage currents of the MOS transistors included in the invertors INV1, INV2, ... At this time, the outputs of the invertors INV1, NV2, ... are not unstabilized since the power supply nodes of the invertors INV1, INV3, ... outputting high levels are connected to the main power supply lines ML while the ground nodes of the invertors INV2, INV4, ... outputting low levels are connected to the main ground lines SL.

In the active state, the main power supply lines ML and the main ground lines ML' are connected with the sub power supply line SL and the sub ground line SL' respectively, to supply the invertor NV1, INV2, ... with the power supply potential Vcc and the ground potential GND. The invertors INV1, INV2, ..., which are formed by the P-channel MOS transistors and the N-channel MOS transistors having the relatively low threshold voltages LVthp and LVthn respectively, operate at a high speed.

However, the CMOS semiconductor integrated circuit device shown in FIG. 60 regularly renders the P-channel MOS transistor QP2 conductive in the active state even if the invertor INV may not be supplied with the power supply potential Vcc (the signal VI is at a high level), and still consumes a large current.

Although the SCRC technique can reduce a subthreshold current flowing in a standby state as described above, the voltage of a sub power supply line, electrically disconnected from a main power supply line in the standby state, remarkably lowers from a power supply voltage in the standby state. While the sub power supply line is connected to the main power supply line when the standby state is converted to an active state, a prescribed time is required for the voltage of the sub power supply line to reach the power supply voltage. Immediately after entering the active state, therefore, a logic circuit connected to the sub power supply line cannot correctly operate.

Japanese Patent Laying-Open No. 8-83487 (1996) discloses a method for solving this problem. According to this method, a voltage set circuit is provided for setting the voltage of a main power supply line at a prescribed level lower than a power supply voltage. However, this voltage set circuit operates not only in a standby state but also in an active state, and hence consumes large current.

In the CMOS semiconductor integrated circuit shown in FIG. 61, the sub power supply line SL and the sub ground line SL' require a certain degree of time for reaching the power supply potential Vcc and the ground potential GND after the MOS transistors QP5 and QN5 are turned on in a first active cycle after power supply, and hence the circuit operation is disadvantageously retarded to cause a malfunction.

SUMMARY OF THE INVENTION

Accordingly, an object of the present invention is to provide a semiconductor memory device and a semiconductor device having small current consumption.

Another object of the present invention is to provide a semiconductor integrated circuit device preventing delay in operation of a logic circuit following a split hierarchical power supply structure.

Still another object of the present invention is to provide a semiconductor integrated circuit device having a split hierarchical power supply structure preventing increase of power consumption.

According to an aspect of the present invention, a first transistor rendered conductive in response to an address signal is connected between a main power supply line and a sub power supply line, and a decoder is driven by a power supply potential supplied from the main power supply line through the sub power supply line to set a memory cell selection line at a selection potential in response to the address signal. Thus, the decoder is supplied with the power supply potential only when the address signal is inputted, whereby a subthreshold leakage current flowing in the decoder is reduced as compared with the prior art supplying a power supply potential to a decoder in an active period even if no address signal is inputted, and current consumption is reduced.

Preferably, a plurality of memory cells are split into a plurality of groups, a specific group selection signal included in the address signal is allocated to each group, the first transistor and the sub power supply line are provided in correspondence to each group, and the first transistor is rendered conductive in response to the corresponding group selection signal. Thus, the decoder is supplied with the power supply potential only when the corresponding group selection signal is inputted while that of a non-selected group is supplied with no power supply potential, whereby the current consumption is further reduced.

Preferably, a plurality of memory cells are split into a plurality of groups, a specific group selection signal included in the address signal is allocated to each group, and a second transistor is further provided in correspondence to each group. The second transistor is connected between a part of the sub power supply line close to the corresponding decoder and the main power supply line, and rendered conductive in response to the corresponding group selection signal. In this case, the potential of an end portion of the sub power supply line is prevented from reduction by the impedance of the sub power supply line.

Preferably, the decoder includes a logic circuit outputting a memory cell selection signal in response to the corresponding address signal and a third transistor connected between the sub power supply line and the corresponding memory cell selection line and rendered conductive in response to the memory cell selection signal. In this case, the decoder can be readily structured.

Preferably, the threshold voltage of the third transistor is rendered smaller than that of the first transistor. In this case, the first transistor can reduce the subthreshold leakage current and the operating speed of the third transistor can be increased.

Preferably, the threshold voltage of the third transistor is equal to that of the first transistor. In this case, the first and third transistors can be readily formed.

Preferably, a plurality of third transistors are arranged at the same pitch as a plurality of memory selection lines, and the first transistor is dispersively arranged between the plurality of third transistors. If the first transistor is concentrically arranged, a circuit connected to the sub power supply line on a position separated from the concentrically arranged first transistor is inferior in current drivability to a circuit connected to the sub power supply line on a position close to the concentrically arranged first transistor, due to influence by the resistance of the sub power supply line. According to the present invention, however, a plurality of circuits connected to the sub power supply line have high current drivability equivalent to that of the circuit connected to the sub power supply line on the position close to the concentrically arranged first transistor, due to the dispersive arrangement of the first transistor. Further, area penalty may be small due to the dispersive arrangement.

Preferably, the first transistor is rendered conductive only for a prescribed time in response to supply of the power supply potential to the main power supply line. Thus, the sub power supply line is precharged in power supply, whereby the decoder is not delayed in operation to cause a malfunction even if the address signal is first inputted upon power supply.

According to another aspect of the present invention, a plurality of memory arrays each split into a plurality of memory blocks are provided while a first sub power supply line and a first transistor is provided in correspondence to each memory block. The first transistor is connected between a main power supply line and the corresponding first sub power supply line and rendered conductive in response to corresponding memory array selection signal and block selection signal, while a first decoder receives a power supply potential from the corresponding first sub power supply line and sets a corresponding memory cell selection line at a selection potential in response to corresponding memory array selection signal and address signal. Thus, the first decoder is supplied with the power supply potential only when the corresponding block selection signal is inputted while no power supply potential is supplied to those of non-selected memory arrays, whereby subthreshold leakage currents in the first decoders are reduced as compared with the prior art supplying all first decoders with a power supply potential in an active period, and current consumption is reduced.

Preferably, the first decoder includes a logic circuit responsively outputting a memory cell selection signal when the corresponding memory array selection signal and address signal are inputted and a second transistor connected between the corresponding first sub power supply line and the corresponding memory cell selection line and rendered conductive in response to the memory cell selection signal. In this case, the first decoder can be readily structured.

Preferably, the threshold voltage of the second transistor is rendered smaller than that of the first transistor. In this case, the first transistor can reduce the subthreshold leakage current and the operating speed of the second transistor can be increased.

Preferably, the threshold voltage of the second transistor is equal to that of the first transistor. In this case, the first and second transistors can be readily formed.

Preferably, the second transistors are arranged at the same pitch as a plurality of memory cell selection lines, and the first transistor is dispersively arranged between the plurality of second transistors. If the first transistor is concentrically arranged, a circuit connected to a sub power supply line on a position separated from the concentrically arranged first transistor is inferior in current drivability to a circuit connected to the sub power supply line on a position close to the concentrically arranged first transistor. According to the present invention, however, a plurality of circuits connected to the first sub power supply line have high current drivability equivalent to that of the circuit connected to the sub power supply line on the position close to the concentrically arranged first transistor, due to the dispersive arrangement of the first transistor. Further, area penalty may be small due to the dispersive arrangement.

Preferably, a third transistor and a second sub power supply line are further provided in correspondence to at least two memory blocks. The third transistor is connected between the main power supply line and the second sub power supply line and responsively rendered conductive when at least one of the corresponding memory array selection signal and block selection signal is inputted. The logic circuit of the first decoder receives the power supply potential from the corresponding second sub power supply line. In this case, a subthreshold leakage current in the logic circuit can be suppressed small for further reducing power consumption.

Preferably, a second decoder is further provided in correspondence to each memory array for generating the block selection signal in accordance with the corresponding memory array selection signal and address signal and supplying the same to an input electrode of the corresponding first transistor. In this case, the block selection signal can be quickly generated for quickly rendering the first transistor conductive.

Preferably, the first transistor is responsively rendered conductive by a prescribed time when the main power supply line is supplied with the power supply potential. Thus, the sub power supply line is precharged in power supply, whereby the first decoder is not delayed in operation to cause a malfunction even if the address signal is first inputted upon power supply.

According to still another aspect of the present invention, first and second transistors rendered conductive in response to an active signal are connected between a main power supply line and first and second sub power supply lines respectively. A decoder and a redundancy decoder are driven by a power supply potential supplied from the main power supply line through the first and second sub power supply lines respectively. Thus, the decoder and the redundancy decoder are supplied with the power supply potential only when the address signal is inputted, whereby subthreshold leakage currents in the decoder and the redundancy decoder are reduced as compared with the prior art supplying a power supply potential to a decoder and a redundancy decoder in an active period even if no address signal is inputted, and current consumption is reduced.

Preferably, the decoder is responsively inactivated when a corresponding determination circuit outputs a hit signal. Data is read/written from/in either a memory cell or a spare memory cell, and hence no data collision can take place.

Preferably, the decoder includes a logic circuit responsively outputting a memory cell selection signal when the corresponding address signal is inputted and a third transistor connected between the first sub power supply line and a corresponding memory cell selection line and rendered conductive in response to the memory cell selection signal, and the redundancy decoder includes a fourth transistor connected between the second sub power supply line and a spare memory cell selection line and rendered conductive in response to the hit signal. In this case, the decoder and the redundancy decoder can be readily structured.

Preferably, the threshold voltages of the third and fourth transistors are smaller than those of the first and second transistors respectively. In this case, the first and second transistors can reduce subthreshold leakage currents and the operating speeds of the third and fourth transistors can be increased.

Preferably, the threshold voltages of the third and fourth transistors are equal to those of the first and second transistors respectively. In this case, the first to fourth transistors can be readily structured.

Preferably, the first and second transistors are responsively rendered conductive for a prescribed time when the main power supply line is supplied with a power supply potential. Thus, the sub power supply line is precharged in power supply, whereby the decoder and the redundancy decoder are not delayed in operation to cause a malfunction even if the address signal is first inputted upon power supply.

According to a further aspect of the present invention, a transistor rendered conductive in response to an address signal is connected between a main power supply line and a sub power supply line, while a decoder and a redundancy decoder are driven by a power supply potential supplied from the main power supply line through the sub power supply line for setting a memory cell selection line and a spare memory cell selection line at a selection potential in response to the address signal. Thus, the decoder and the redundancy decoder are supplied with the power supply potential only when the address signal is inputted, whereby subthreshold leakage currents in the decoder and the redundancy decoder are reduced as compared with the prior art supplying the power supply potential to the decoder and the redundancy decoder in an active period even if no address signal is inputted, and current consumption is reduced.

Preferably, the transistor is responsively rendered conductive only for a prescribed time when the main power supply line is supplied with the power supply potential. Thus, the sub power supply line is precharged in power supply, whereby the decoder and the redundancy decoder are not delayed in operation to cause a malfunction even if the address signal is first inputted upon power supply.

In a semiconductor device having a hierarchical power supply structure with a main power supply line and a sub power supply line according to a further aspect of the present invention, a capacitor is connected to the sub power supply line for adding a capacitance other than a parasitic capacitance to the sub power supply line, whereby stability of the sub power supply line can be further improved in driving.

In a semiconductor device having a hierarchical power supply structure with a main power supply line and a sub power supply line according to a further aspect of the present invention, a transistor having high current drivability supplies a current to a part having a large capacitance even if the sub power supply line is split into a plurality of sub power supply lines having different capacitances, whereby the recovery time for a sub power supply line having a large capacitance can be rendered at least equivalent to that for a sub power supply line having a small capacitance.

In a semiconductor device having a hierarchical power supply structure with a main power supply line and a sub power supply line according to a further aspect of the present invention, a transistor having high current drivability supplies a current to a part having a small capacitance even if the sub power supply line is split into a plurality of sub power supply lines having different capacitances, whereby the current drivability of a circuit connected to a sub power supply line having a small capacitance can be rendered at least equivalent to that of a circuit connected to a sub power supply line having a large capacitance.

In a semiconductor device having a hierarchical power supply structure with a main power supply line and a sub power supply line according to a further aspect of the present invention, a first capacitor is connected to a sub power supply line having a small capacitance even if the sub power supply line is split into a plurality of sub power supply lines having different capacitances, whereby the current drivability of a circuit connected to the sub power supply line having a small capacitance can be rendered at least equivalent to that of a circuit connected to a sub power supply line having a large capacitance.

Preferably, a second capacitor is connected to the sub power supply line having a large capacitance. In this case, stability of the sub power supply line having a large capacitance can be improved in driving.

In a semiconductor device having a hierarchical power supply structure with a main power supply line and a sub power supply line according to a further aspect of the present invention, a transistor connected between the main power supply line and the sub power supply line is responsively rendered conductive for a prescribed time when the main power supply line is supplied with a power supply potential, and responsively rendered conductive when a control signal is inputted. Thus, the sub power supply line is precharged in power supply, whereby an internal circuit is not delayed in operation even if the control signal is first inputted upon power supply.

In a semiconductor device having a hierarchical power supply structure with a main power supply line and a sub power supply line according to a further aspect of the present invention, a first transistor connected between the main power supply line and the sub power supply line is responsively rendered conductive for a prescribed time when the main power supply line is supplied with a power supply potential, and rendered conductive in an active mode. Thus, the sub power supply line is precharged in power supply, whereby an internal circuit is not delayed in operation even if the semiconductor device first enters the active mode upon power supply.

Preferably, the internal circuit is an invertor inverting and outputting an input signal and this invertor includes second and third transistors serially connected between the sub power supply line and a second power supply line, while the input signal is held at a first power supply potential in a standby mode and a precharge period. In this case, the output of the invertor is held at a second power supply potential to be not unstabilized.

Preferably, the internal circuit is an invertor inverting and outputting an input signal, the invertor includes second and third transistors serially connected between the sub power supply line and a second power supply line, the absolute value of the threshold voltage of the third transistor is larger than that of the second transistor, and the input signal is held at a first power supply potential in a standby mode and at a second power supply potential in power supply. If transition from an active mode to the standby mode may not be performed at a high speed, current consumption is further reduced due to this structure.

A semiconductor integrated circuit device according to a further aspect of the present invention includes a plurality of internal circuit groups, a main power supply line, and a plurality of sub power supply lines. Each of the internal circuit groups enters an active state or a standby state. The main power supply line receives a power supply voltage. The plurality of sub power supply lines are provided in correspondence to the plurality of internal circuit groups. Each of the internal circuit groups includes a first logic circuit. The first logic circuit is connected to the corresponding sub power supply line for supplying an output signal of the power supply voltage or a ground voltage in response to an input signal in the active state while supplying an output signal of the ground voltage in the standby state. The semiconductor integrated circuit device further includes a plurality of first switching elements and a plurality of first precharge circuits. The plurality of first switching elements are provided in correspondence to the plurality of internal circuit groups. Each of the first switching elements is connected between the main power supply line and the corresponding sub power supply line to be turned on when the corresponding internal circuit group enters the active state and turned off when the same enters the standby state. The plurality of first precharge circuits are provided in correspondence to the plurality of internal circuit groups. Each of the first precharge circuits starts precharging the corresponding sub power supply line toward a first prescribed voltage lower than the power supply voltage and higher than the ground voltage before the corresponding internal circuit group enters the active state.

The aforementioned semiconductor integrated circuit device, starting to precharge the corresponding sub power supply line before each internal circuit group enters the active state, can immediately start operation when the internal circuit group enters the active state.

Preferably, each of the first precharge circuits includes a diode element and a second switching element. The diode element is forwardly connected between the main power supply line and the corresponding sub power supply line. The second switching element is serially connected with the diode element and turned on before the corresponding internal circuit group enters the active state. More preferably, the diode element is a diode-connected transistor.

Thus, a voltage lower than the power supply voltage by the threshold voltage of the diode element is supplied to the sub power supply line for precharging the sub power supply line.

Preferably, each of the first precharge circuits starts precharging before the corresponding internal circuit group enters the active state, and ends the precharging before the corresponding internal circuit group enters the active state.

Thus, the power necessary for the precharging is suppressed.

Preferably, each of the first precharge circuits starts the precharging before the corresponding internal circuit group enters the active state, and continues the precharging while the corresponding internal circuit group is in the active state.

When the internal circuit group is in the active state, therefore, the precharge circuit can compensate for the corresponding first switching element for the internal circuit group with power.

Preferably, the aforementioned semiconductor integrated circuit device further includes a memory cell array. The memory cell array has a plurality of memory cells arranged in a plurality of rows and a plurality of columns. One of the internal circuit groups includes a row decoder for selecting a row of the memory cell array. Another one of the internal circuit groups includes a column decoder for selecting a column of the memory cell array after operation of the row decoder. The first precharge circuit corresponding to the internal circuit group including the column decoder starts the precharging during operation of the row decoder.

Preferably, the aforementioned semiconductor integrated circuit device further includes a main ground line and a plurality of sub ground lines. The main ground line receives a ground voltage. The plurality of sub ground lines are provided in correspondence to the plurality of internal circuit groups. Each of the internal circuit groups further includes a second logic circuit. The second logic circuit is connected to the corresponding sub ground line for supplying an output signal of the power supply voltage or the ground voltage in response to an input signal in the active state while supplying an output signal of the power supply voltage in the standby state. The aforementioned semiconductor integrated circuit device further includes a plurality of second switching elements and a plurality of second precharge circuits. The plurality of second switching elements are provided in correspondence to the plurality of internal circuit groups. Each of the second switching elements is connected between the main ground line and the corresponding sub ground line, to be turned on when the corresponding internal circuit group enters the active state and turned off when the same enters the standby state. The plurality of second precharge circuits are provided in correspondence to the plurality of internal circuit groups. Each of the second precharge circuits starts precharging the corresponding sub ground line toward a second prescribed voltage lower than the power supply voltage and higher than the ground voltage before the corresponding internal circuit group enters the active state. The aforementioned semiconductor integrated circuit device, precharging the sub ground line not only on the power supply side but also on the ground side, can more quickly start operation when the internal circuit group enters the active state.

A semiconductor integrated circuit device according to a further aspect of the present invention includes a plurality of internal circuit groups, a main ground line and a plurality of sub ground lines. Each of the internal circuit groups enters an active state or a standby state. The main ground line receives a ground voltage. The plurality of sub ground lines are provided in correspondence to the plurality of internal circuit groups. Each of the internal circuit groups includes a logic circuit. The logic circuit is connected to the corresponding sub ground line for supplying an output signal of a power supply voltage or the ground voltage in response to an input signal in the active state while supplying an output signal of the power supply voltage in the standby state. The aforementioned semiconductor integrated circuit device further includes a plurality of switching elements and a plurality of precharge circuits. The plurality of switching elements are provided in correspondence to the plurality of internal circuit groups. Each of the switching elements is connected between the main ground line and the corresponding sub ground line, to be turned on when the corresponding internal circuit group enters the active state and turned off when the same enters the standby state. The plurality of precharge circuits are provided in correspondence to the plurality of internal circuit groups. Each of the precharge circuits starts precharging the corresponding sub ground line toward a prescribed voltage lower than the power supply voltage and higher than the ground voltage before the corresponding internal circuit group enters the active state.

The aforementioned semiconductor integrated circuit device, precharging the corresponding sub ground line before each internal circuit group enters the active state, can immediately start operation when the internal circuit group enters the active state.

A semiconductor integrated circuit device according to a further aspect of the present invention includes a bank decoder, a plurality of banks, a main power supply line and a plurality of sub power supply lines. The bank decoder generates a bank decode signal in response to a bank address signal. The plurality of banks are selective activated in response to the bank decode signal. The main power supply line receives a power supply voltage. The plurality of sub power supply lines are provided in correspondence to the plurality of banks. Each of the banks includes a memory cell array and a decoder. The memory cell array has a plurality of memory cells arranged in a plurality of rows and a plurality of columns. The decoder enters an active state when the banks are activated while entering a standby state when the same are not activated, and selects the memory cells in the active state. The decoder includes a logic circuit. The logic circuit is connected to the corresponding sub power supply line for supplying an output signal of the power supply voltage or the ground voltage in response to an input signal in the active state while supplying an output signal of the ground voltage in the standby state. The aforementioned semiconductor integrated circuit device further includes a plurality of switching elements and a plurality of precharge circuits. The plurality of switching elements are provided in correspondence to the plurality of banks. Each of the switching elements is connected between the main power supply line and the corresponding sub power supply line to be turned on when the corresponding bank is activated and turned off when the same is not activated. The plurality of precharge circuits are provided in correspondence to the plurality of banks. Each of the precharge circuits starts precharging the corresponding sub power supply line toward a prescribed voltage lower than the power supply voltage and higher than the ground voltage in response to the bank decode signal when the corresponding bank is activated.

The aforementioned semiconductor integrated circuit device, precharging the sub power supply line in response to the bank decode signal, can immediately start operation when the decoder enters the active state.

Preferably, the decoder is split into a plurality of mats. Each of the sub power supply lines includes a plurality of mat sub power supply lines. The plurality of mat sub power supply lines are provided in correspondence to the plurality of mats. Each of the switching elements includes a plurality of mat switching elements. The plurality of mat switching elements are provided on correspondence to the plurality of mats. Each of the mat switching elements is connected between the main power supply line and the corresponding mat sub power supply line to be turned on when the decoder of the corresponding mat enters the active state and turned off when the same enters the standby state.

Each of the precharge circuits includes a plurality of diode elements and a plurality of switching elements. The plurality of diode elements are provided in correspondence to the plurality of mats. Each of the diode elements is forwardly connected between the main power supply line and the corresponding mat sub power supply line. The plurality of switching elements are provided in correspondence to the plurality of diode elements. Each of the switching elements is serially connected with the corresponding diode element and turned on before the decoder of the corresponding bank enters the active state.

Therefore, a voltage lower than the power supply voltage by the threshold voltage of the diode element is supplied to the mat sub power supply line, for precharging the mat sub power supply line.

Further preferably, each of the precharge circuits includes a level shift circuit and a plurality of switching elements. The level shift circuit, connected to receive the power supply voltage from the main power supply line, reduces the power supply voltage to a prescribed voltage and supplies the prescribed voltage to one of the mat sub power supply lines. The plurality of switching elements are connected between the plurality of mat sub power supply lines respectively and turned on before the corresponding bank enters the active state.

Therefore, the level shift circuit can precharge the mat sub power supply lines through the switching elements.

Further preferably, the level shift circuit includes a differential amplifier and a transistor. The differential amplifier has an input terminal connected to the main power supply line and another input terminal connected to one mat sub power supply line. The transistor is connected between the main power supply line and one mat sub power supply line, and has a gate connected to an output terminal of the differential amplifier.

Thus, the differential amplifier controls the transistor to supply a prescribed voltage to the mat sub power supply line.

Further preferably, each of the precharge circuits further includes a constant current circuit. The constant current circuit is connected between an output terminal of the level shift circuit and one mat sub power supply line.

Thus, the constant current circuit can suppress a peak current flowing from the level shift circuit to the mat sub power supply line.

Further preferably, the constant current circuit includes a resistive element, a differential amplifier and a transistor. The resistive element is connected between the output terminal of the level shift circuit and one mat sub power supply line. The differential amplifier has an input terminal connected to a terminal of the resistive element and another input terminal connected to another terminal of the resistive element. The transistor is serially connected with the resistive element, and has a gate connected to an output terminal of the differential amplifier.

Thus, the differential amplifier controls the transistor so that a current flowing through the resistive element is constant.

Further preferably, each of the precharge circuits includes a level shift circuit and a plurality of resistive elements. The level shift circuit, connected to receive the power supply voltage from the main power supply line, reduces the power supply voltage to a prescribed voltage and supplies the prescribed voltage to one of the mat sub power supply lines. The plurality of resistive elements are connected between the plurality of mat sub power supply lines respectively.

Therefore, the prescribed voltage from the level shift circuit is supplied to each mat sub power supply line through the plurality of resistive elements.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 5A to 5N are timing charts showing operations of the circuits shown in FIGS. 3, 4A and 4B;

FIGS. 8A to 8N are timing charts showing operations of the circuits shown in FIGS. 6 and 7;

FIGS. 14A to 14K are timing charts showing operations of the circuits shown in FIGS. 12, 13A and 13B;

FIGS. 28A and 28B are circuit diagrams for illustrating the gate width of a MOS transistor for supplying a power supply potential etc. in the SDRAM shown in FIG. 27;

FIGS. 62A and 62B are timing charts showing operations of the CMOS semiconductor integrated circuit device shown in FIG. 61.

DESCRIPTION OF THE PREFERRED EMBODIMENTS

Figure 1:
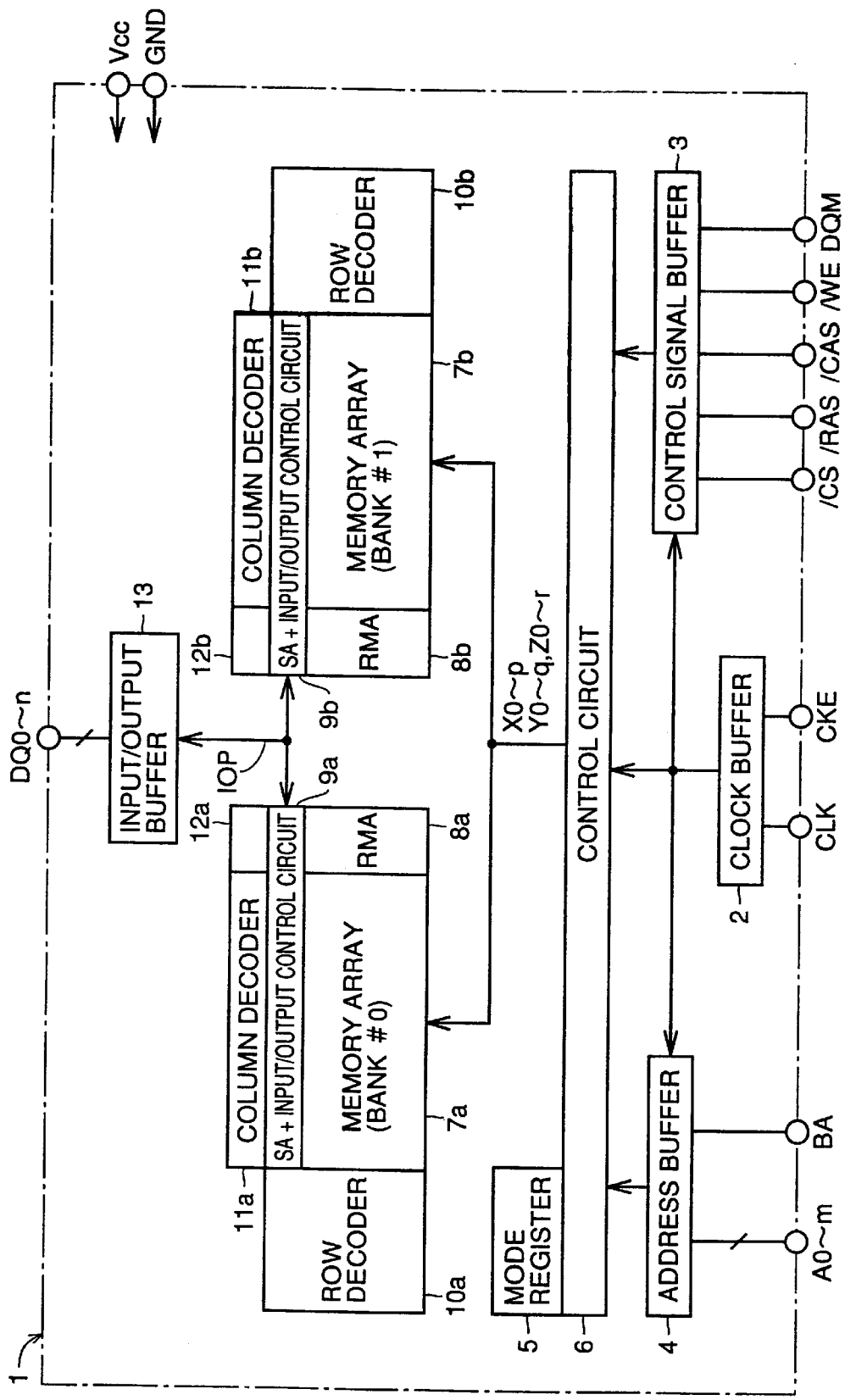
FIG. 1 is a block diagram showing the overall structure of an SDRAM according to an embodiment 1 of the present invention.

Embodiments of the present invention are now described in detail with reference to the drawings. In the drawings, identical or corresponding parts are denoted by the same reference numerals, to omit redundant description.

Embodiment 1

Figure 2:
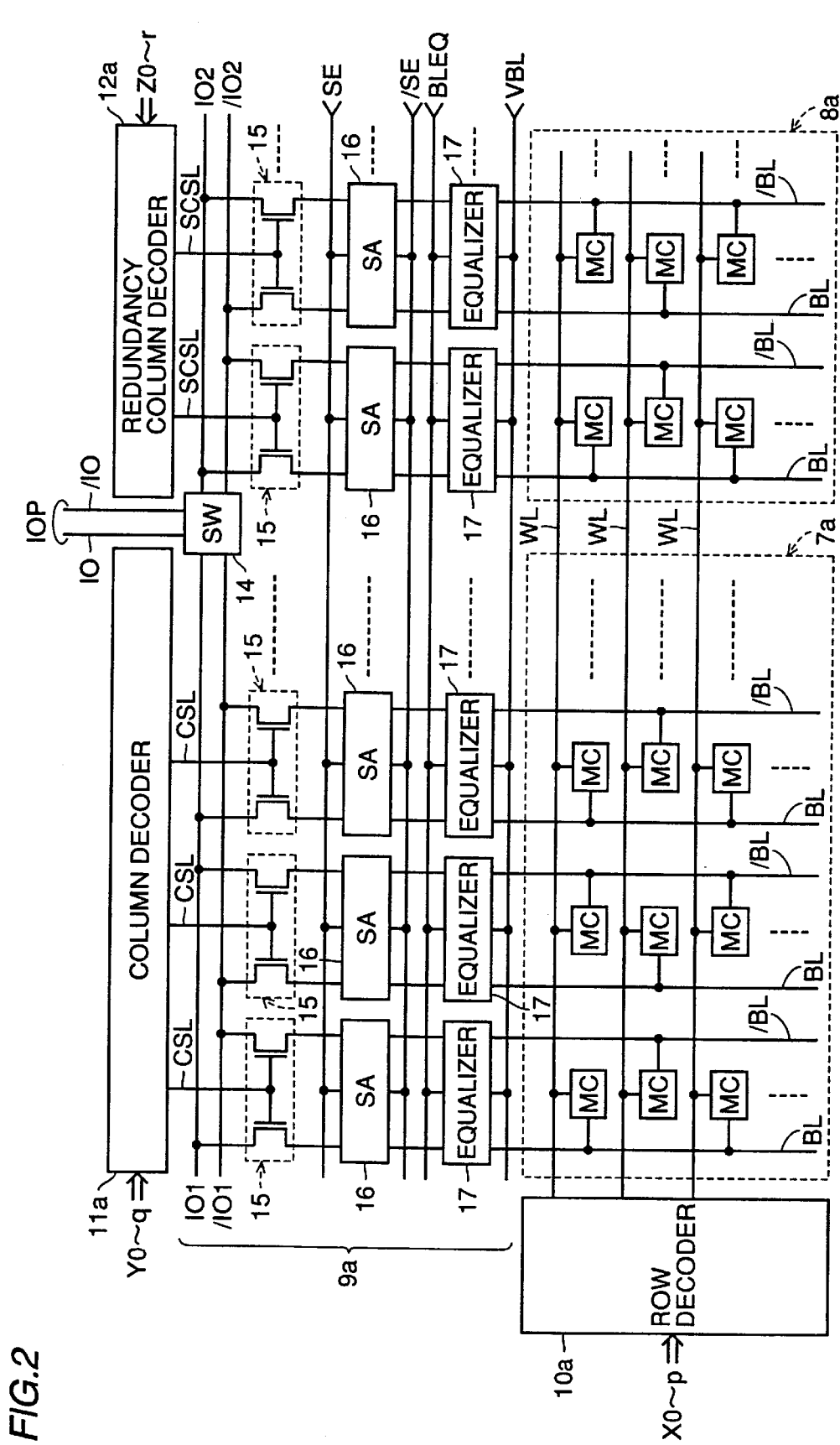
FIG. 2 is a partially omitted circuit block diagram showing a principal part of the SDRAM shown in FIG. 1.

FIG. 1 is a block diagram showing the structure of a synchronous dynamic random access memory (hereinafter referred to as SDRAM) 1 according to an embodiment 1 of the present invention, and FIG. 2 is a circuit block diagram showing the structure of a principal part thereof. Referring to FIGS. 1 and 2, the SDRAM 1 includes a clock buffer 2, a control signal buffer 3, an address buffer 4, a mode register 5 and a control circuit 6.

The clock buffer 2 is activated by a signal CKE, to transmit an external clock signal CLK to the control signal buffer 2, the address buffer 4 and the control circuit 6. The control signal buffer 3 transmits external control signals /CS, /RAS, /CAS, /WE and DQM to the control circuit 6 in synchronization with the external clock signal CLK from the clock buffer 2. The address buffer 4 transmits external address signals A0 to Am (m: integer of at least 0) and a bank selection signal BA to the control circuit 6. The mode register 5 stores a mode specified by the external address signals A0 to Am and the like. The control circuit 6 generates various internal signals in accordance with signals from the buffers 2 to 4 and the mode register 5, to control the overall SDRAM 1.

The SDRAM 1 further includes a memory array 7a (bank #0), another memory array 7b (bank #1), redundancy memory arrays (RAMs) 8a and 8b, sense refresh amplifier+input/output control circuits 9a and 9b, row decoders 10a and 10b, column decoders 11a and 11b, redundancy column decoders 12a and 12b and an input/output buffer 13.

As shown in FIG. 2, the memory array 7a includes a plurality of memory cells MC arranged in rows and columns, word lines WL provided in correspondence to the respective rows, and pairs of bit lines BL and /BL provided in correspondence to the respective columns. Each memory cell MC is a well-known one including an access transistor and a capacitor for storing information. Each word line WL transmits an output of the row decoder 10a and activates a memory cell MC of a selected row. Each pair of bit lines BL and /BL input/output a data signal in/from the selected memory cell MC.

The redundancy memory array 8a is identical in structure to the memory array 7a, except that the number of columns is smaller than that in the memory array 7a. The memory array 7a and the redundancy memory array 8a have the same numbers of rows, and share the word lines WL. It is assumed that the redundancy memory array 8a has r+1 (r: integer of at least 0) columns. A defective column present in the memory array 7a is replaced with a column in the redundancy memory array 8a.

The sense refresh amplifier+input/output control circuit 9a includes a pair of data input/output lines IO1 and /IO1 provided in correspondence to the memory array 7a, a pair of data input/output lines IO2 and /IO2 provided in correspondence to the redundancy memory array 8a, a pair of data input/output lines IO and /IO (IOP) provided in common to the memory arrays 7a and 8a, and an I/O switch 14. The I/O switch 14 connects the pair of data input/output lines IO2 and /IO2 with the pair of data input/output lines IO and /IO when the redundancy memory array 8a is selected, while connecting the pair of data input/output lines IO1 and /IO1 with the pair of data input/output lines IO and /IO when the redundancy memory array 8a is not selected.

The sense refresh amplifier+input/output control circuit 9a further includes a column selection line CSL provided in correspondence to each column of the memory array 7a, a spare column selection line SCSL provided in correspondence to each column of the redundancy memory array 8a, as well as a column selection gate 15, a sense refresh amplifier 16 and an equalizer 17 provided in correspondence to each column. The column selection gate 15 includes a pair of N-channel MOS transistors connected between a pair of bit lines BL and /BL of the corresponding column and the pair of data input/output lines IO1 and /IO1 or IO2 and /IO2.

The gate of each N-channel MOS transistor is connected to the column decoder 11a or the redundancy column decoder 12a through the column selection line CSL or the spare column selection line SCSL of the corresponding column. When the column decoder 11a or the redundancy column decoder 12a raises the column selection line CSL or the spare column selection line SCSL to a high level for selection, the N-channel MOS transistors are rendered conductive to couple the pair of bit lines BL and /BL with the pair of data input/output lines IO1 and /IO1 or IO2 and /IO2.

The sense refresh amplifier 16 responsively amplifies small potential difference between the pair of bit lines BL and /BL to a power supply potential Vcc when sense amplifier activation signals SE and /SE go high and low respectively. The equalizer 17 responsively equalizes the potentials of the bit lines BL and /BL with a bit line potential VBL when a bit line equalization signal BLEQ goes high for activation.

The row decoder 10a raises one of the plurality of word lines WL to a high level for selection in accordance with predecode signals X0 to Xp (p: integer of at least 0) from the control circuit 6. The column decoder 11a raises one of the plurality of column selection lines CSL to a high level for selection in accordance with predecode signals Y0 to Yq (q: integer of at least 0) from the control circuit 6. The redundancy column decoder 12a raises one of the r+1 spare column selection lines SCSL to a high level for selection in accordance with predecode signals Z0 to Zr from the control circuit 6.

The memory arrays 7a and 7b, the redundancy memory arrays 8a and 8b, the sense refresh amplifier+input/output control circuits 9a and 9b, the row decoders 10a and 10b, the column decoders 11a and 11b and the redundancy column decoders 12a and 12b are identical in structure to each other respectively. The other end of the pair of data input/output lines IOP is connected to the input/output buffer 13, as shown in FIG. 1. The input/output buffer 13 supplies externally supplied data DQ to the selected memory cell MC through the pair of data input/output lines IOP in a write mode, and outputs data read from the selected memory cell MC in a read mode.

Operations of the SDRAM 1 shown in FIGS. 1 and 2 are now briefly described. In the write mode, the column decoder (11a or 12a in this case) corresponding to a selected bank (e.g., #0) raises the column selection line CSL or SCSL of the column responsive to the predecode signals Y0 to Yq or Z0 to Zr to a high level for activation and renders the column selection gate 15 conductive. The pair of data input/output lines IO and /IO are connected to the pair of data input/output lines IO1 and /IO1 or IO2 and /IO2 through the switch 14.

The input/output buffer 13 supplies externally supplied write data to the pair of bit lines BL and /BL of the selected column through the pair of data input/output lines IO and /IO. The write data is supplied as the potential difference between the pair of bit lines BL and /BL. Then, the row decoder 10a raises the word line WL of the row responsive to the predecode signals X0 to Xq to a high level for selection, and activates the memory cell MC of the row. The capacitor of the selected memory cell MC stores charges in a quantity responsive to the potential of the bit line BL or /BL.

In the read mode, the bit line equalization signal BLEQ first falls to a low level for inactivation, for inactivating the equalizer 17 and stopping equalization of the bit lines BL and IBL. The row decoder 10a raises the word line WL of the row corresponding to the predecode signals X0 to Xq to a high level for selection. The potentials of the bit lines BL and /BL slightly change in response to the quantity of charges stored in the capacitor of the activated memory cell MC.

Then, the sense amplifier activation signals SE and /SE go high and low respectively, for activating the sense refresh amplifier 16. When the potential of the bit line BL is slightly higher than that of the bit line /BL, the former is pulled up to a high level and the latter is pulled down to a low level. If the potential of the bit line /BL is slightly higher than that of the bit line BL, the former is pulled up to a high level and the latter is pulled down to a low level.

Then, the column decoder 11a or 12a raises the column selection line CSL or SCSL of the column corresponding to the predecode signals Y0 to Yq or Z0 to Zr to a high level for selection, and renders the column selection gate 15 of the column conductive. Data of the pair of bit lines BL and /BL of the selected column is supplied to the input/output buffer 13 through the column selection gate 15, the switch 14 and the pair of data input/output lines IO and /IO. The input/output buffer 13 outputs the read data.

A column decoder activating method characterizing the present invention is now described in detail. It is assumed here that the sense refresh amplifier+input/output control circuit 9a has 256 column selection lines CSL. The 256 column selection lines CSL are previously split into four blocks each including 64 column selection lines CSL, and each block is previously split into four groups each including 16 column selection lines CSL. In this case, q=23, and 24 predecode signals Y0 to Y23 are generated. The predecode signals Y20 to Y23 are allocated to four blocks respectively, the predecode signals Y16 to Y19 are allocated to four groups respectively, and the predecode signals Y0 to Y15 are allocated to 16 column selection lines CSL respectively.

Therefore, one of the 256 column selection lines CSL is specified with one signal Yk (k: integer of 20 to 23) of the predecode signals Y20 to Y23, one signal Yj (j: integer of 16 to 19) of the predecode signals Y16 to Y19, and one signal Yi (i: integer of 0 to 15) of the predecode signals Y0 to Y15.

Figure 3:
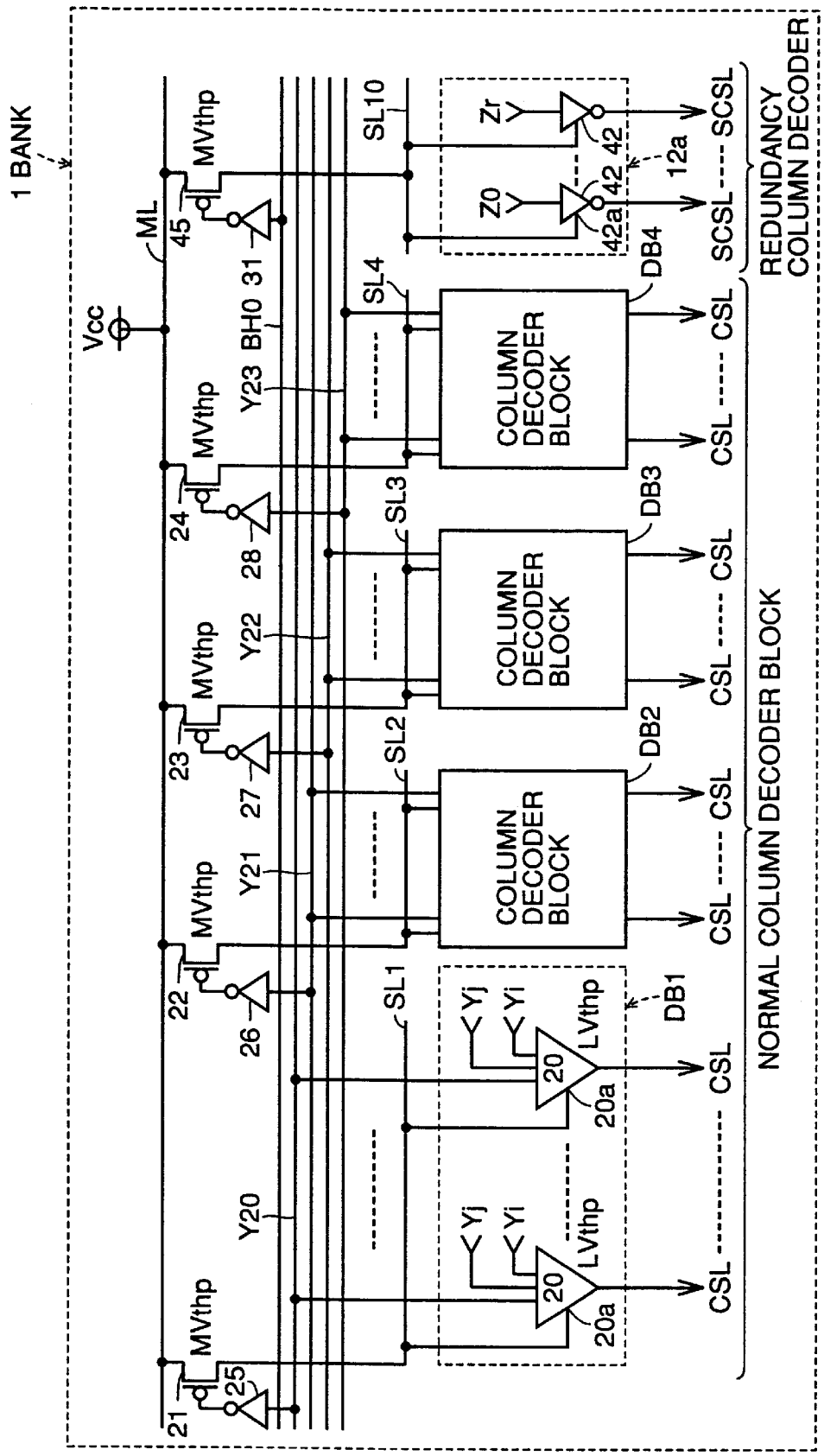
FIG. 3 is a circuit block diagram for illustrating a column decoder activating method in the SDRAM shown in FIG. 1.

As shown in FIG. 3, the column decoder 11a is split into four column decoder blocks DB1 to DB4 each corresponding to the block of 64 column selection lines CSL. Each of the column decoder blocks DB1 to DB4 includes 64 column decoder unit circuits 20 corresponding to the 64 column selection lines CSL respectively. Each column decoder unit circuit 20 includes a MOS transistor having a low threshold voltage LVth, and raises the corresponding column selection line CSL to a high level for activation in response to the predecode signals Yi, Yj and Yk previously allocated to the corresponding column selection line CSL.

Sub power supply lines SL1 to SL4 are provided in correspondence to the column decoder blocks DB1 to DB4 respectively. The sub power supply lines SL1 to SL4 are connected to power supply nodes 20a of the column decoder unit circuits 20 included in the corresponding column decoder blocks DB1 to DB4 respectively. The sub power supply lines SL1 to SL4 are connected to a main power supply line ML through P-channel MOS transistors 21 to 24 having a relatively high threshold voltage MVthp respectively. The main power supply line ML is connected to a line of the power supply potential Vcc. The predecode signals Y20 to Y23 are inputted in the gates of the P-channel MOS transistors 21 to 24 through invertors 25 to 28 respectively.

When the predecode signals Y20 to Y23 are at low levels for inactivation for selecting no column in an access period, the P-channel MOS transistors 21 to 24 are rendered non-conductive for supplying the sub power supply lines SL1 to SL4 with no power supply potential Vcc. Therefore, a subthreshold leakage current generated in each column decoder unit circuit 20 is suppressed small.

When the predecode signal Y20 goes high for activation, for example, the P-channel MOS transistor 21 is rendered conductive so that the power supply potential Vcc is supplied to each column decoder unit circuit 20 of the column decoder block DB1 from the main power supply line ML through the P-channel MOS transistor 21 and the sub power supply line SL1. One of the 64 column decoder unit circuits 20 included in the column decoder block DB1, specified by the signals Yi and Yj, raises the corresponding column selection line CSL to a high level for activation.

Figures 4A, 4B:
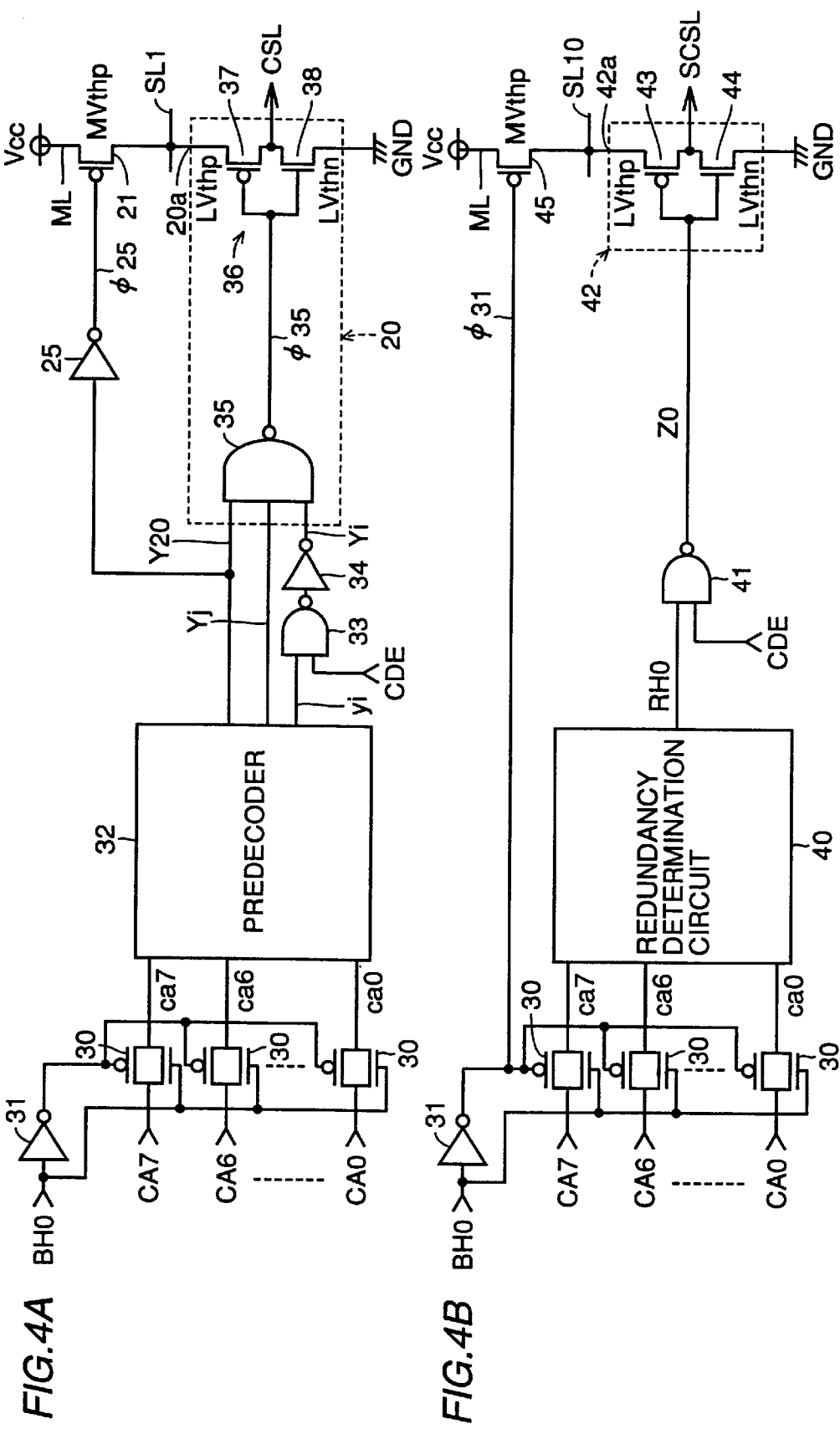
FIGS. 4A and 4B are other circuit block diagrams for illustrating the column decoder activating method in the SDRAM shown in FIG. 1.

More in detail, the column decoder unit circuit 20 includes a NAND gate 35 and an invertor 36, as shown in FIG. 4A. The NAND gate 35 receives the predecode signals Yk (e.g., Y20), Yi and Yj, and its output signal $\phi$35 is inputted in the invertor 36. The invertor 36 includes a P-channel MOS transistor 37 and an N-channel MOS transistor 38, having low threshold voltages LVthp and LVthn respectively, serially connected between the power supply node 20a and a line of the ground potential GND. An output node of the invertor 36 is connected to the corresponding column selection line CSL.

In the control circuit 6 shown in FIG. 1, eight transfer gates 30, an invertor 31 and a predecoder 32 are provided in correspondence to each bank, while a NAND gate 33 and an invertor 34 are provided in correspondence to each of the signals Y0 to Y15. First conducting electrodes of the eight transfer gates 30 receive column address signals CA0 to CA7 respectively, and second conducting electrodes thereof are connected to the predecoder 32. A bank hit signal (BH0 in this case) indicating selection of the corresponding bank (e.g., #0) is directly inputted in a gate of each transfer gate 30 closer to an N-channel MOS transistor and inputted in another gate of each transfer gate 30 closer to a P-channel MOS transistor through the invertor 31. The signals CA0 to CA7 and BH0 are generated in the control circuit 6 in accordance with signals from the buffers 2 to 4 shown in FIG. 1.

The predecoder 32 generates the predecode signals Yi, Yj and Yk on the basis of column address signals ca0 to ca7 supplied from second electrodes of the eight transfer gates 80. The signal Yi (Y0 to Y15) is generated on the basis of the signals ca0 to ca3, the signal Yj (Y16 to Y19) is generated on the basis of the signals ca4 and ca5, and the signal Yk (Y20 to Y23) is generated on the basis of the signals ca6 and ca7.

The NAND gate 33 receives the signal Yi and a signal CDE, and its output is inputted in the invertor 34. An output of the invertor 34 forms the predecode signal Yi.

The redundancy column decoder 12a is activated in response to selection of the bank. As shown in FIG. 4B, the redundancy column decoder 12a includes r+1 invertors 42 corresponding to r+1 pare column selection lines SCSL respectively. Each invertor 42 includes a P-channel MOS transistor 43 and an N-channel MOS transistor 44, having low threshold voltages LVthp and LVthn respectively, serially connected between a power supply node 42a and a line of the ground potential GND. The invertor 42 receives the predecode signal (e.g., Z0) previously allocated to the corresponding spare column selection line SCSL, and its output node is connected to the corresponding spare column selection line SCSL.

A sub power supply line SL10 is provided for the redundancy column decoder 12a. The sub power supply line SL10 is connected to the power supply nodes 42 of the r+1 invertors 42 included in the redundancy column decoder 12a. The sub power supply line SL10 is further connected to the main power supply line ML through a P-channel MOS transistor 45 having a relatively high threshold voltage MVthp. The bank hit signal BH0 is inputted in the gate of the P-channel MOS transistor 45 through the invertor 31.

In the control circuit 6 shown in FIG. 1, further, a redundancy determination circuit 40 and a NAND gate 41 are provided in correspondence to each spare selection line SCSL. The redundancy determination circuit 40 includes a plurality of program fuses for programming the address of a defective column selection line CSL, and receives the address signals ca0 to ca7 from second conducting electrodes of the eight transfer gates 30. A redundancy hit signal RH0 outputted from the redundancy determination circuit 40 responsively goes high for activation when the programmed address signals ca0 to ca7 are inputted. The NAND gate 41 receives the signal RH0 and the signal CDE. An output signal of the NAND gate 41 forms the predecode signal Z0.

FIGS. 5A to 5N are timing charts showing operations of the parts related to column selection shown in FIGS. 3, 4A and 4B. Referring to FIGS. 5A to 5N, the bank hit signal BH0 rises to a high level for activation when the bank selection signal BA specifies the bank #0. The output signal $\phi$31 of the invertor 31 responsively goes low to render the P-channel MOS transistor 45 conductive, and the potential of the sub power supply line SL10 for the redundancy column decoder 12a rises from Vcc−$\Delta$V to Vcc.

The transfer gate 30 is responsively rendered conductive when the bank hit signal BH0 goes high, to supply the address signals ca0 to ca7 to the predecoder 32 and the redundancy determination circuit 40. The predecoder 32 predecodes the address signals ca0 to ca7 and outputs the predecode signals yi, Yj and Y20.

The redundancy determination circuit 40 outputs a high-level signal when the address signals ca0 to ca7 are programmed, while outputting a low-level signal when the same are not programmed. When the signal CDE goes high at a prescribed timing, the signal yi passes through the NAND gate 33 and the invertor 34 to form the signal Yi, an output signal $\phi$35 of the NAND gate 35 falls to a low level, and the invertor 36 raises the corresponding column selection line CSL to a high level. When the signal CDE goes high, the signal RH0 passes through the NAND gate 41 to form the signal Z0, and the invertor 42 raises the corresponding spare column selection line SCSL to a high level.

The pair of bit lines BL and /BL corresponding to the selected column selection line CSL are connected to the pair of data input/output lines IO1 and /IO1 shown in FIG. 2, and the pair of bit lines BL and /BL corresponding to the selected spare column selection line SCSL are connected to the pair of data input/output lines IO2 and /IO2 shown in FIG. 2. The pair of data input/output lines IO2 and /IO2 are connected to the pair of data input/output lines IO and /IO through the switch 14 when the spare column selection line SCSL is selected, while the pair of data input/output lines IO1 and /IO1 are connected to the pair of data input/output lines IO and /IO through the switch 14 when the spare column selection line SCSL is not selected. Data is inputted/outputted between the pair of bit lines BL and /BL connected to the pair of data input/output lines IO and /IO and an external device.

According to this embodiment, the column decoder is split into the plurality of blocks DB1 to DB4 and the sub power supply line SL is provided in correspondence to each block for supplying the power supply potential Vcc to the sub power supply line SL only when the corresponding block is selected. Therefore, the subthreshold leakage current can be reduced as compared with the prior art supplying the power supply potential Vcc also to blocks not selected in the active period.

While both of the defective column selection line CSL and the spare column selection line SCSL go high when the address signals CA0 to CA7 specifying the defective column selection line CSL are inputted in this embodiment, the defective column selection line CSL may not go high but only the spare column selection line SCSL may go high when the address signals CA0 to CA7 specifying the defective column selection line CSL are inputted.

Figure 6:
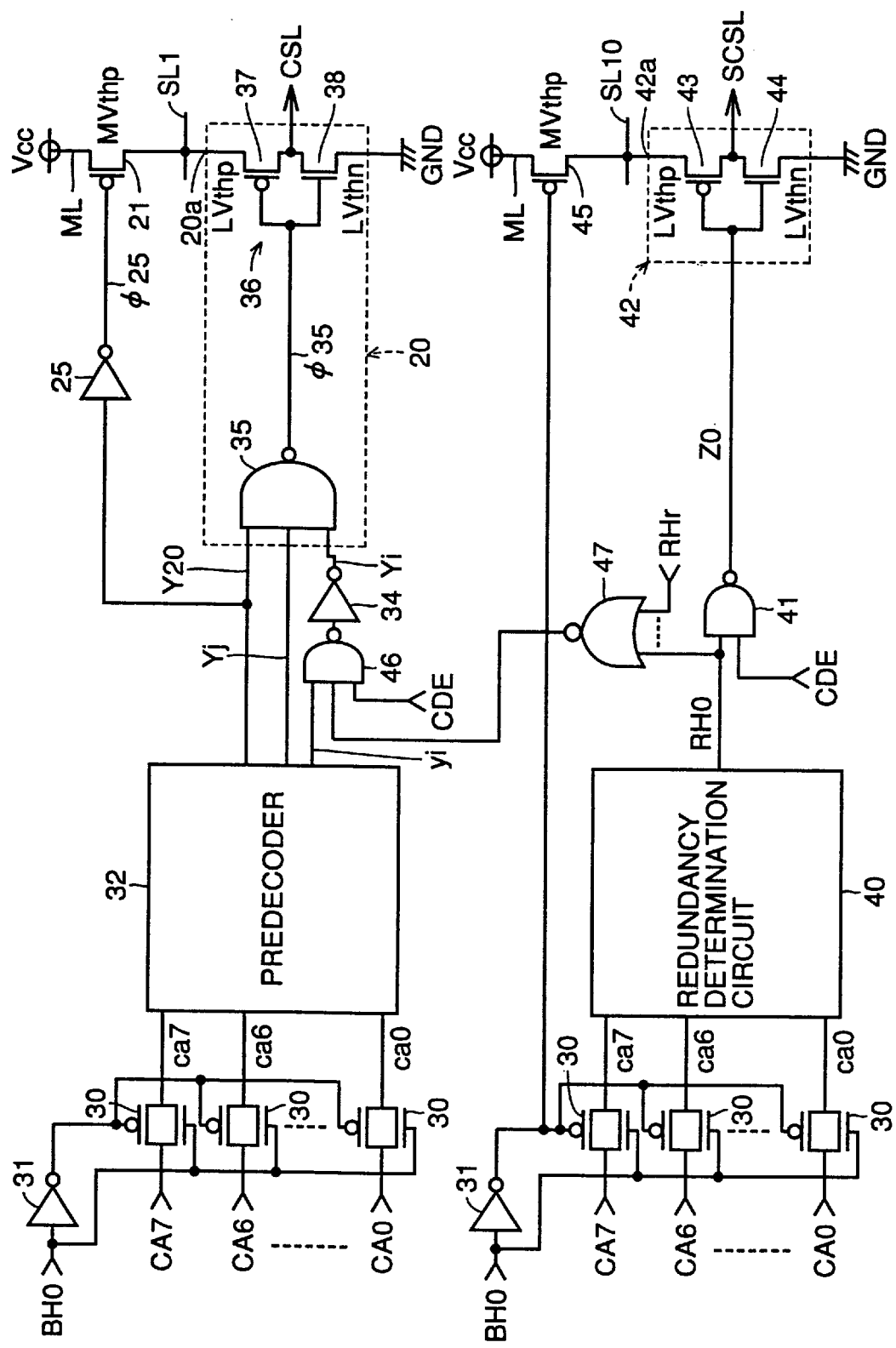
FIG. 6 is a circuit diagram showing an exemplary improvement of the SDRAM shown in FIG. 1.
Figure 7:
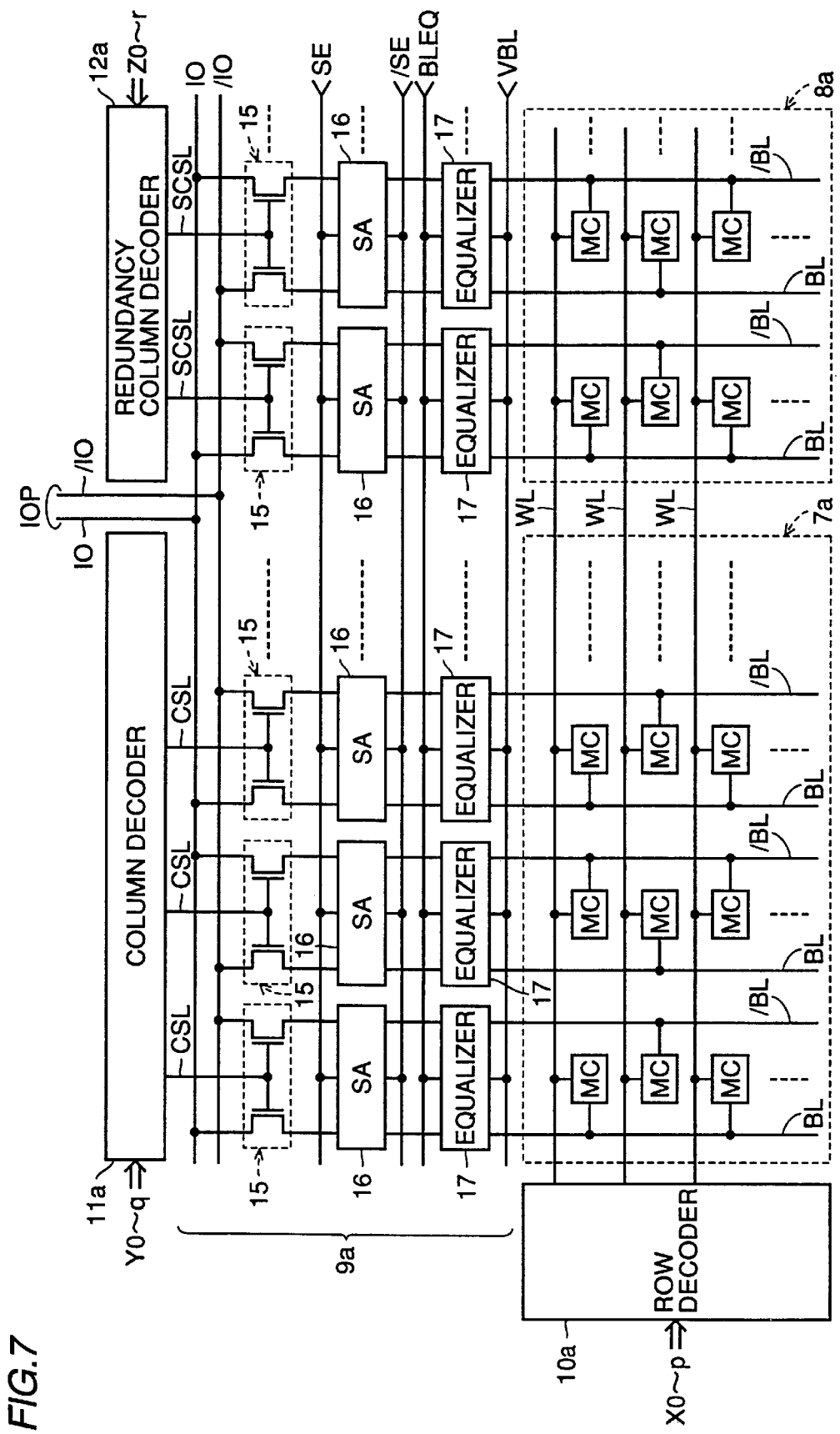
FIG. 7 is another circuit block diagram showing the exemplary improvement of the SDRAM shown in FIG. 1.

In this case, the two-input NAND gate 33 shown in FIG. 2 is replaced with a three-input NAND gate 46 and a NOR gate 47 is newly provided, as shown in FIG. 6. Redundancy hit signals RH0 to RHr are inputted in the NAND gate 46 through the NOR gate 47. As shown in FIG. 7, further, the switch 14 shown in FIG. 2 is removed and a pair of data input/output lines IO and /IO common to the memory array 7a and the redundancy memory array 8a are provided. When the programmed address signals CA0 to CA7 are inputted and the redundancy hit signal RH0 goes high for activation, an output of the NAND gate 46 is fixed at a high level for inhibiting the signal yi from passage. As shown in FIGS. 8A to 8N, therefore, the signal Yi does not go high but the column selection line CSL is fixed at a low level.

Figures 9A, 9B:
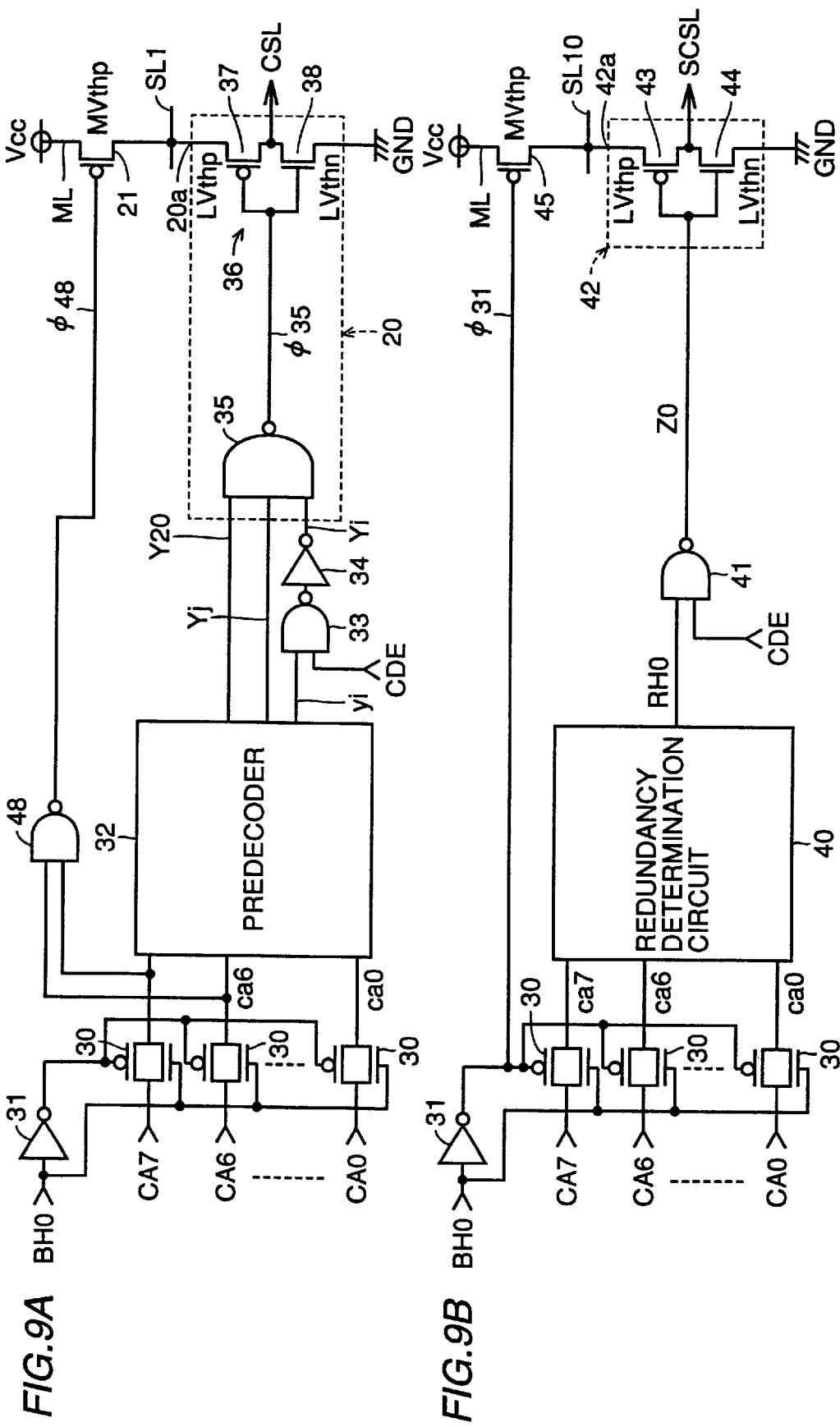
FIGS. 9A and 9B are circuit block diagrams showing another exemplary improvement of the SDRAM shown in FIG. 1.

As shown in FIGS. 9A and 9B, a simplified decoder (NAND gate) 48 may be provided for generating a signal φ48 by decoding the input signals ca6 and ca7 in the predecoder 32 and supplying this signal φ48 to the gate of the P-channel MOS transistor 21. When the signals ca6 and ca7 go high, the signal φ48 goes low to render the P-channel MOS transistor 21 conductive.

While the present invention is applied to a column decoder in this embodiment, the present invention is also applicable to a row decoder or both of a row decoder and a column decoder, as a matter of course.

Embodiment 2

Figure 10:
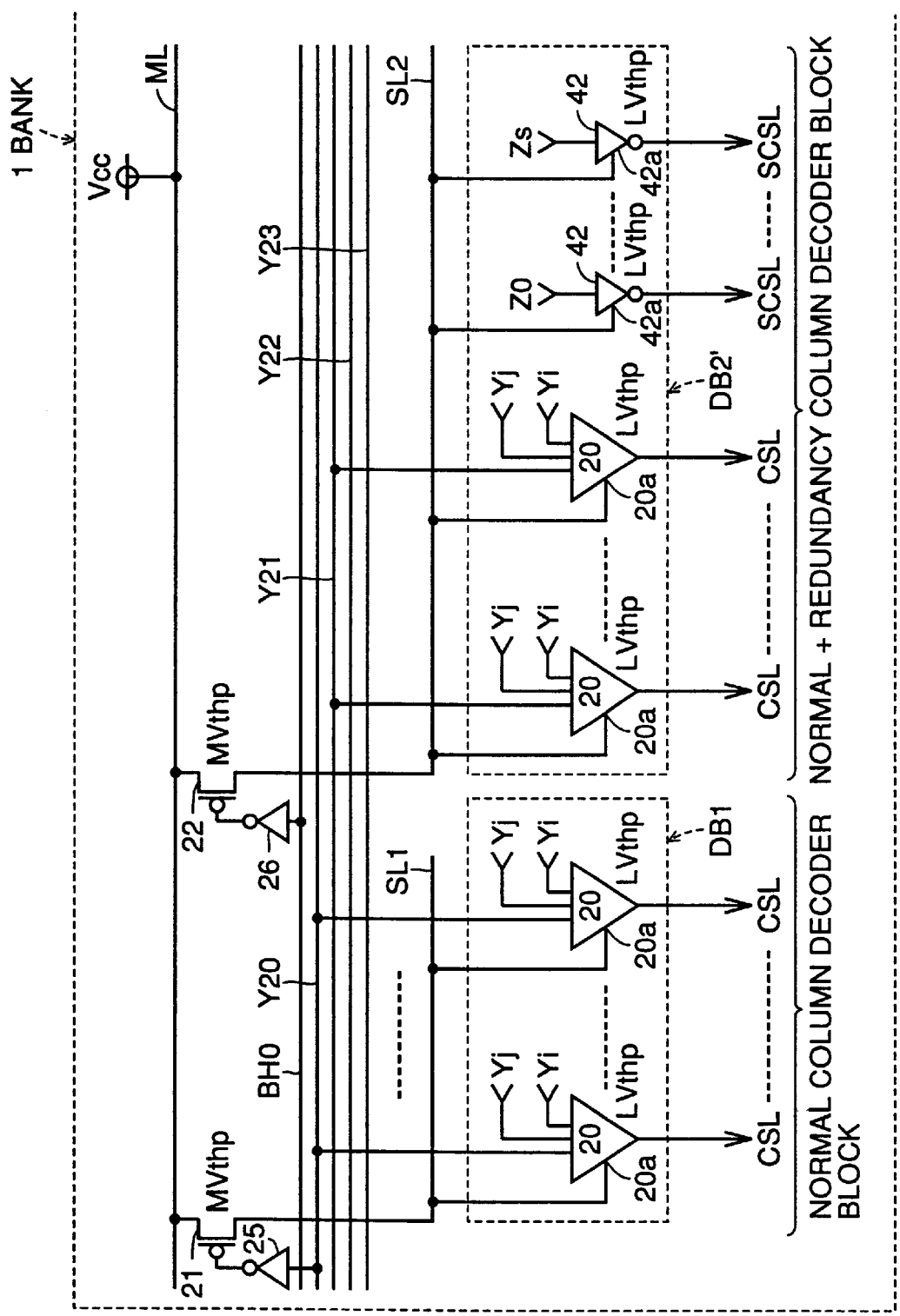
FIG. 10 is a circuit block diagram showing a front principal part of an SDRAM according to an embodiment 2 of the present invention.
Figure 11:
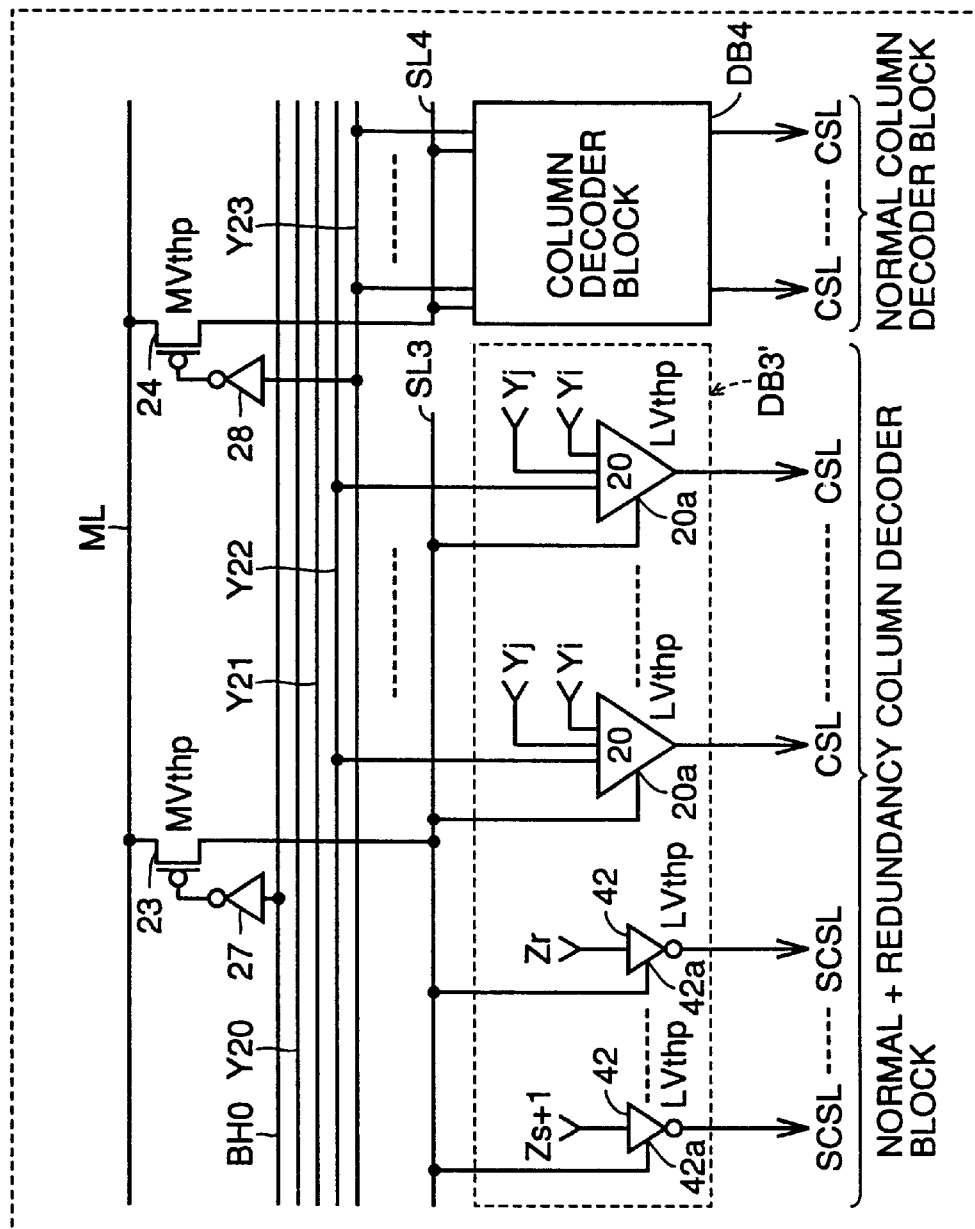
FIG. 11 is a circuit block diagram showing a rear principal part of the SDRAM shown in FIG. 10.

FIGS. 10 and 11 illustrate a principal part of an SDRAM according to an embodiment 2 of the present invention in contrast with FIG. 3.

Referring to FIGS. 10 and 11, the SDRAM according to this embodiment is different from that shown in FIG. 3 in points that a redundancy column decoder 12a is split into two parts built into column decoder blocks DB2 and DB3 and a bank hit signal BH0 is inputted in invertors 26 and 27 in place of the signals Y21 and Y22.

The column decoder block DB2, into which half the redundancy column decoder 12a is built, forms a normal+redundancy column decoder block DB2'. The normal+redundancy column decoder block DB2' includes column decoder unit circuits 20 similar to those of the column decoder block DB2 shown in FIG. 3 and s+1 (s<r) invertors 42, i.e., half those in the redundancy column decoder 12a shown in FIG. 3.

The column decoder block DB3, into which half the redundancy column decoder 12a is built, forms a normal+redundancy column decoder block DB3'. The normal+redundancy column decoder block DB3' includes column decoder unit circuits 20 similar to those of the column decoder block DB3 shown in FIG. 3 and r−s−1 invertors 42, i.e., half those in the redundancy column decoder 12a shown in FIG. 3.

When the bank hit signal BH0 goes high, P-channel MOS transistors 22 and 23 are rendered conductive so that a power supply potential Vcc is supplied to the column decoder unit circuits 20 and the invertors 42 of the normal+redundancy column decoder blocks DB2' and DB3' through the P-channel MOS transistors 22 and 23 and sub power supply lines SL2 and SL3. The remaining structures and operations of this embodiment are identical to those of the SDRAM according to the embodiment 1, and hence redundant description is omitted.

This embodiment can attain effect identical to that in the embodiment 1.

Embodiment 3

Figure 12:
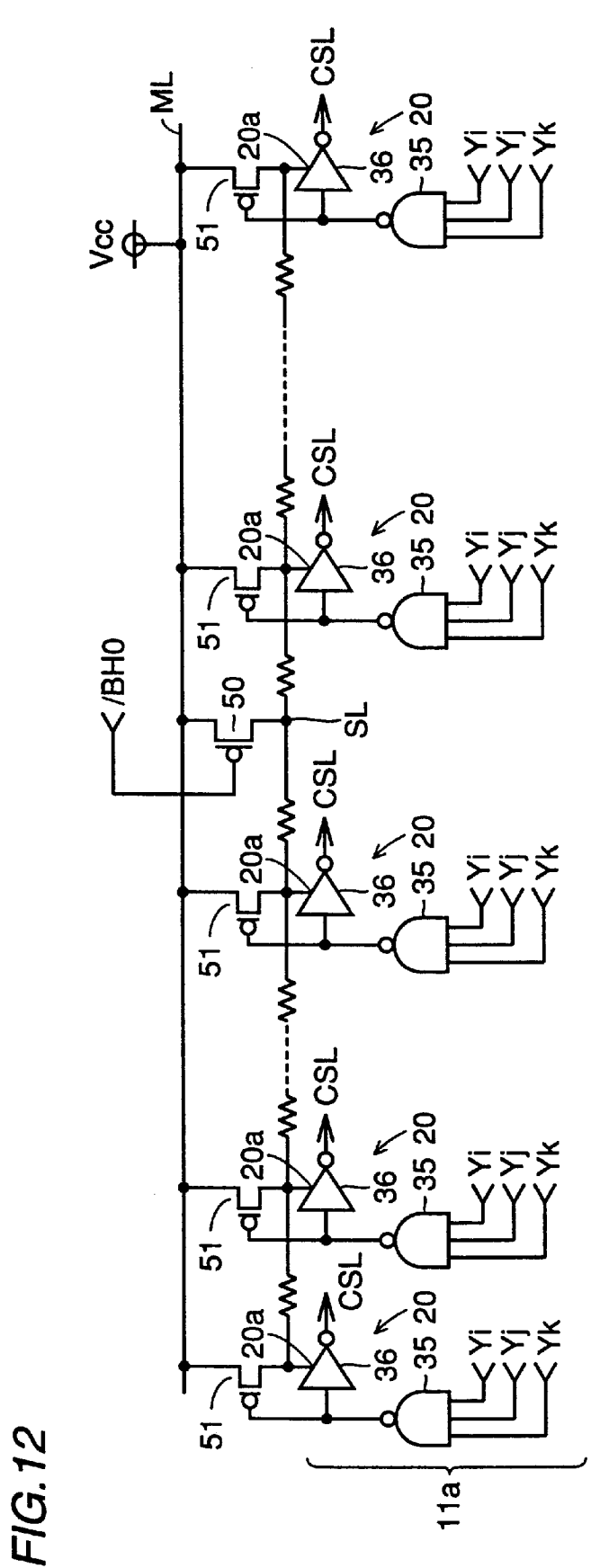
FIG. 12 is a circuit diagram for illustrating a column decoder activating method in an SDRAM according to an embodiment 3 of the present invention.

FIG. 12 is a circuit diagram showing a principal part of an SDRAM according to an embodiment 3 of the present invention. Referring to FIG. 12, a column decoder 11a of this SDRAM includes 256 column decoder unit circuits 20 provided in correspondence to 256 column selection lines CSL respectively, and each column decoder unit circuit 20 includes a three-input NAND gate 35 and an invertor 36, similarly to the embodiment 1. Each column decoder unit circuit 20 receives a power supply potential Vcc from a power supply node 20a for responsively setting the corresponding column selection line CSL high for selection when previously allocated predecode signals Yi, Yj and Yk go high.

The SDRAM further includes a main power supply line ML receiving the power supply potential Vcc and a sub power supply line SL provided in correspondence to each bank. The sub power supply line SL, having a relatively small sectional area, has an unnegligible resistance value.

The SDRAM further includes a P-channel MOS transistor 50 having a relatively high threshold voltage MVthp and 256 P-channel MOS transistors 51 having the relatively high threshold voltage MVthp provided in correspondence to the 256 column decoder unit circuits 20 respectively. The P-channel MOS transistor 50 shown with a large symbol has a large gate width while the P-channel MOS transistors 51 shown with small symbols have small gate widths.

The power supply node 20a of each column decoder unit circuit 20 is connected to a portion of the sub power supply line SL close to the column decoder unit circuit 20, and further connected to the main power supply line through the corresponding P-channel MOS transistor 51. The gate of the P-channel MOS transistor 51 receives an output of the NAND gate 35 included in the corresponding column decoder unit circuit 20. The P-channel MOS transistor 51 is rendered conductive when the corresponding predecode signals Yi, Yj and Yk go high and the output of the NAND gate 35 goes low, for locally supplying the power supply potential Vcc to the portion of the sub power supply line SL close to the corresponding column decoder unit circuit 20.

The P-channel MOS transistor 50 is connected between the central portion of the sub power supply line SL and the main power supply line, and its gate receives an inverted signal /BH0 of the bank hit signal BH0. The P-channel MOS transistor 50 is rendered conductive when the corresponding bank #0 is selected and the signal /BH0 goes low, for supplying the sub power supply line SL with the power supply potential Vcc.

Figures 13A, 13B:
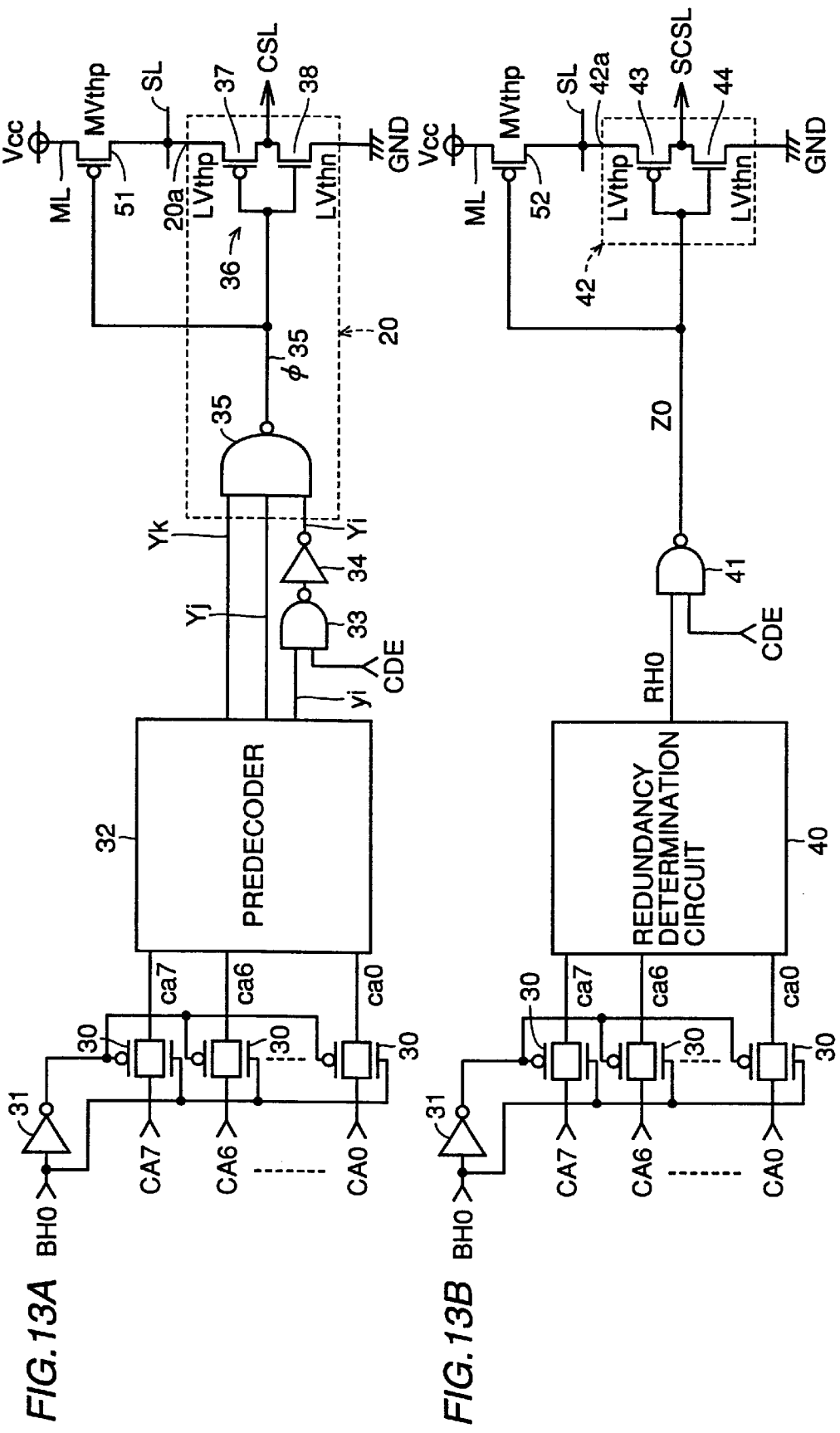
FIGS. 13A and 13B are other circuit diagrams for illustrating the column decoder activating method in the SDRAM shown in FIG. 12.

A redundancy column decoder 12a is activated similarly to the column decoder 11a. As shown in FIGS. 13A and 13B, the redundancy column decoder 12a includes r+1 invertors 42, similarly to the embodiment 1. In correspondence to the r+1 invertors 42, r+1 P-channel MOS transistors 52 are provided. Each P-charnel MOS transistor 52 has the relatively high threshold voltage MVthp and a small gate width, similarly to each P-channel MOS transistor 51.

A power supply node 42a of each invertor 42 is connected to the sub power supply line SL, and further connected to the main power supply line ML through the corresponding P-channel MOS transistor 52. The gate of the P-channel MOS transistor 52 receives a corresponding predecode signal (e.g., Z0). The P-channel MOS transistor 52 is rendered conductive when the corresponding predecode signal Z0 goes low, for locally supplying the power supply potential Vcc to a portion of the sub power supply line SL close to the corresponding invertor 42.

FIGS. 14A to 14K are timing charts showing operations of the portion related to column selection shown in FIGS. 13A and 13B. When the bank hit signal BH0 rises to a high level, the P-channel MOS transistor 50 is rendered conductive and the sub power supply line SL is charged at the power supply potential Vcc. Further, a column selection line CSL and a spare column selection line SCSL corresponding to address signals ca0 to ca7 are raised to high levels. The remaining structures and operations of this embodiment are identical to those in the embodiment 1, and hence redundant description is omitted.

According to this embodiment, the sub power supply line SL is provided in correspondence to each bank and supplied with the power supply potential Vcc only when the corresponding bank is selected. In an active period, therefore, a subthreshold leakage current can be reduced as compared with the prior art supplying the power supply potential Vcc also to non-selected banks. Further, the P-channel MOS transistor 51 is provided in correspondence to each column decoder unit circuit 20 for locally supplying the power supply potential Vcc to the portion of the sub power supply line SL close to the column decoder unit circuit 20 in response to selection of the corresponding column decoder unit circuit 20, whereby an end portion of the sub power supply line SL can be prevented from potential reduction resulting from the resistance value thereof.

When address signals CA0 to CA7 specifying a defective column selection line CSL are inputted, both of the defective column selection line CSL and a spare column selection line SCSL are set high in this embodiment. Alternatively, only the spare column selection line SCSL may be set high while the defective column selection line CSL is left intact when the address signals CA0 to CA7 specifying the defective column selection signal CSL is inputted.

Figure 15:
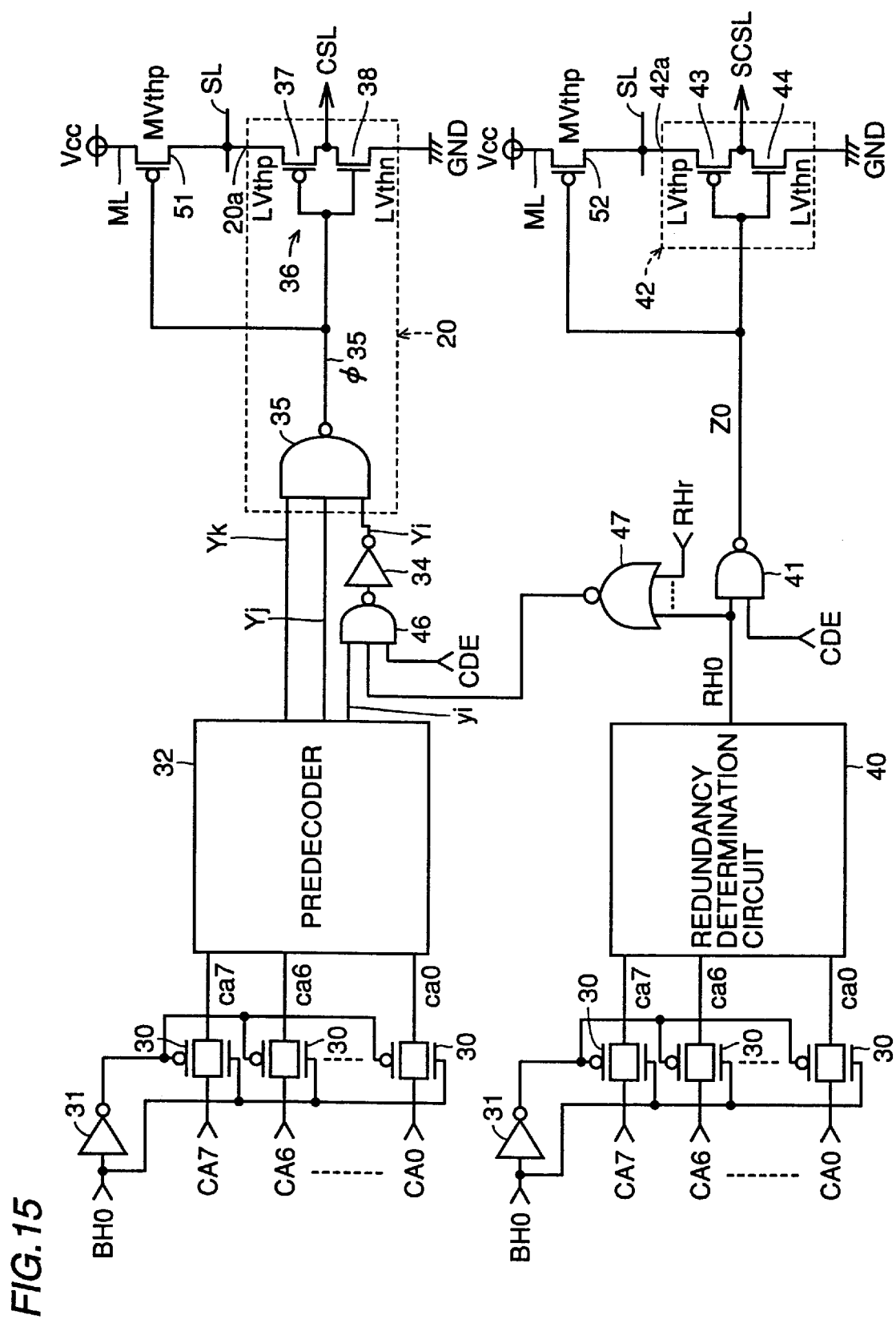
FIG. 15 is a circuit block diagram showing an exemplary improvement of the column decoder activating method in the SDRAM shown in FIGS. 12 to 14K.
Figure 16:
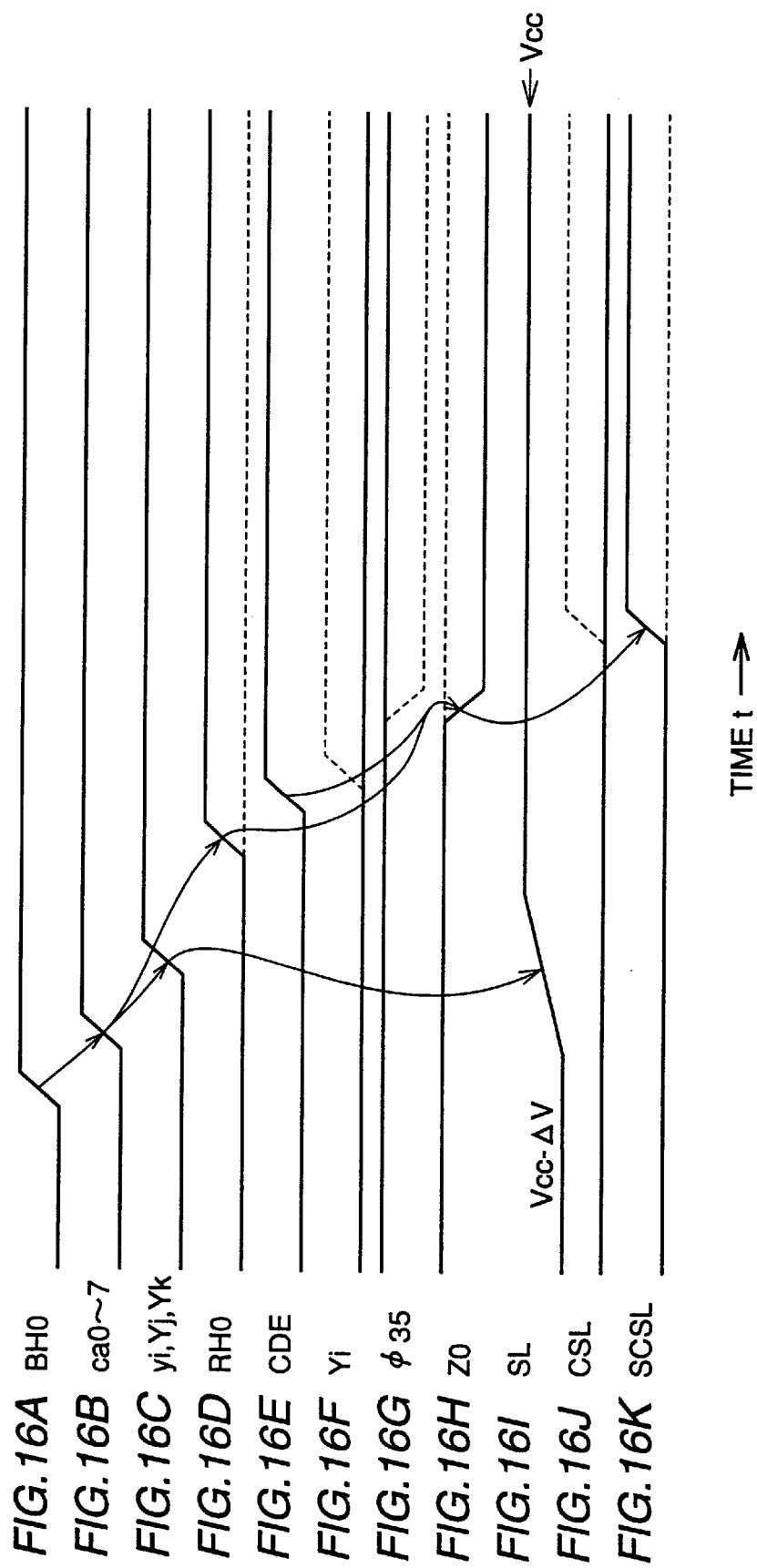
FIGS. 16A to 16K are timing charts showing operations of the circuits shown in FIG. 15.

In this case, a two-input NAND gate 33 shown in FIG. 13A is replaced with a three-input NAND gate 46 and a NOR gate 47 is newly provided, as shown in FIG. 15. Redundancy hit signals RH0 to RHR are inputted in the NAND gate 46 through the NOR gate 47. Further, the switch 14 shown in FIG. 2 is removed and a pair of data input/output lines IO and /IO common to a memory array 7a and a redundancy memory array 8a are provided as shown in FIG. 7. When the programmed address signals CA0 to CA7 are inputted and the redundancy hit signal RH0 goes high for activation, an output of the NAND gate 46 is set at a high level for preventing passage of a signal yi. As shown in FIGS. 16A to 16K, therefore, a signal Yi does not rise to a high level and the column selection line CSL is fixed at a low level.

Figure 17:
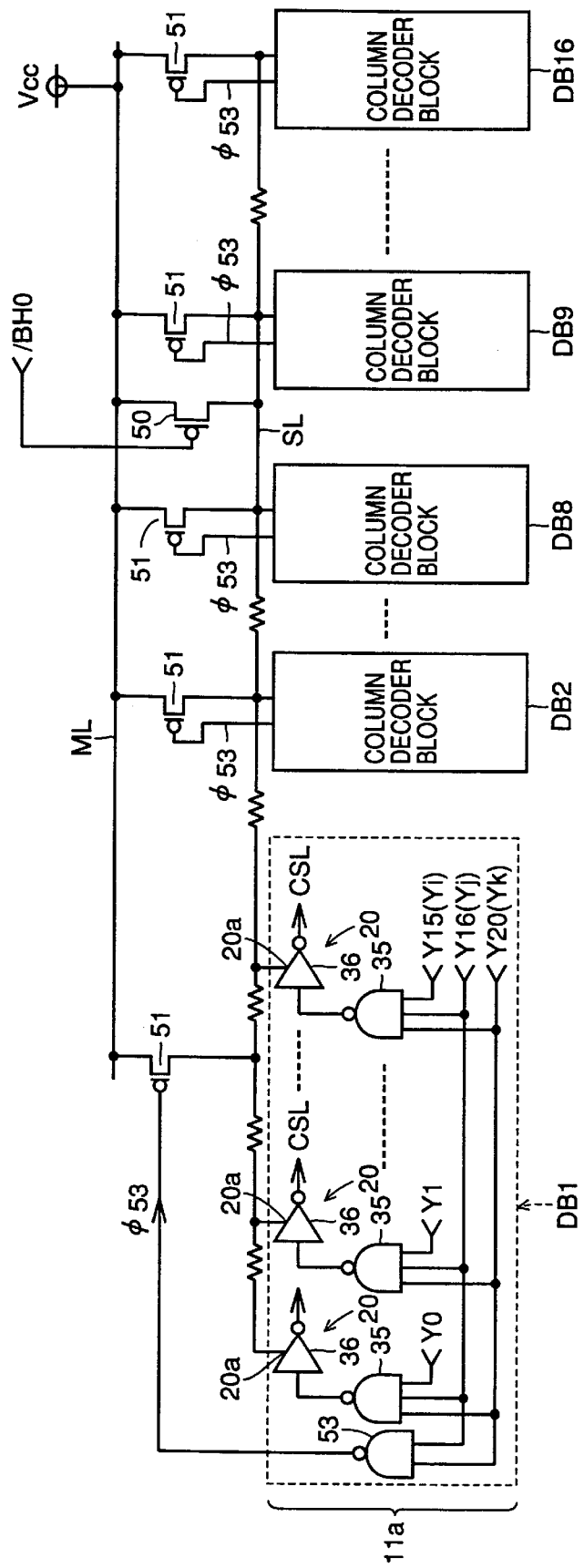
FIG. 17 is a circuit block diagram showing another exemplary improvement of the column decoder activating method in the SDRAM shown in FIGS. 12 to 14K.

While the P-channel MOS transistor 51 for local charging is provided in correspondence to each column decoder unit circuit 20 in this embodiment, a single P-channel MOS transistor 51 may alternatively be provided for a plurality of column decoder unit circuits 20. As shown in FIG. 17, for example, a column decoder 11a may be split into 16 column decoder blocks DB1 to DB16 so that a P-channel MOS transistor 51 is provided for each column decoder block. Predecode signals Yj and Yk specify each block. Foe example, predecode signals Y16 and Y20 specify the block DB1, and predecode signals Y0 to Y15 specify each column decoder unit circuit 20 included in the block DB1. A NAND gate 53 receiving the signals Yj and Yk is provided in each block, so that an output signal φ53 of the NAND gate 53 is inputted in the gate of the corresponding P-channel MOS transistor 51. When any block (e.g., DB1) is selected, the output signal φ53 from the NAND gate 53 provided in the block DB1 goes low and the P-channel MOS transistor 51 for the block DB1 is rendered conductive for locally charging a portion of a sub power supply line SL close to the block DB1.

Embodiment 4

The layout of power supply transistors is studied in an embodiment 4 of the present invention. The pitch of column selection lines CSL depends on that of memory cells MC, as clearly understood from FIG. 2. The pitch for four column selection lines CSL is 10.24 μm, for example. The column decoder unit circuit 20 shown in FIG. 4 is provided in correspondence to each column selection line CSL, and hence the P-channel MOS transistors 37 included in the column decoder unit circuits 20 must be arranged at the same pitch as the column selection lines CSL.

Figure 18A:
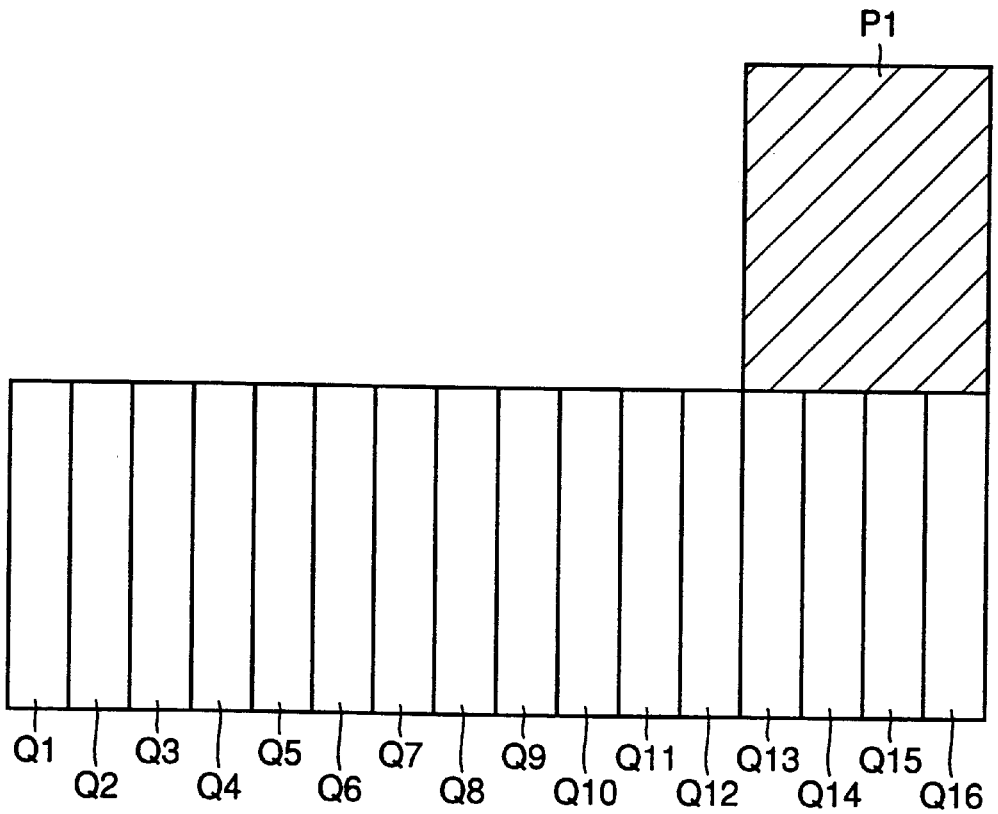
FIGS. 18A and 18B illustrate the layout of a part of an SDRAM according to an embodiment 4 of the present invention related to column selection.

It is assumed that P-channel MOS transistors Q1 to Q16 (the P-channel MOS transistor 37) included in a column decoder unit circuit 20 are arranged at the same pitch as column selection lines CSL and a P-channel MOS transistor P1 (the P-channel MOS transistor 21) having a relatively high threshold voltage MVthp for supplying a power supply potential Vcc to the P-channel MOS transistors Q1 to Q16 is concentrically arranged, as shown in FIG. 18A. This layout requires an additional area for the P-channel MOS transistor P1.

Alternatively, the P-channel MOS transistors Q1 to Q16 are split into groups of four so that the P-channel MOS transistors forming each group are reduced to ⅔ in width and concentrically arranged at the center while the P-channel MOS transistor P1 is split into eight P-channel MOS transistors P11 to P18 and dispersively arranged on the remaining regions. Thus, the P-channel MOS transistor P1 can be arranged with no area penalty.

Figure 18B:
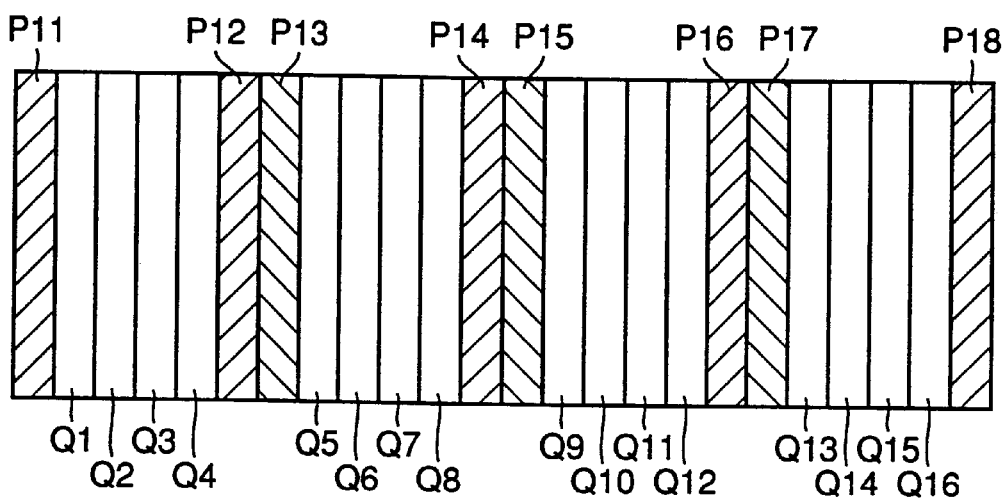
Figure 19:
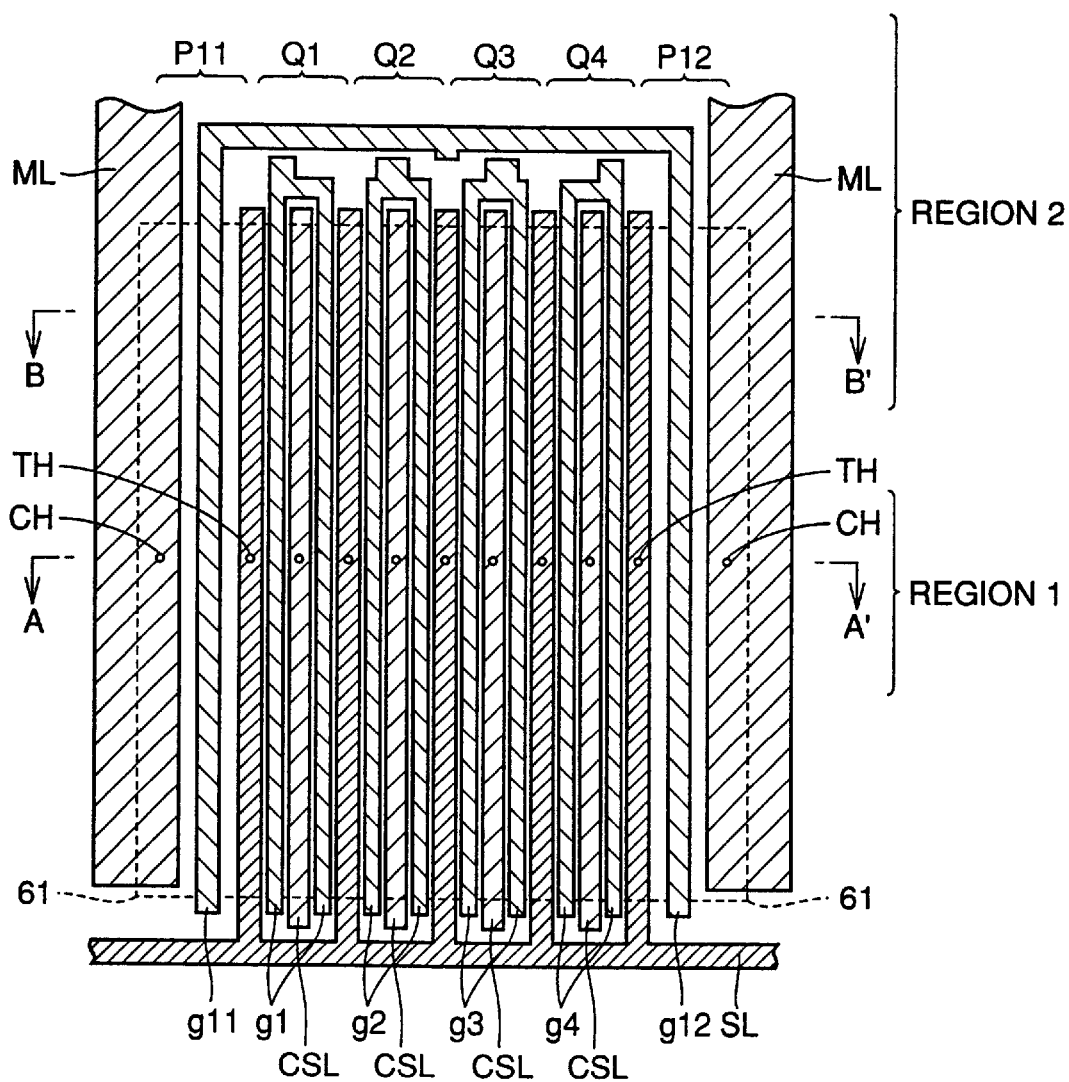
FIG. 19 is a plan view showing the layout of the part related to column selection illustrated in FIGS. 18A and 18B in detail.
Figure 20:
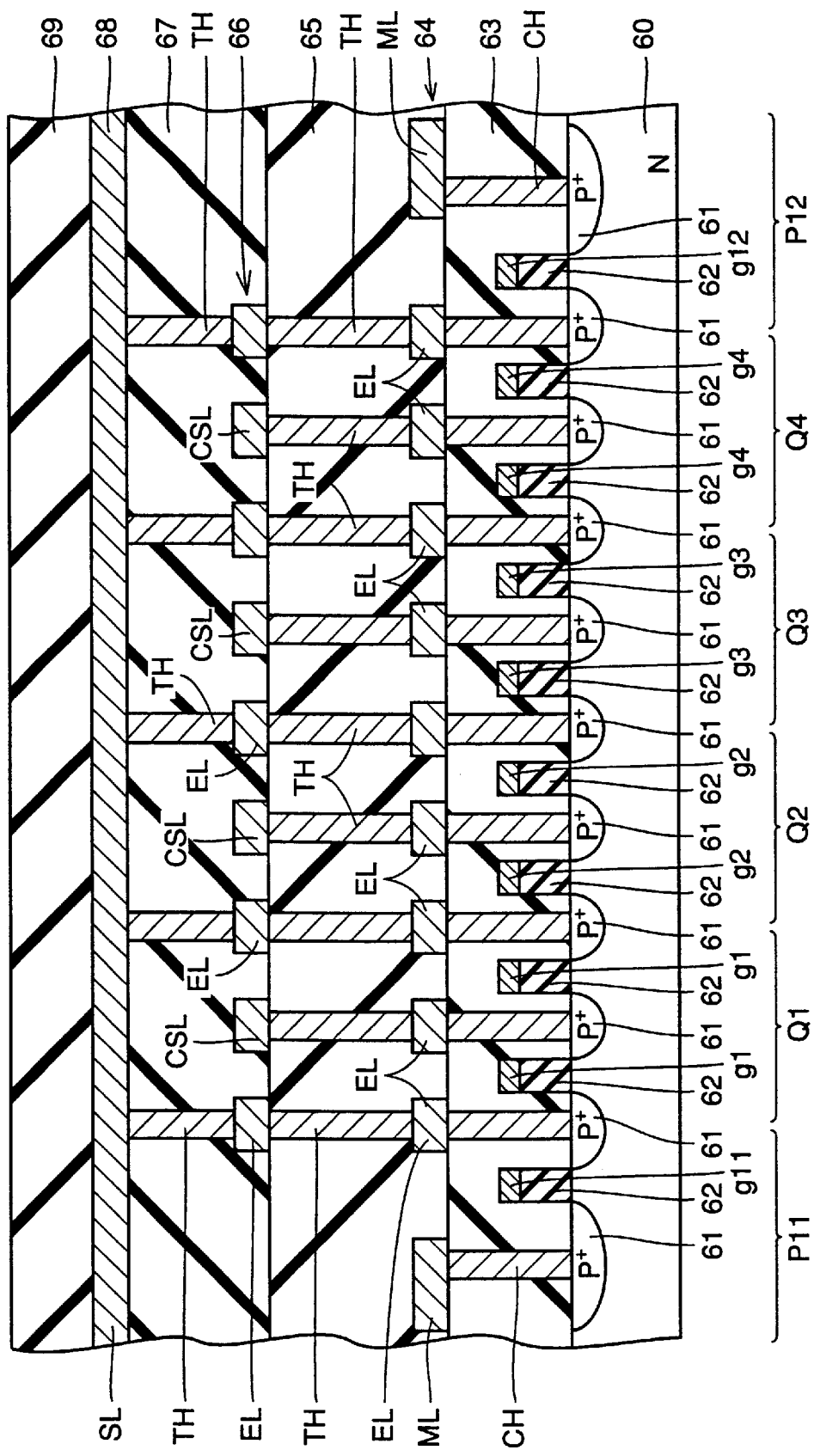
FIG. 20 is a sectional view taken along the line A–A' in FIG. 19.
Figure 21:
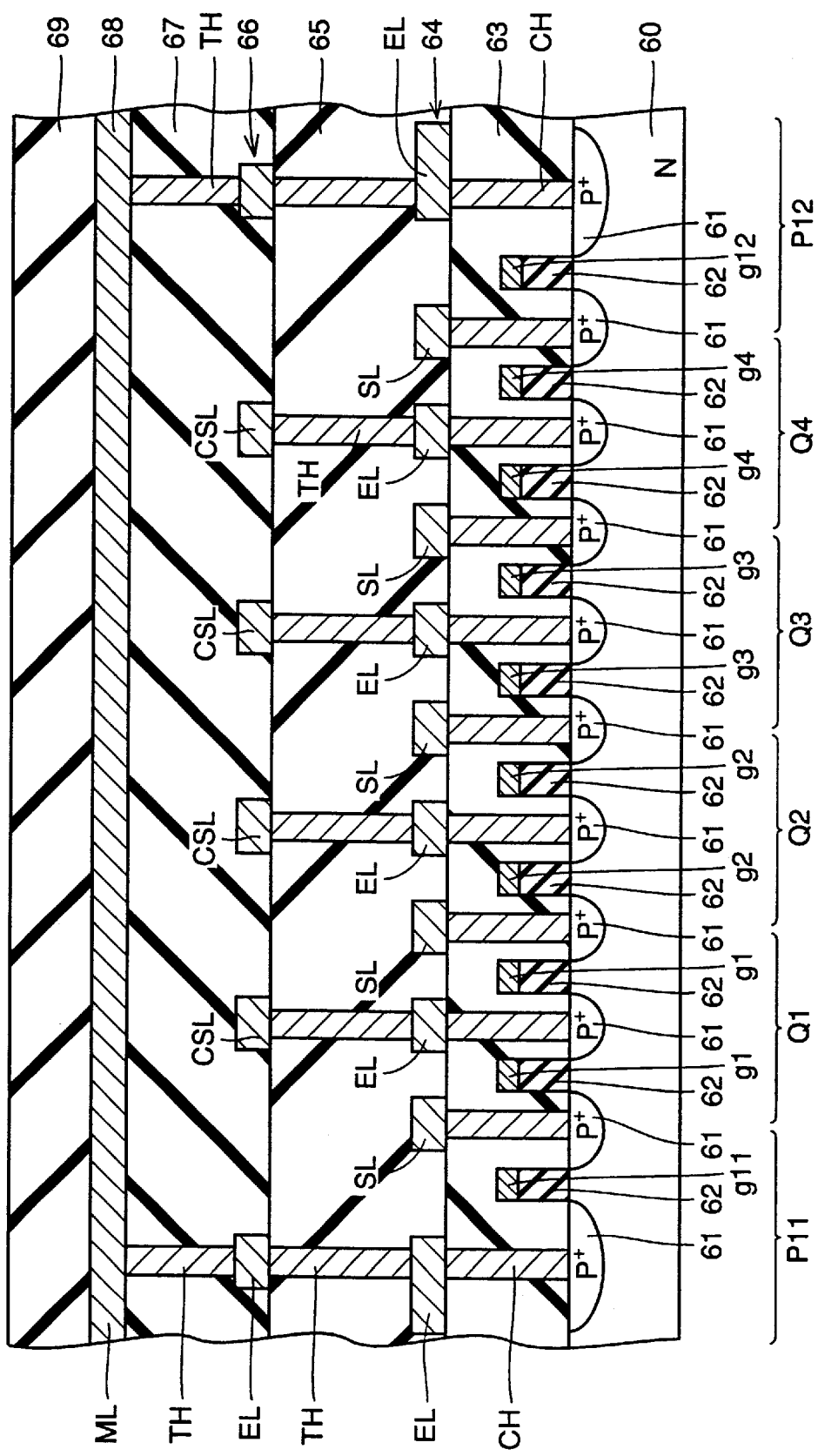
FIG. 21 is a sectional view taken along the line B–B' in FIG. 19.

FIG. 19 is a plan view showing the layout of the P-channel MOS transistors P11, P12 and Q1 to Q4 included in those shown in FIG. 18B, FIG. 20 is a sectional view taken along the line A–A' in FIG. 19, and FIG. 21 is a sectional view taken along the line B–B' in FIG. 19. FIG. 19 omits a third metal wiring layer 68 appearing in FIGS. 20 and 21, for simplifying the illustration. On regions 1 and 2 shown in FIG. 19, sub power supply lines SL formed by the third metal wiring layer 68 and main power supply lines ML are provided across the figure respectively.

Referring to FIGS. 19 and 20, gate electrodes g11, g1 and g1, . . . , g4 and g4 and g12 are formed on a surface of an N-type well 60 of a P-type silicon substrate on the region 1 in FIG. 19 through a gate oxide film 62.

The gate electrodes g11 and g12 form gates of the P-channel MOS transistors P11 and P12 respectively, while the gate electrodes g1 and g1, . . . and g4 and g4 form gates of the P-channel MOS transistors Q1 to Q4 respectively.

Single ends of the gate electrodes g11 and g12, g1 and g1, . . . , and g4 and g4 are connected with each other. P+-type impurity diffusion regions 61 for defining drains or sources of the P-channel MOS transistors P11, P12 and Q1 to Q4 are formed on the N-type well 60 on portions located between the gate electrodes g11, g1 and g1, . . . , g4 and g4 and g12.

An insulator layer 63 is formed to cover the aforementioned elements and a first metal wiring layer 64 is formed on its surface. The first metal wiring layer 64 is etched to form the main power supply lines ML and connecting electrodes EL. The main power supply lines ML are opposed to the P+-type impurity diffusion regions 61 located on both end portions. The connecting electrodes EL are opposed to the P+-type impurity diffusion regions 61 located between the gate electrodes g11, g1 and g1, . . . , g4 and g4 and g12. Each P+-type impurity diffusion region 61 is connected to the corresponding main power supply line ML or connecting electrode EL through a contact hole CH.

Further, an insulator layer 65 is formed to cover the aforementioned elements and a second metal wiling layer 66 is formed on its surface. The second metal wiring layer 66 is etched to form column selection lines CSL and connecting electrodes EL. The four column selection lines CSL are opposed to the P+-type impurity diffusion regions 61 located between the gate electrodes g1 and g1, g2 and g2, g3 and g3 and g4 and g4 respectively. The five connecting electrodes EL are opposed to the P+-type impurity diffusion regions 61 located between the gate electrodes g11 and g1, g1 and g2, g2 and g3, g3 and g4 and g4 and g12 respectively. The connecting electrodes EL formed by the first metal wiring layer 64 are connected to the corresponding column selection lines CSL or the connecting electrodes EL formed by the second metal wiring layer 66 via through holes THE.

In addition, an insulator layer 67 is formed to cover the aforementioned elements and the third metal wiring layer 68 is formed on its surface. The third metal wiling layer 68 is etched to form the sub power supply lines SL. The connecting electrodes EL formed by the second metal wiling layer 66 are connected to the corresponding sub power supply lines SL via through holes THE. Finally, an insulator layer 69 is formed to cover these elements.

Referring to FIG. 21, the region 2 shown in FIG. 19 is identical to the region 1 up to the first metal wiring layer 64 formed on the surface of the insulator layer 63. The first metal wiring layer 64 is etched to form connecting electrodes EL and sub power supply lines SL. The connecting electrodes EL and the sub power supply lines SL are alternately provided in opposition to the P+-type impurity diffusion regions 61 located between the gate electrodes g11 and g1, g1 and g2, g2 and g3, g3 and g4 and g4 and g12 respectively. Each P+-type impurity diffusion region 61 is connected to the corresponding connecting electrode EL or sub power supply line SL through a contact hole CH.

Further, the insulator layer 65 is formed to cover the aforementioned elements, and the second metal wiring layer 66 is formed on its surface. The second metal wiring layer 66 is etched to form column selection lines CSL and connecting electrodes EL. The four column selection lines CSL are opposed to the P+-type impurity diffusion regions 61 located between the gate electrodes g1 and g1, g2 and g2, g3 and g3 and g4 and g4 respectively. The two connecting electrodes EL are opposed to the connecting electrodes EL, formed by the first metal wiring layer 64, located on both end portions. The connecting electrodes EL formed by the first metal wiling layer 64 are connected to the corresponding column selection lines CSL or the connecting electrodes EL formed by the second metal wiling layer 66 via through holes THE.

In addition, the insulator layer 67 is formed to cover the aforementioned elements and the third metal wiring layer 68 is formed on its surface. The third metal wiring layer 68 is etched to form the main power supply lines ML. The connecting electrodes EL formed by the second metal wiring layer 66 are connected to the main supply lines SL via through holes THE. Finally, the insulator layer 69 is formed to cover these elements.

Embodiment 5

Figure 22:
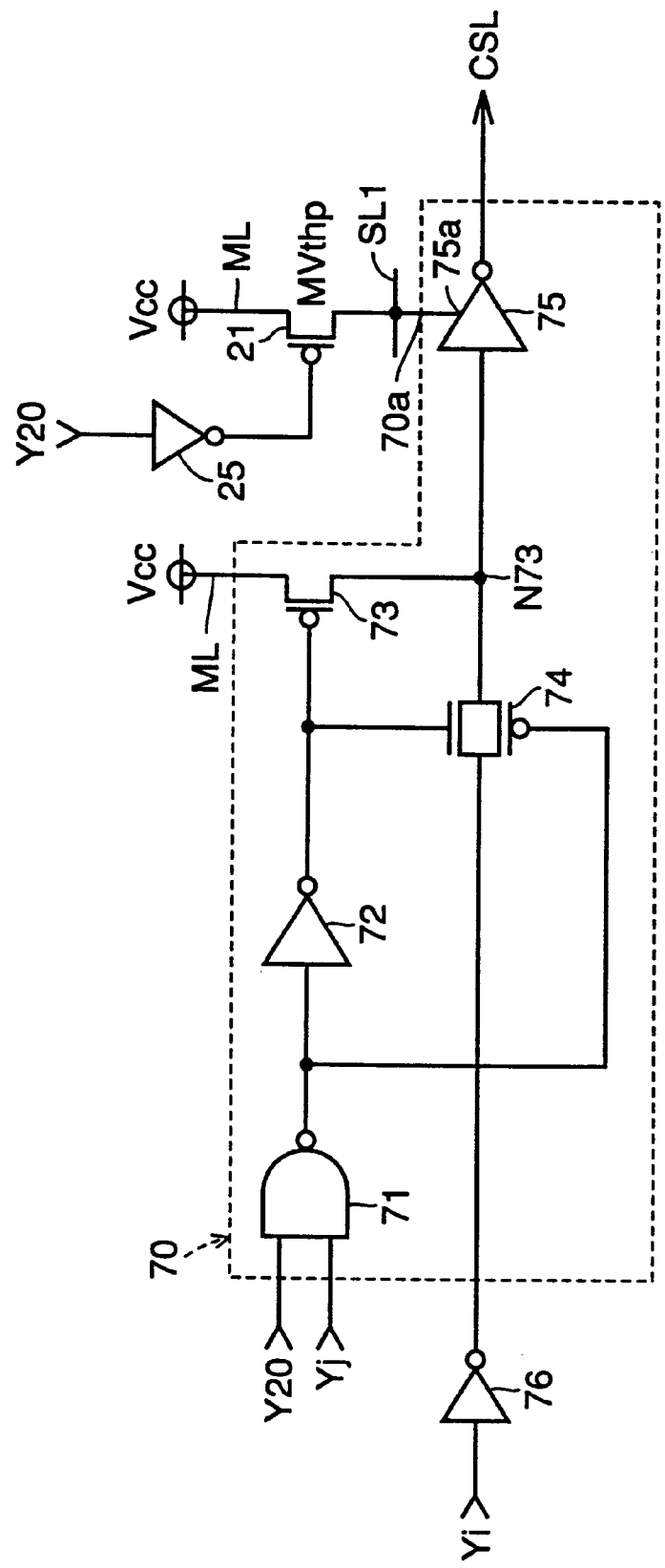
FIG. 22 is a circuit diagram showing a principal part of an SDRAM according to an embodiment 5 of the present invention.

FIG. 22 is a circuit diagram showing the structure of a principal part of an SDRAM according to an embodiment 5 of the present invention.

Referring to FIG. 22, this SDRAM is different from that according to the embodiment 1 in a point that a column decoder unit circuit 70 substitutes for the column decoder unit circuit 20 with new provision of an invertor 76. FIG. 22 representatively shows the column decoder unit circuit 70 included in a column decoder block DB1 similar to that shown in FIG. 3.

The column decoder unit circuit 70 includes a NAND gate 71, invertors 72 and 75, a P-channel MOS transistor 73 and a transfer gate 74. The NAND gate 71 receives predecode signals Yj and Yk (k=20 in this case). An output of the NAND gate 71 is inputted in the gate of the P-channel MOS transistor 73 through the invertor 72. The P-channel MOS transistor 73 is connected between a main power supply line ML and a node N73. The predecode signal Yi is inputted in a first conducting terminal of the transfer gate 74 through the invertor 76. A second conducting terminal of the transfer gate 74 is connected to the node N73 and a gate closer to a P-channel MOS transistor receives an output of the NAND gate 71 while a gate closer to an N-channel MOS transistor receives an output of the invertor 72. The invertor Y5 is connected between the node N73 and a corresponding column selection line CSL. A power supply node 70a of the column decoder unit circuit 74 is connected to a sub power supply line SL1 and a power supply node 75a of the invertor 75.

When the predecode signals Yi, Yj and Y20 are at lowevels for inactivation, a P-channel MOS transistor 21 is rendered non-conductive to supply no power supply potential Vcc to the invertor 75 so that a subthreshold leakage current is suppressed small in the invertor 75. The transfer gate 74 is rendered non-conductive while the P-channel Mos transistor 73 is rendered conductive for fixing the node N73 at a high level and fixing the corresponding column selection line CSL at a low level. The NAND gate 71 and the invertor 72, having MOS transistors smaller than those included in the invertor 75, have small subthreshold leakage currents.

When the predecode signals Yi, Yj and Y20 go high for activation, the P-channel MOS transistor 21 is rendered conductive to supply the power supply potential Vcc to the invertor 75. The transfer gate 74 is rendered conductive and the P-channel MOS transistor 73 is rendered non-conductive, for raising the column selection line CSL to a high level.

Figure 23:
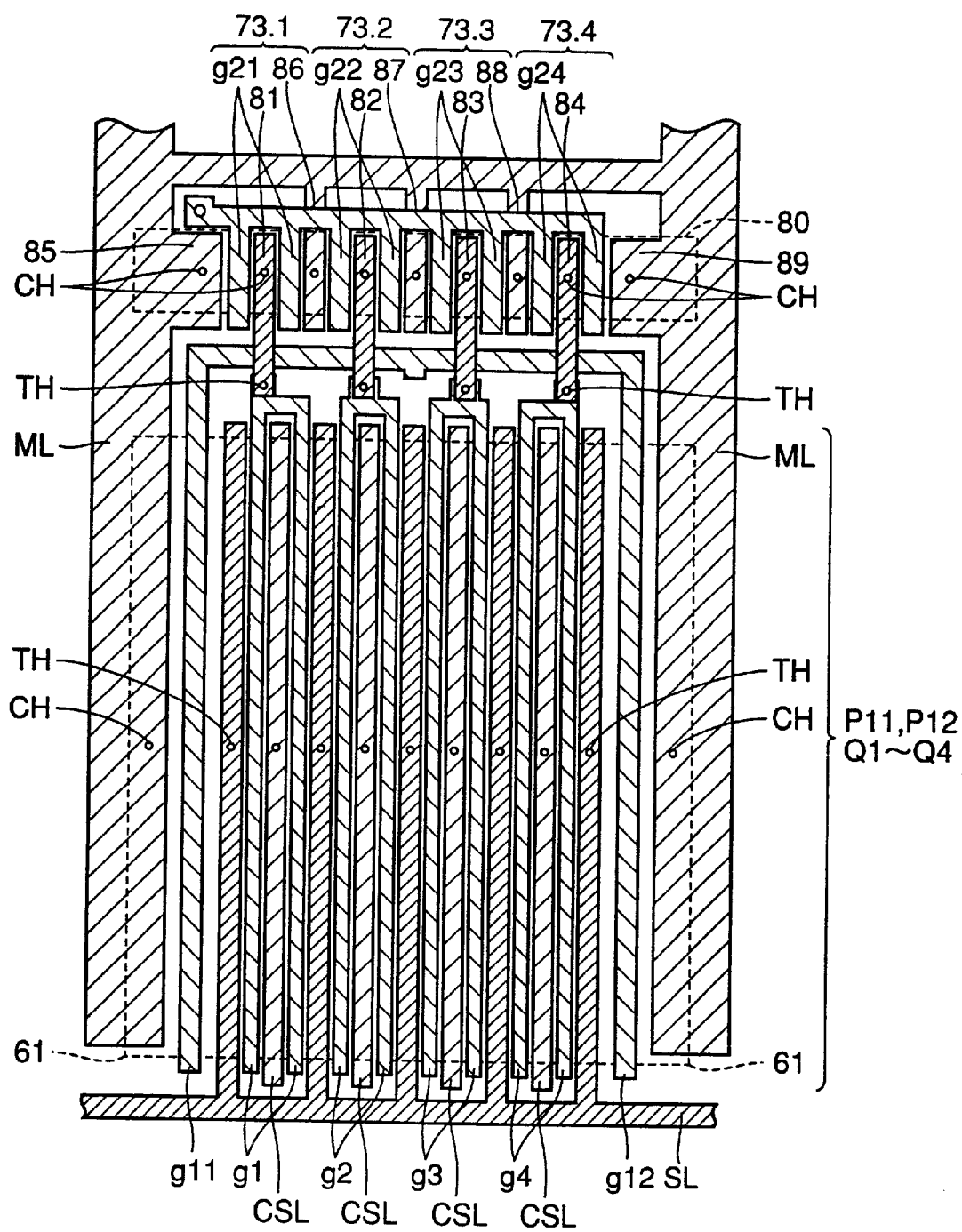
FIG. 23 is a plan view showing the layout of the circuits shown in FIG. 22 in detail.

FIG. 23 is a plan view showing the layout of the column decoder unit circuit 70 shown in FIG. 22, in contrast with FIG. 19.

Referring to FIG. 23, this layout is different from that shown in FIG. 19 in a point that P-channel MOS transistors 73.1 to 73.4 (the P-channel MOS transistor 73 shown in FIG. 22) are arranged in correspondence to four. column selection lines CSL respectively. The P-channel MOS transistors 73.1 to 73.4 include pairs of gate electrodes g21 and g21, . . . , and g24 and g24 respectively. First ends of the gate electrodes g21 to g24 are connected in common. Connecting wires 81 to 84 are provided between the gate electrodes g21 and g21, . . . and g24 and g24 respectively. A first end of the connecting wire 81 is connected to a P⁺-type impurity diffusion region 80 located between the gate electrodes g21 and g1 through a contact hole CH, while a second end thereof is connected to the gate electrode g1 of a P-channel MOS transistor Q1 via a through hole TH. Power supply lines 85 to 89 are provided between the main power supply line ML and the gate electrode g21, between the gate electrodes g21 and g22, g22 and g23 and g23 and g24 and between the gate electrode g24 and the main power supply line ML respectively. Each of the power supply lines 85 to 89 is connected to the main power supply line ML and connected to the P⁺-type impurity diffusion region 80 through a contact hole CH.

Figure 24:
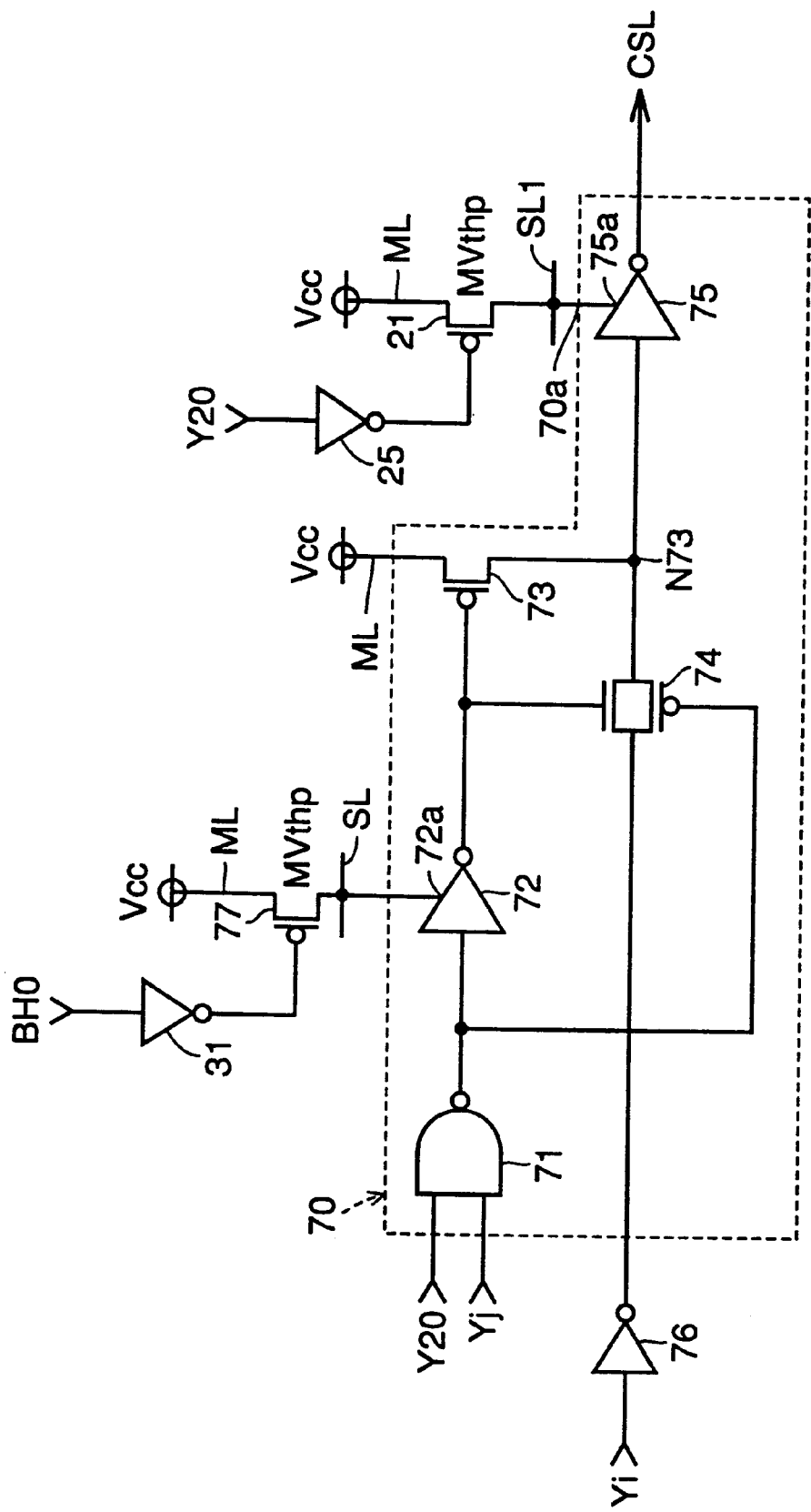
FIG. 24 is a circuit diagram showing an exemplary improvement of the SDRAM shown in FIG. 22.

A sub power supply line SL may be further provided in correspondence to column decoder blocks DB1 to DB4, as shown in FIG. 24. The sub power supply line SL is connected to a power supply node 72a of the invertor 72 of the column decoder unit circuit 70 included in the corresponding bank (#0 in FIG. 24) and connected to the main power supply line ML through a P-channel transistor 77 having a relatively high threshold value MVthp. The gate of the P-channel MOS transistor 77 receives an output signal (inverted signal of a bank hit signal BH0) from an invertor 31.

The power supply potential Vcc is supplied to the invertors 72 of all column decoder unit circuits 70 included in the bank #0 when the bank hit signal BH0 goes high, and then the power supply potential Vcc is supplied to the invertors 75 of all column decoder unit circuits 70 included in the column decoder block DB1 when the predecode signal Y20 goes high. In this case, the subthreshold leakage in the invertor 72 is reduced as compared with the circuit shown in FIG. 22, for further reducing power consumption.

Embodiment 6

In an embodiment 6 of the present invention, the size of MOS transistors for supplying a power supply potential is studied in relation to an SDRAM having a normal part and a redundancy part provided independently of each other.

Figure 25:
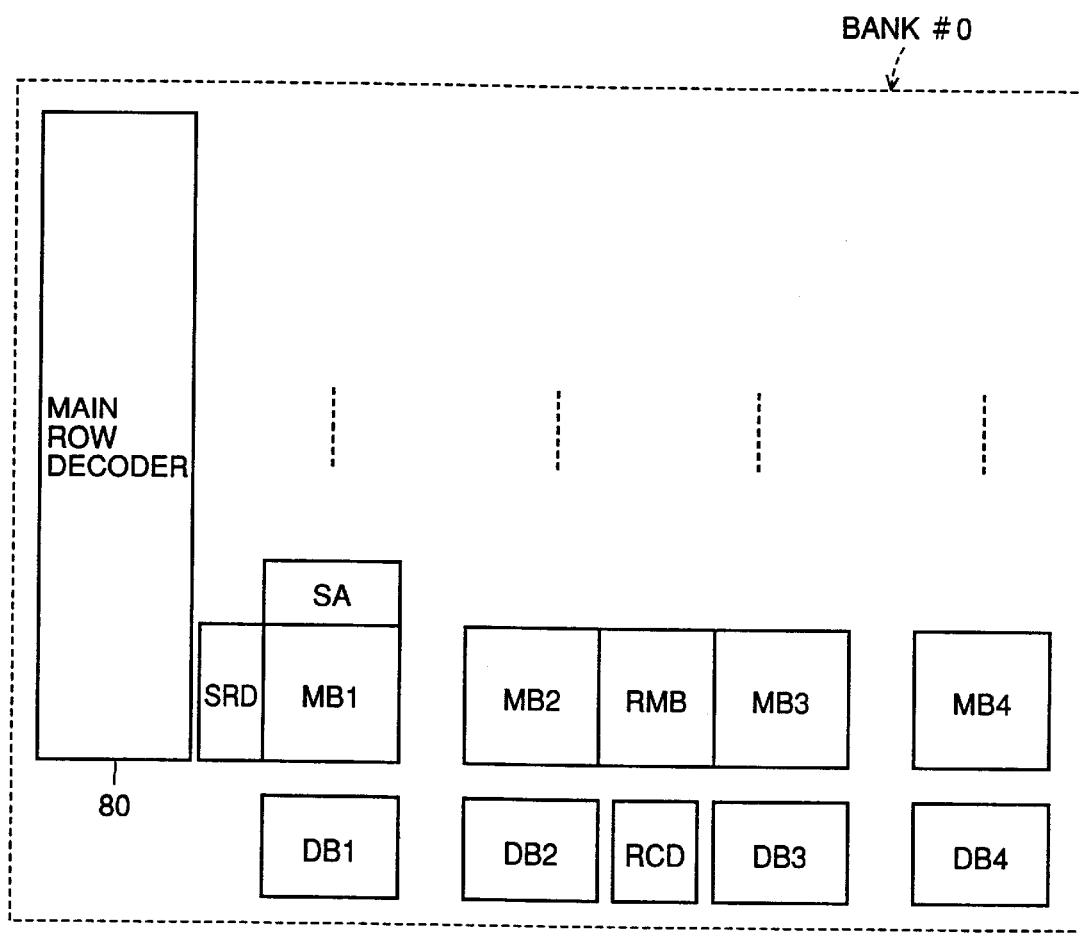
FIG. 25 illustrates the layout of a principal part of an SDRAM according to an embodiment 6 of the present invention.

FIG. 25 is a partially omitted block diagram showing the structure of a bank #0 of the SDRAM. Referring to FIG. 25, the SDRAM includes a plurality of memory array blocks MB1 to MB4 arranged in rows and columns, a redundancy memory array block RMB provided in correspondence to each memory array block row, a sub row decoder SRD and a sense amplifier SA provided in correspondence to each block MB and each block RMB, a column decoder block DB provided in correspondence to each memory array block column and a main row decoder 80. The main row decoder 80 selects any of the plurality of memory array block rows. The sub row decoder SRD selects any word line of the corresponding memory array block MB. The column decoder block DB selects any column selection line CSL of the corresponding memory array block column. The redundancy column decoder RCD selects any column selection line SCSL of a redundancy memory array block column. The sense amplifier SA reads data from a memory cell selected by the decoders 80, SRD, DB and RCD.

Figure 26B:
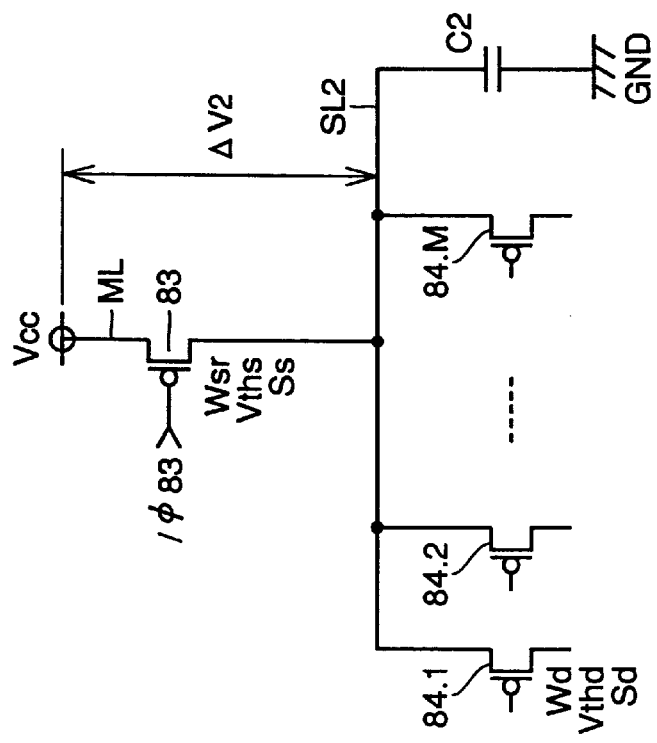
FIGS. 26A and 26B are circuit diagrams for illustrating the gate width of a MOS transistor for supplying a power supply potential etc. in the SDRAM shown in FIG. 25.
Figure 26A:
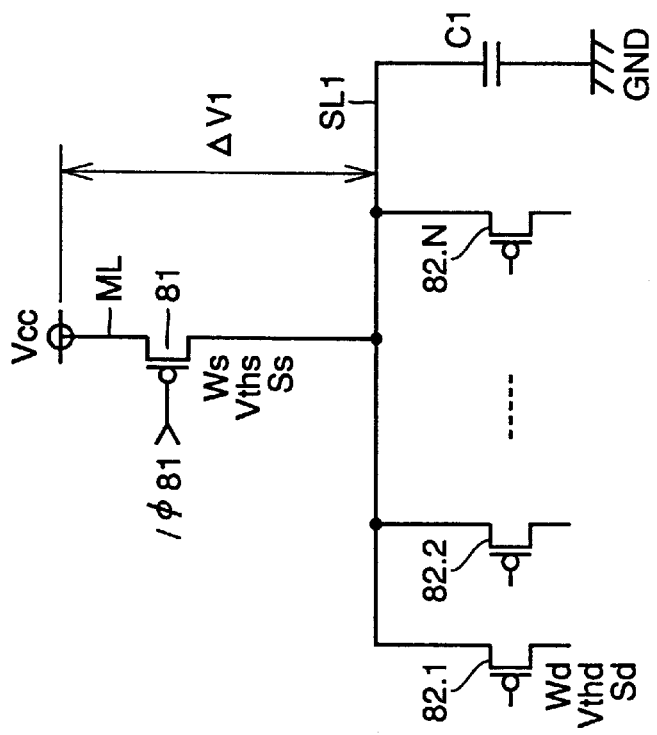

It is assumed that N P-channel MOS transistors 82.1 to 82.N for column selection line driving are provided in correspondence to a P-channel MOS transistor 81 for supplying a power supply potential in the normal part (DB1 to DB4 in FIG. 25) of this SDRAM, as shown in FIG. 26A.

The P-channel MOS transistor 81 is connected between a main power supply line ML and a sub power supply line SL1, and its gate receives a block selection signal /φ81. It is assumed that the P-channel MOS transistor 81 has a gate width Ws (μm), a threshold voltage Vths (V) and an S factor Ss (V/dec).

Each of the P-channel MOS transistors 82.1 to 82.N is connected between the sub power supply line SL1 and the corresponding column selection line CSL. It is assumed that each of the P-channel MOS transistors 82.1 to 82.N has a gate width Wd (μm), a threshold voltage Vthd, (V) and an S factor Sd (V/dec).

It is assumed that the capacitance value C1 of the sub power supply line SL1 is proportionate to the number N of the P-channel MOS transistors 82.1 to 82.N. It is also assumed that the potential of the sub power supply line SL1 lowers to Vcc−ΔV1 in a standby state, where ΔV1 is expressed as follows:

$$\Delta V1 = -(Sd/Ss)\cdot Vths + Vthd - Sd\cdot\log 10\{Ws/(N\cdot Wd)\} \quad (1)$$

It is further assumed that the redundancy part (RCD in FIG. 25) of this SDRAM is provided with M (M<N) P-channel MOS transistors 84.1 to 84.M for spare column selection line driving in correspondence to a single P-channel MOS transistor 83 for supplying the power supply potential, as shown in FIG. 26B.

The P-channel MOS transistor 83 is connected between the main power supply line ML and a sub power supply line SL2, and its gate receives a bank selection signal /φ83. It is assumed that the P-channel MOS transistor 83 has a gate width Wsr (μm), a threshold voltage Vths (V) and an S factor Ss (V/dec).

Each of the P-channel MOS transistors 84.1 to 84.M is connected between the sub power supply line SL2 and a corresponding spare column selection line SCSL. It is assumed that each of the P-channel MOS transistors 84.1 to 84.M has a gate width Wd (μm), a threshold voltage Vthd (V) and an S factor Sd (V/dec).

It is assumed that the capacitance value C2 of the sub power supply line SL2 is proportionate to the number M of the P-channel MOS transistors 84.1 to 84.M. It is also assumed that the potential of the sub power supply line SL2 lowers to Vcc−ΔV2 in the standby state, where ΔV2 is expressed as follows:

$$\Delta V2 = -(Sd/Ss)\cdot Vths + Vthd - Sd\cdot\log 10\{Ws/(M\cdot Wd)\} \quad (2)$$

The values ΔV1 and ΔV2 may be so set that ΔV1≦ΔV2, for recovering the potential of the sub power supply line SL1 from Vcc−ΔV1 to Vcc with no delay as compared with the time for recovering the potential of the sub power supply line SL2 from Vcc−ΔV2 to Vcc. For this purpose, Ws(N·Wd)≧Wsr/(·Wd) may hold in the expressions (1) and (2). In other words, Wsr≦(M/N)·Ws<Ws holds.

Therefore, the gate width Wsr of the P-channel MOS transistor 83 of the redundancy part for supplying the power supply potential is properly rendered smaller than the gate width Ws of the P-channel MOS transistor 81 of the normal part for supplying the power supply potential.

Embodiment 7

In an embodiment 7 of the present invention, the sizes of MOS transistors for supplying a power supply potential are studied in relation to an SDRAM (see FIGS. 11 and 12) having a redundancy part built into a part of a normal part.

Figure 27:
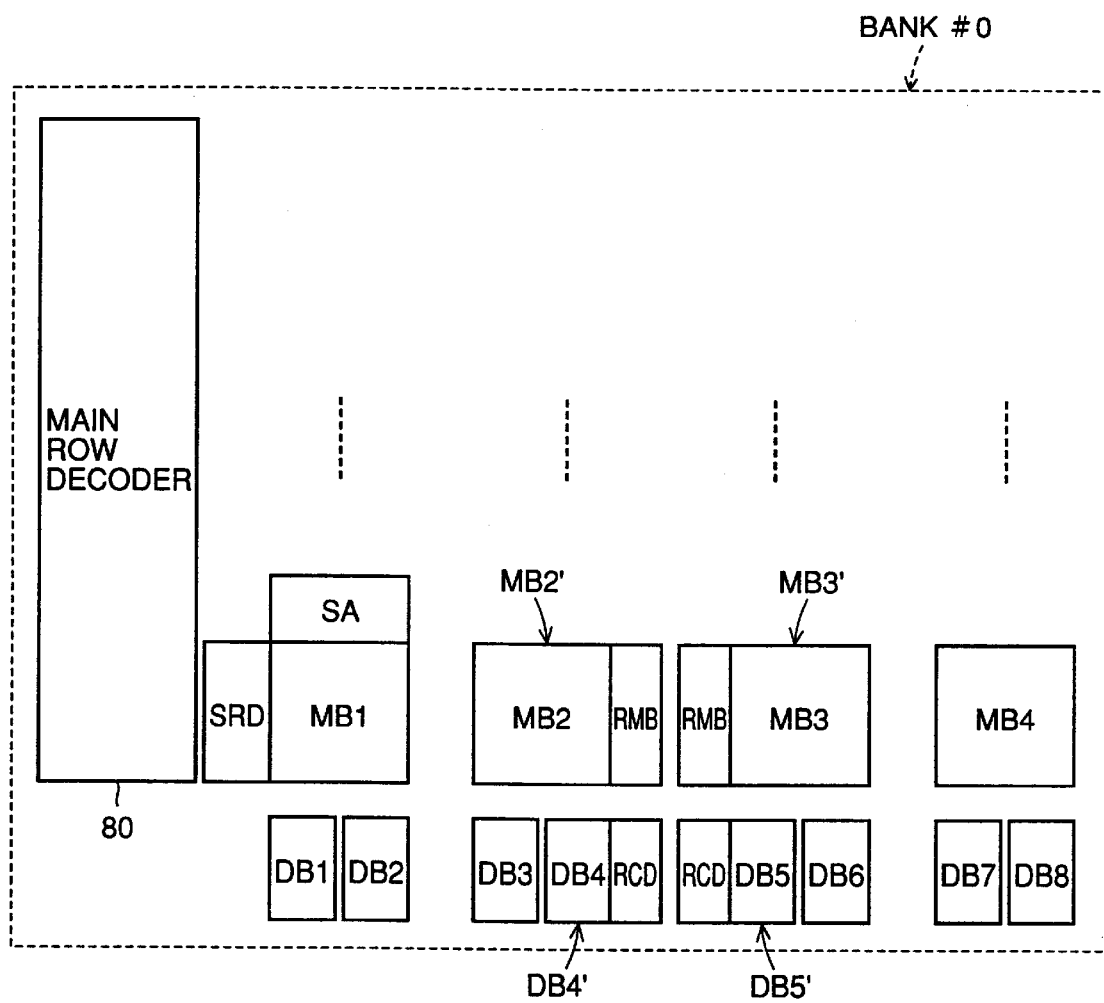
FIG. 27 illustrates the layout of a principal part of an SDRAM according to an embodiment 7 of the present invention.

FIG. 27 is a partially omitted block diagram showing the structure of a bank of the SDRAM. Referring to FIG. 27, this SDRAM is different from that shown in FIG. 25 in points that column decoder blocks DB1 to DB4 are split into pairs of column decoder blocks DB1 and DB2, DB3 and DB4, DB5 and DB6 and DB7 and DB8 respectively, a redundancy column decoder RCD is split into two parts built into the column decoder blocks DB4 and DB5, and a redundancy memory array block RMB is split into two parts built into memory array blocks MB2 and MB3.

The column decoder blocks DB4 and DB5 including the split parts of the redundancy column decoder RCD form normal+redundancy column decoder blocks DB4' and DB5' respectively. The memory array blocks MB2 and MB3 including the split parts of the redundancy memory array block RMB form normal+redundancy memory array blocks MB2' and MB3' respectively.

Therefore, the normal part (DB1 to DB3 and DB6 to DB8 in FIG. 27) of this SDRAM is identical to that shown in FIG. 26A except that the former has ½ P-channel MOS transistors 82 as compared with the latter, as shown in FIG. 28A. A redundancy+normal part (DB4' and DB5' in FIG. 27) has a structure obtained by combining the structures shown in FIGS. 26A and 26B with each other and splitting the combined structure into two parts, as shown in FIG. 28B. In the redundancy+normal part, a P-channel transistor 83 is connected between a main power supply line ML and a sub power supply line SL3, P-channel MOS transistors 82.1 to 82.N' are connected between the sub power supply line SL3 and N' (N'=N/2) column selection lines CSL respectively, and P-channel MOS transistors 84.1 to 84.N' are connected between the sub power supply line SL3 and M' (M'=M/2) spare column selection lines SCSL respectively.

It is assumed that the capacitance value of the sub power supply line SL3 is proportionate to the number M'+N' of the P-channel MOS transistors 82.1 to 82.N' and 84.1 to 84.M'. It is also assumed that the potential of the sub power supply line SL3 lowers to Vcc−ΔV3 in a standby state, where ΔV3 is expressed as follows:

$$\Delta V3 = -(Sd/Ss) \cdot Vths + Vthd - Sd \cdot \log 10\{Ws'/(M'+N')Wd\} \quad (3)$$

The values ΔV1 and ΔV3 may be so set that ΔV1≦ΔV3, for recovering the potential of the sub power supply line SL1 from Vcc−ΔV1 to Vcc with no delay as compared with the time for recovering the potential of the sub power supply line SL3 from Vcc−ΔV3 to Vcc. For this purpose, Ws'/(N'·Wd')≧Wsr'/(N'+M')Wd' may hold in the expressions (1) and (3). In other words, Wsr'−Ws'≦(M'/N')·Ws'<Ws' holds.

Therefore, the difference Wsr'−Ws' between the gate width Wsr' of the P-channel MOS transistor 83 of the redundancy+normal part for supplying the power supply potential and the gate width Ws' of the P-channel MOS transistor 81 of the normal part for supplying the power supply potential is properly reduced below Ws'.

Embodiment 8

In an embodiment 8 of the present invention, the gate widths Ws and Wsr of the P-channel MOS transistors 81 and 83 for supplying the power supply potential in the SDRAM shown in FIGS. 25, 26A and 26B are studied in consideration of ability for driving the column selection lines CSL and SCSL. The ability for driving the column selection lines CSL indicates that of supplying a current to the column selection lines CSL through, e.g., the P-channel MOS transistor 82.1 shown in FIG. 26A when rendering the P-channel MOS transistor 82.1 conductive. It is assumed that this ability is proportionate to the product of the gate width Ws of the P-channel MOS transistor 81 and the capacitance value C1 of the sub power supply line SLi. It is also assumed that a represents the maximum number of the column selection lines CSL simultaneously activated in the normal part and b represents the maximum number of the spare column selection lines SCSL simultaneously activated in the redundancy part.

The following expression (4) must hold so that the redundancy part has ability of driving the spare column selection lines SCSL similarly to the ability of the normal part for driving the column selection lines CSL:

$$(Ws/a) \cdot (C1/a) \leq (Wsr/b) \cdot (C2/b) \quad (4)$$

Therefore, the gate width Wsr must satisfy Wsr≧(C1/C2)·(b/a)·(b/a)·Ws.

When a=1 and b≧1, Wsr≧(C1/C2)·Ws>Ws. In other words, the gate width Wsr of the P-channel MOS transistor 83 of the redundancy part for supplying the power supply potential must be larger than the gate width Ws of the P-channel MOS transistor 81 of the normal part for supplying the power supply potential.

Figure 29B:
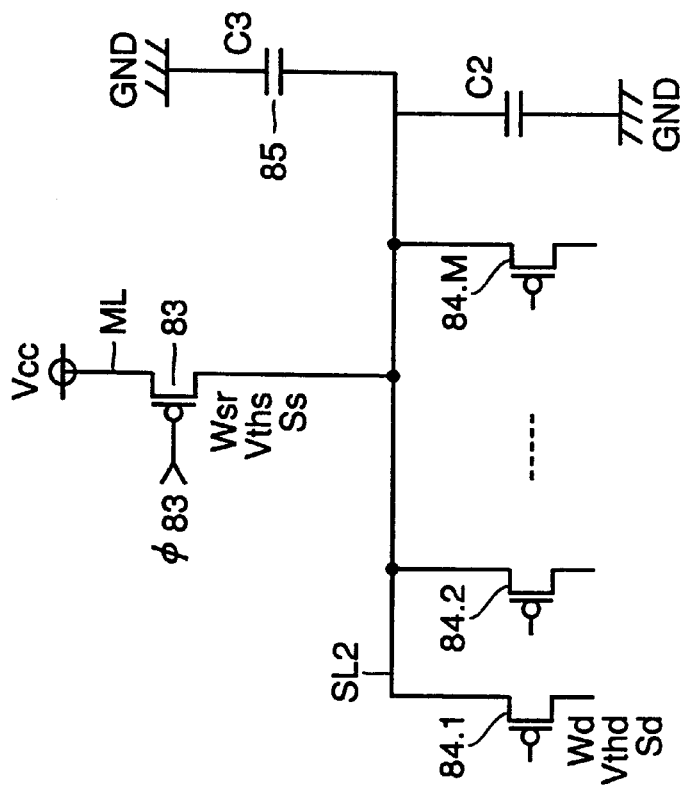
FIGS. 29A and 29B are circuit diagrams for illustrating the gate width of a MOS transistor for supplying a power supply potential etc. in an SDRAM according to an embodiment 8 of the present invention.
Figure 29A:
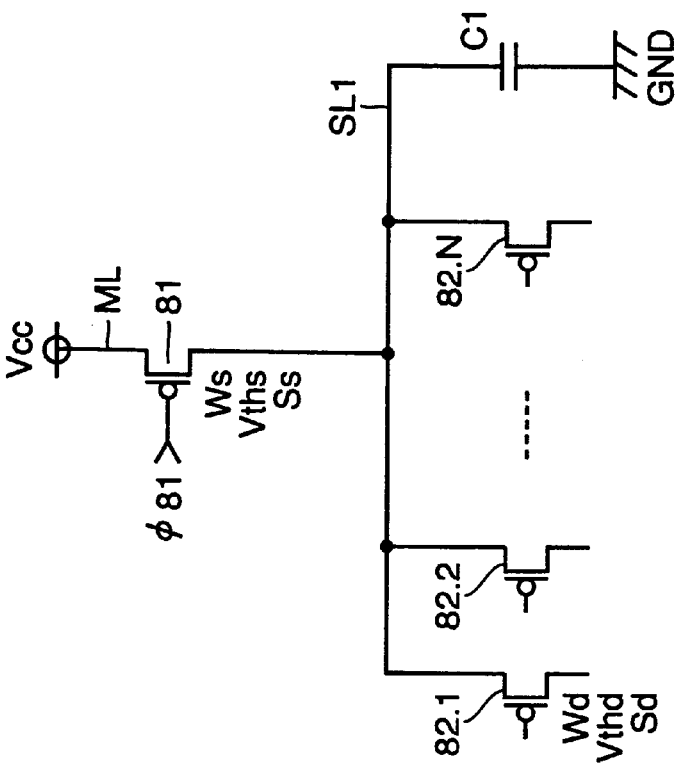

When an auxiliary capacitor 85 having a capacitance value C3 (fF) is provided between the sub power supply line SL2 and the line of the ground potential GND as shown in FIGS. 29A and 29B, the following expression (5) holds:

$$(Ws/a) \cdot (C1/a) = (Wsr/b) \cdot \{(C2+C3)/b\} \quad (5)$$

If the capacitor 85 satisfies C3=C1−C2 when a=1 and b=1, Wsr=Ws. When the auxiliary capacitor 85 having the proper capacitance value C3 is provided on the sub power supply line SL2 of the redundancy part, the gate width Wsr of the P-channel MOS transistor 83 is equalized with the gate width Ws of the P-channel MOS transistor 81.

Embodiment 9

In an embodiment 9 of the present invention, the gate widths Ws' and Wsr' of the power supply P-channel MOS transistors 81 and 83 for supplying the power supply potential in the SDRAM shown in FIGS. 28A and 28B are studied in consideration of ability for driving the column selection lines CSL and SCSL.

It is assumed that a represents the maximum number of the column selection lines CSL simultaneously activated in the normal part and b represents the maximum number of the column selection lines CSL and SCSL simultaneously activated in the redundancy+normal part. The following (6) must hold so that the redundancy+normal part has ability of driving the column selection lines CSL and SCSL similarly to the ability of the normal part for driving the column selection lines CSL:

$$(Ws'/a) \cdot (C1/a) \leq (Wsr'/b) \cdot \{(C1+C2)/b\} \quad (6)$$

Therefore, the gate width Wsr' must satisfy Wsr'≧{C1/(C1+C2)}(b/a)(b/a)Ws'. When a=1, b=1 and C2/C1=16, Wsr'−Ws'≧(47/17)·Ws'>Ws' holds. In other words, the difference Wsr'−Ws' between the gate width Wsr' of the P-channel MOS transistor 83 of the redundancy+normal part for supplying the power supply potential and the gate width Ws' of the P-channel MOS transistor 81 of the normal part for supplying the power supply potential must be larger than the gate width Ws'.

Figure 30B:
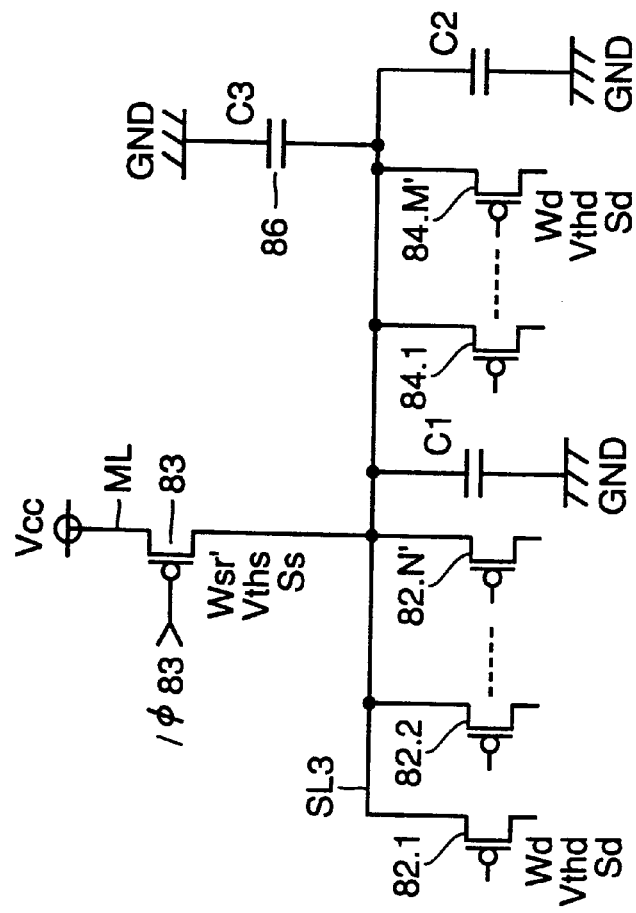
FIGS. 30A and 30B are circuit diagrams for illustrating the gate width of a MOS transistor for supplying a power supply potential etc. in an SDRAM according to an embodiment 9 of the present invention.
Figure 30A:
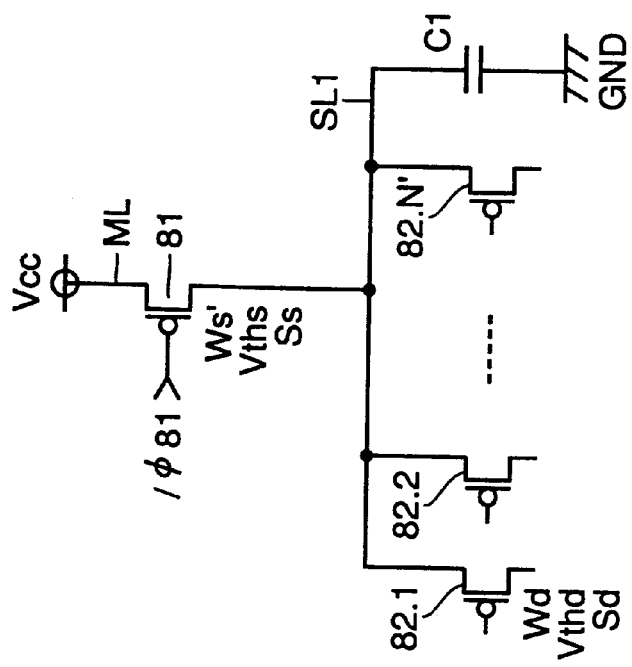

When an auxiliary capacitor 86 having a capacitance value C3 (fF) is provided between the sub power supply line SL3 and the line of the ground potential GND as shown in FIGS. 30A and 30B, the following expression (7) holds:

$$W_{sr}' = \{(C1/(C1+C2+C3))\} \cdot \{1+(b/a)\} \cdot \{1+(b/a)\} \cdot W_s' \quad (7)$$

If the capacitor 86 satisfies C3=15·C2 when a=1 and b=1, Wsr'−Ws'=Ws'. When the auxiliary capacitor 86 having the proper capacitance value C3 is provided on the sub power supply line SL3 of the redundancy+normal part, the difference Wsr'−Ws' between the gate width Wsr' of the P-channel MOS transistor 83 and the gate width Ws' of the P-channel MOS transistor 81 is equalized with the gate width Ws' of the P-channel MOS transistor 81.

Embodiment 10

In an embodiment 10 of the present invention, the threshold voltage Vths and the gate width Ws of the P-channel MOS transistor for supplying the power supply potential are studied.

It is assumed that the total number of the column selection lines CSL is 16384, and a column selection line driving P-channel MOS transistor provided in correspondence to each column selection line CSL has a gate width Wd of 60 μm, a threshold voltage Vthd of −0.17 V and an S factor Sd of 130 mV/dec. It is also assumed that the threshold voltage Vthd is a gate voltage flowing by 1 μA per gate width of 10 μm.

A standby sub leakage current (subthreshold leakage current) I flowing through a P-channel MOS transistor having a gate width W, a threshold voltage Vth and an S factor S is expressed as follows:

$$I = I0 \cdot (W/W0) \cdot 10^{(Vth/S)} \quad (8)$$

where I0 represents the current (1 μA in this case) defining the threshold voltage and W0 represents the gate width (10 μm in this case) defining the threshold voltage.

When the source of the column selection line driving P-channel MOS transistor is directly connected to the main power supply line ML, I=1 μA·(16384×60 μm/10 μm)·10$^{(-0.17V/0.13V/dec)}$=4.8 mA and completely exceeds 300 μA, the upper limit for the standby sub leakage current I allowed in the column decoder.

The gate width W of the P-channel MOS transistor feeding the standby sub leakage current of 300 μA calculated from the expression (8) is equal to 60927.5 μm.

Therefore, the 16384 column selection lines CSL are split into 128 blocks each having 128 column selection lines CSL, and a single P-channel MOS transistor for supplying the power supply potential is provided for each block. When the P-channel MOS transistor for supplying the power supply potential has the same threshold voltage and S factor as the P-channel MOS transistor for driving the column selection line, the gate width Ws of the P-channel MOS transistor for supplying the power supply potential is equal to 60927.5 μm/128=475 μm.

This gate width (475 μm) is about eight times the gate width (60 μm) of the P-channel MOS transistor for driving the column selection line, and hence it is not conceivable that activation of the column selection line CSL is delayed by the impedance of the P-channel MOS transistor for supplying the power supply potential.

Embodiment 11

Also in an embodiment 11 of the present invention, the threshold voltage Vths and the gate width Ws of the P-channel MOS transistor for supplying the power supply potential are studied.

It is assumed that the total number of the column selection lines CSL is 16384, and the column selection line driving P-channel MOS transistor has a gate width Wd of 60 μm, a threshold voltage of −0.05 V and an S factor of 130 mV/dec.

When the source of the column selection line driving P-channel MOS transistor is directly connected to the main power supply line ML, I=1 μA·(16384×60 μm/10 μm)·10$^{(-0.06V/0.13V/dec)}$=98 mA and completely exceeds 300 μA, the upper limit for the standby sub leakage current I allowed in the column decoder.

The gate width W of the P-channel MOS transistor feeding the standby sub leakage current of 300 μA calculated from the expression (8) is equal to 7273.38 μm.

Therefore, the 16384 column selection lines CSL are split into 128 blocks each having 128 column selection lines CSL, and a single P-channel MOS transistor for supplying the power supply potential is provided for each block. When the P-channel MOS transistor for supplying the power supply potential has the same threshold voltage and S factor as the P-channel MOS transistor for driving the column selection line, the gate width Ws of the P-channel MOS transistor for supplying the power supply potential is equal to 7273.38 μm/128=56.8 μm. This value (56.8 μm) is smaller than the gate width (60 μm) of the column selection line driving P-channel MOS transistor, and hence activation of the column selection line CSL is obviously delayed by the impedance of the P-channel MOS transistor for supplying the power supply potential.

When the P-channel MOS transistor for supplying the power supply potential has a threshold voltage Vths of −0.15 V, the gate width W of the P-channel MOS transistor feeding the standby sub leakage current of 300 μA calculated from the expression (8) is equal to 47253 μm. In this case, the gate width Ws of the P-channel MOS transistor for supplying the power supply potential is 42735 μm/128=334 μm, which is about 5.5 times the gate width (60 μm) of the column selection line driving P-channel MOS transistor. Therefore, it is conceivable that activation of the column selection line CSL is not delayed by the impedance of the P-channel MOS transistor for supplying the power supply potential.

When the P-channel MOS transistor for supplying the power supply potential has a threshold voltage of −0.15 V, potential reduction ΔV of the sub power supply line SL in the standby time, calculated from the expression (1), is equal to 0.277 V.

When the P-channel MOS transistor for supplying the power supply potential has the same gate width (334 μm) and a threshold voltage of −0.5 V, potential reduction ΔV of the sub power supply line SL in the standby time, calculated from the expression (1), is equal to 0.627 V.

When the threshold voltage of the P-channel MOS transistor for supplying the power supply potential is increased, therefore, the potential reduction ΔV of the sub power supply line SL in the standby state is so increased that a time is required for recovering the potential reduction ΔV, although the standby sub leakage current is reliably reduced. When the threshold voltage of the P-channel MOS transistor is increased while suppressing the potential reduction ΔV, the gate width of the P-channel MOS transistor must be increased, to result in remarkable area penalty.

Therefore, the threshold voltage and the gate width of the P-channel MOS transistor for supplying the power supply potential must be decided in consideration of three factors, i.e., the sub leakage current value, potential reduction of the sub power supply line SL and the area penalty.

Embodiment 12

Figure 31:
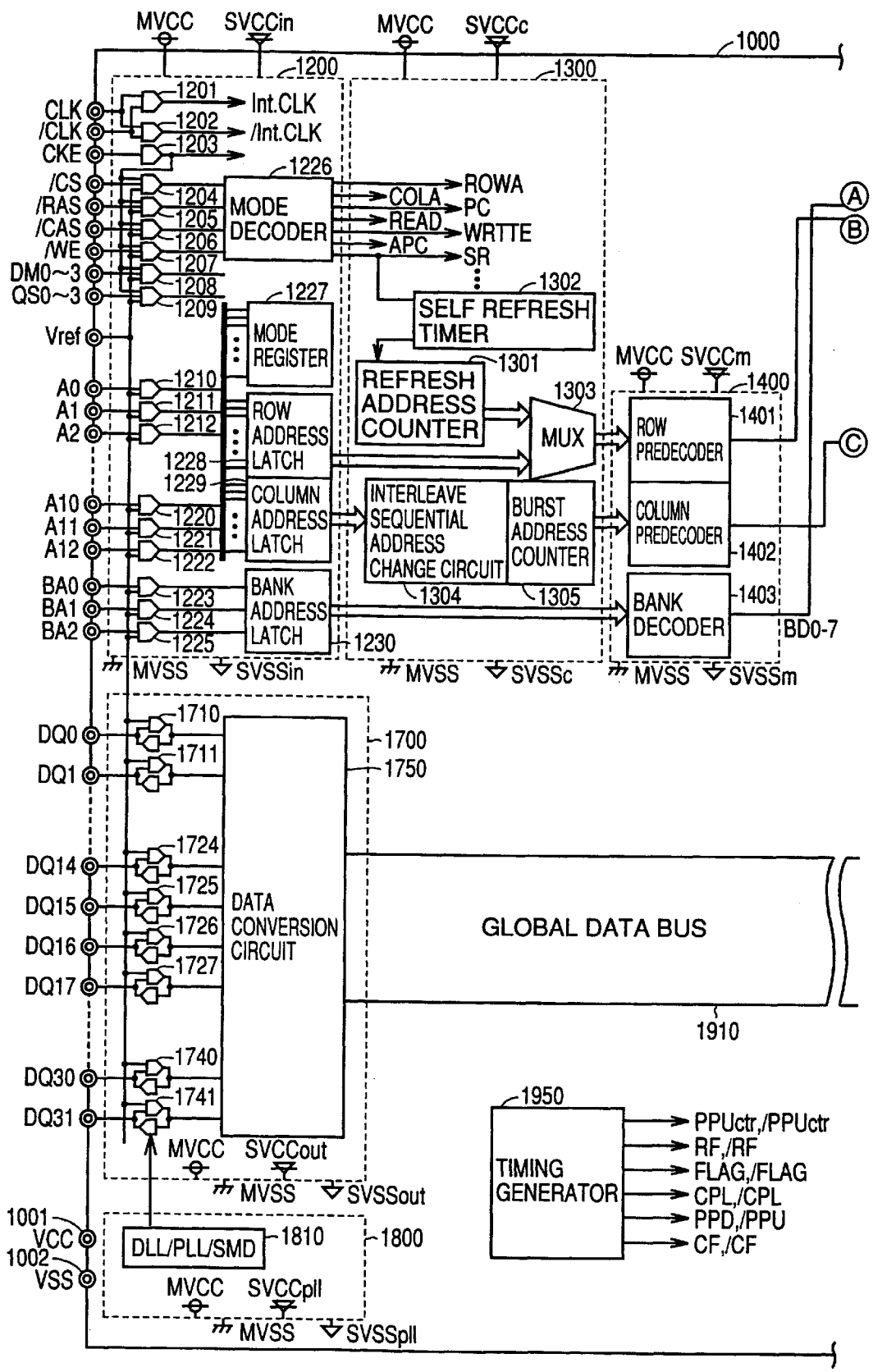
FIG. 31 is a block diagram showing the overall structure (left half) of an SDRAM according to an embodiment 12 of the present invention.
Figure 32:
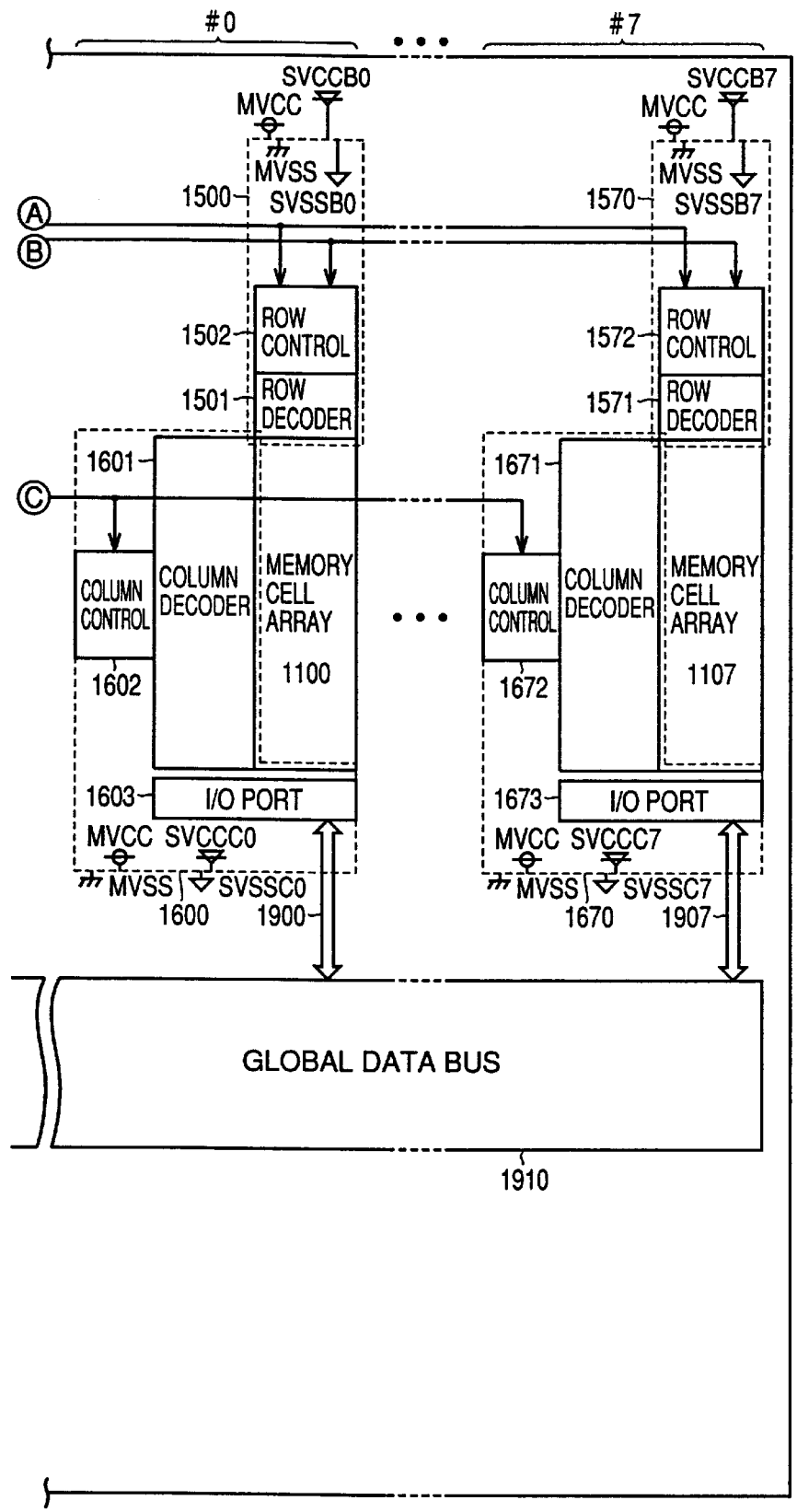
FIG. 32 is a block diagram showing the overall structure (right half) of the SDRAM according to the embodiment 12 of the present invention.

FIGS. 31 and 32 are block diagrams showing the structure of a synchronous dynamic random access memory (SDRA)

1000 according to an embodiment 12 of the present invention. Referring to FIGS. 31 and 32, the SDRAM 1000 includes memory cell arrays 1100 to 1107 split into eight banks #0 to #7. The SDRAM 1000 further includes an input system 1200 receiving control signals, address signals and the like, a center system 1300 operating in response to a signal from the input system 1200, an intermediate system 1400 operating in response to a signal from the center system 1300, row systems 1500 to 1570 split into the eight banks #0 to #7, column systems 1600 to 1670 split into the eight banks #0 to #7, a data input/output system 1700 inputting/outputting data signals DQ0 to DQ31 of 32 bits, and an input/output control system 1800 controlling the data input/output of the data input/output system 1700 in general.

The input system 1200 includes a clock buffer 1201 generating an internal clock signal Int.CLK in response to an external clock signal CLK and an external clock signal /CLK complementary with the external clock signal CLK, another clock buffer 1202 generating an internal clock signal /Int.CLK in response to the external clock signals CLK and /CLK, a clock enable buffer 1203 generating an internal clock enable signal in response to an external clock enable signal CKE, a CS buffer 1204 generating an internal chip selection signal in response to an external chip selection signal /CS, a RAS buffer 1205 generating an internal row address strobe signal in response to an external row address strobe signal /RAS, a CAS buffer 1206 generating an internal column address strobe signal in response to an external column address strobe signal /CAS, a WE buffer 1207 generating an internal write enable signal in response to an external write enable signal /WE, a DM buffer 1208 generating an internal data mask signal in response to external data mask signals DM0 to DM3, another DM buffer 1209 generating an internal control signal in response to external control signals DM0 to DM3, address buffers 1210 to 1222 generating internal address signals in response to external address signals A0 to A12 of 13 bits, and bank address buffers 1223 to 1225 generating internal bank address signals in response to external bank address signals BA0 to BA2 of three bits. Each of the buffers 1204 to 1225 determines the logical level of the input signal therein on the basis of an externally supplied reference voltage Vref.

The input system 1200 further includes a mode decoder 1226 generating various control signals ROWA, COLA, PC, READ, WRITE, APC and SR for controlling the internal circuits of the SDRAM in response to the signals from the buffers 1204 to 1206. The control signal ROWA is a signal for activating a row system, the control signal COLA is a signal for activating a column system, the control signal PC is a signal for instructing precharging of a pair of bit lines, the control signal READ is a signal instructing a read operation of the column system, the control signal WRITE is a signal instructing a write operation of the column system, the control signal APC is a signal instructing automatic precharging, and the control signal SR is a signal for instructing self refreshment.

The input system 1200 further includes a mode register 1227 holding information on an operation mode, a burst length, a single data rate, a double data rate and the like in response to the internal address signals from the address buffers 1210 to 1222, a row address latch circuit 1228 holding a row address signal to be supplied to the row systems 1500 to 1507 in response to the internal address signals, a column address latch circuit 1229 holding a column address signal to be supplied to the column systems 1600 to 1607 in response to the internal address signals, and a bank address latch circuit 1230 holding a bank address signal to be supplied to the row systems 1500 to 1507 in response to the internal bank address signals from the bank address buffers 1223 to 1225.

The center system 1300 includes a refresh address counter 1301 internally generating a refresh address signal, a self refresh timer 1302 activating the refresh address counter 1301 after a lapse of a prescribed time in response to the control signal SR from the mode decoder 1226, a multiplexer MUX) 1303 supplying either the row address signal from the row address latch circuit 1228 or the refresh address signal from the refresh address counter 1301 and supplying the same to the row systems 1500 to 1507, an interleave sequential address change circuit 1304, and a burst address counter 1305 generating a column address signal in response to the data of the burst length received from the mode register 1227.

The intermediate system 1400 includes a row predecoder 1401 predecoding the row address signal from the multiplexer 1300, a column predecoder 1402 predecoding the column address signal from the burst address counter 1305, and a bank decoder 1403 decoding the bank address signal from the bank address latch circuit 1230 and generating bank decode signals BD0 to BD7.

The row systems 1500 to 1570 include row decoders 1501 to 1571 and row control circuits 1502 to 1572 controlling the row decoders 1501 to 1571 respectively. The row control circuits 1502 to 1572 select one of the eight banks #0 to #7 in response to the bank decode signals BD0 to BD7 from the bank decoder 1403. In the selected bank, the row decoder selectively drives a word line (not shown) in a memory cell array in response to the row predecode signal from the row predecoder 1401.

The column systems 1600 to 1670 include column decoders 1601 to 1671, column control circuits 1602 to 1672 controlling the column decoders 1601 to 1671, and I/O ports 1603 to 1673 inputting/outputting data signals of the memory cell arrays 1100 to 1107. In the aforementioned selected bank, the column decoder selective drives a column selection line in the memory cell array in response to the column predecode signal from the column predecoder 1402.

The data input/output system 1700 includes input/output buffers 1710 to 1741 inputting/outputting data signals DQ0 to DQ31 of 32 bits and a data conversion circuit 1750 converting the parallel data signals DQ0 to DQ31 to serial data signals in the read operation and converting the serial data signals to the parallel data signals DQ0 to DQ31 in a write operation while performing double data rate conversion. The input/output buffers 1710 to 1741 also determine the logical levels of the inputted data signals DQ0 to DQ31 on the basis of the externally supplied reference voltage Vref.

The input/output control system 1800 includes a DLL/PLL/SMD circuit 1810 controlling the input/output buffers 1710 to 1741.

In this SDRAM 1000, the I/O ports 1603 to 1673 are connected to a common global data bus 1910 through local data buses 1900 to 1907 respectively. The global data bus 1910 is connected to the data conversion circuit 1750. Therefore, data signals read from the memory cell arrays 1100 to 1107 are transferred to the data conversion circuit 1750 through the local data buses 1900 to 1907 and the global data bus 1910, and data signals from the data conversion circuit 1750 are written in the memory cell arrays 1100 to 1107 through the global data bus 1910 and the local data buses 1900 to 1907.

This SDRAM 1000 is further provided with a timing generator 1950 generating various control signals PPUctr, /PPUctr, RF, /RF, FLAG, /FLAG, CPL, /CPL, PPD, /PPU, CF and /CF described later in detail.

Figure 33:
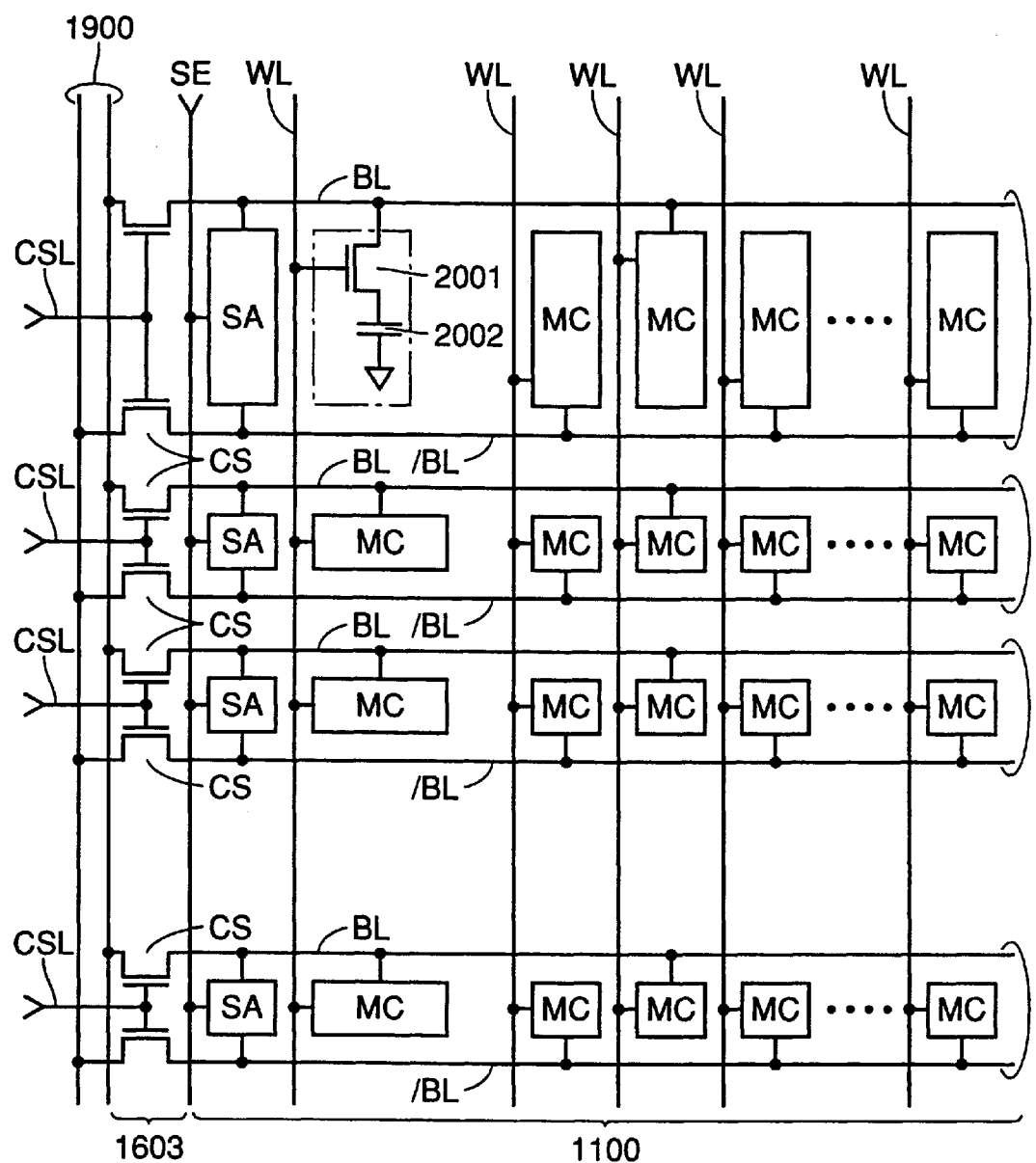
FIG. 33 is a block diagram showing the structure of a memory cell array of a bank #0 shown in FIG. 32.

The memory cell arrays 1100 to 1107 are identical in structure to each other, and hence the structure of the memory cell array 1100 is now representatively described. As shown in FIG. 33, the memory cell array 1100 includes a plurality of memory cells MC arranged in a plurality of rows and a plurality of columns, a plurality of word lines WL arranged on the plurality of rows, a plurality of pairs of bit lines BL and /BL arranged on the plurality of columns, and a plurality of sense amplifiers SA connected to the plurality of pairs of bit lines BL and /BL. Each memory cell MC has an access transistor 2001 turned on/off in response to the voltage of the corresponding word line WL and a capacitor 2002 connected to the access transistor 2001. The word line WL is connected to the row decoder 1501 shown in FIG. 32.

The I/O port 1603 has a plurality of column selection gates CS connected between the plurality of pairs of bit lines BL and /BL and the local data bus 1900 respectively. The column selection gates CS are connected to the column decoder 1601 shown in FIG. 32 through column selection lines CSL.

Figure 34:
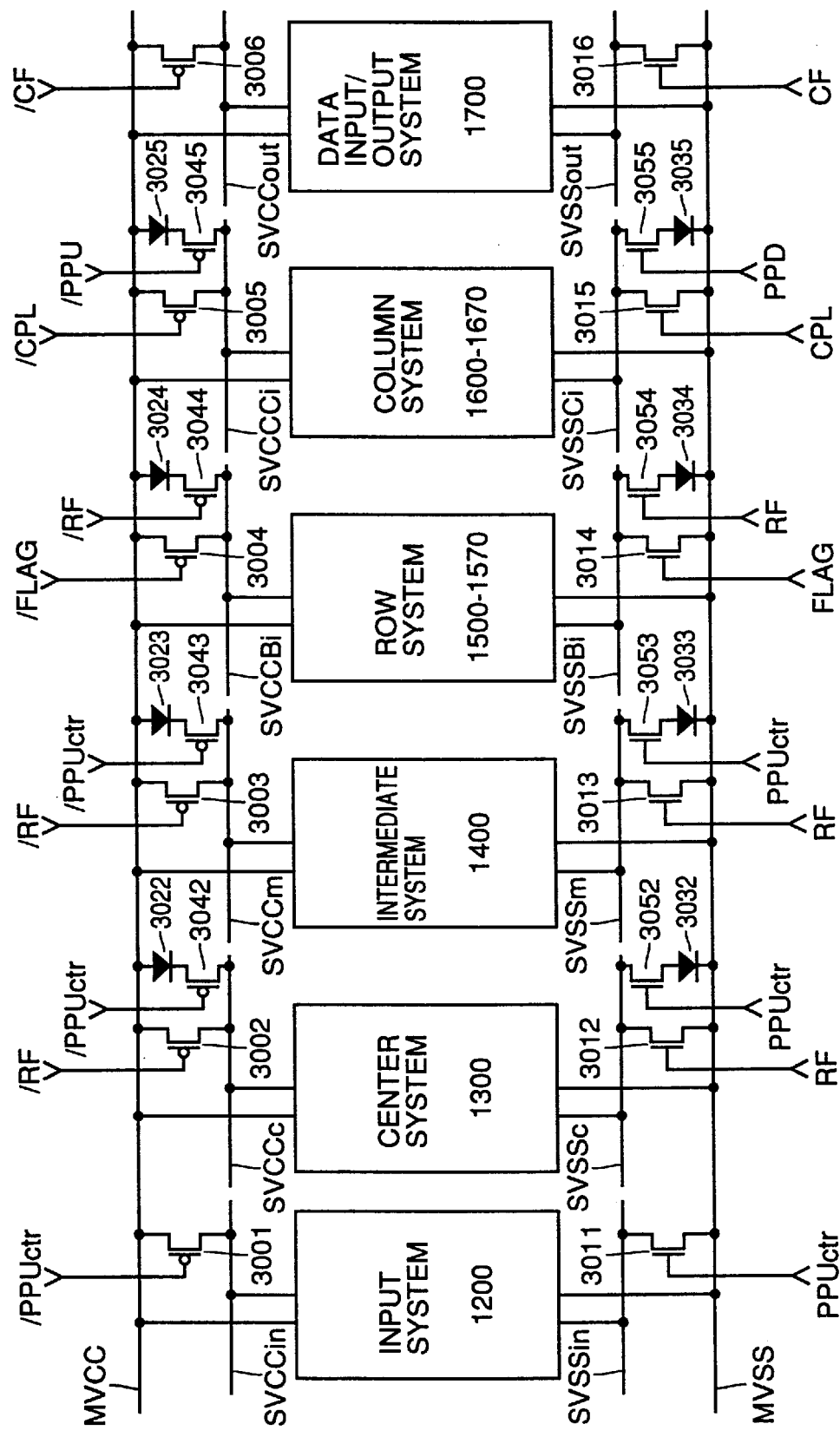
FIG. 34 is a block diagram showing a split hierarchical power supply structure in the SDRAM shown in FIGS. 31 and 32.

As shown in FIG. 34, the SDRAM 1000 includes a main power supply line MVCC and a main ground line MVSS. The main power supply line MVCC is connected to a power supply terminal 1001 shown in FIG. 31, and receives a power supply voltage VCC (e.g., 1.5 V) from an external device. The main ground line MVSS is connected to a ground terminal 1002 shown in FIG. 31, and receives a ground voltage VSS from an external device.

Each of the input system 1200, the center system 1300, the intermediate system 1400, the row systems 1500 to 1570, the column systems 1600 to 1670 and the data input/output system 1700 is formed by the internal circuit groups shown in FIGS. 31 and 32, and each internal circuit group enters an active or standby state.

In this SDRAM 1000, a sub power supply line SVCCin and a sub ground line SVSSin are provided in correspondence to the input system 1200, a sub power supply line SVCCc and a sub ground line SVSSc are provided in correspondence to the center system 1300, a sub power supply line SVCCm and a sub ground line SVSSm are provided in correspondence to the intermediate system 1400, a sub power supply line SVCCBi (i=0 to 7) and a sub ground line SVSSBi are provided in correspondence to each of the row systems 1500 to 1570, a sub power supply line SVCCCi and a sub ground line SVSSCi are provided in correspondence to each of the column systems 1600 to 1670, and a sub power supply line SVCCout and a sub ground line SVSSout are provided in correspondence to the data input/output system 1700. A sub power supply line SVCCPII and a sub ground line SVSSpII (not shown in FIG. 34) are provided in correspondence to the input/output control system 1800, as shown in FIG. 31.

A plurality of P-channel MOS transistors 3001 to 3006 and a plurality of N-channel MOS transistors 3011 to 3016 are provided in correspondence to the input system 1200, the center system 1300, the intermediate system 1400, the row systems 1500 to 1570, the column systems 1600 to 1670 and the data input/output system 1700. The transistor 3001 is connected between the main power supply line MVCC and the sub power supply line SVCCin, and has a gate receiving the control signal /PPUctr. The transistor 3011 is connected between the main ground line MVSS and the sub ground line SVSSin, and has a gate receiving the control signal PPUctr. When the input system 1200 is in the active state, the control signal /PPUctr goes low while the control signal PPUctr goes high. Therefore, the transistors 3001 and 3011 are turned on when the input system 1200 enters the active state, and turned off when the input system 1200 enters the standby state.

The transistor 3002 is connected between the main power supply line MVCC and the sub power supply line SVCCc, and has a gate receiving the control signal /RF. The transistor 3012 is connected between the main ground line MVSS and the sub ground line SVSSc, and has a gate receiving the control signal RF. When the center system 1300 is in the active state, the control signal /RF goes low while the control signal RF goes high. When the center system 1300 is in the standby state, the control signal /RF goes high while the control signal RF goes low. Therefore, the transistors 3002 and 3012 are turned on when the center system 1300 enters the active state, and turned off when the center system 1300 enters the standby state.

The transistor 3003 is connected between the main power supply line MVCC and the sub power supply line SVCCm, and has a gate receiving the control signal /RF. The transistor 3013 is connected between the main ground line MVSS and the sub ground line SVSSin, and has a gate receiving the control signal RF. When the intermediate system 1400 is in the active state, the control signal /RF goes low while the control signal RF goes high. When the intermediate system 1400 is in the standby state, the control signal /RF goes high while the control signal RF goes low. Therefore, the transistors 3003 and 3013 are turned on when the intermediate system 1400 enters the active state, and turned off when the intermediate system 1400 enters the standby state.

The transistor 3004 is connected between the main power supply line MVCC and the sub power supply line SVCCBi, and has a gate receiving the control signal /FLAG. The transistor 3014 is connected between the main ground line MVSS and the sub ground line SVSSBi, and has a gate receiving the control signal FLAG. When the row systems 1500 to 1570 are in the active states, the control signal /FLAG goes low while the control signal FLAG goes high. When the row systems 1500 to 1570 are in the standby states, the control signal /FLAG goes high while the control signal FLAG goes low. Therefore, the transistors 3004 and 3014 are turned on when the row systems 1500 to 1570 enter the active states, and turned off when the row systems 1500 to 1570 enter the standby states.

The transistor 3005 is connected between the main power supply line MVCC and the sub power supply line SVCCCi, and has a gate receiving the control signal /CPL. The transistor 3015 is connected between the main ground line MVSS and the sub ground line SVSSCi, and has a gate receiving the control signal CPL. When the column systems 1600 to 1670 are in the active states, the control signal /CPL goes low while the control signal CPL goes high. When the column systems 1600 to 1670 are in the standby states, the control signal /CPL goes high while the control signal CPL goes low. Therefore, the transistors 3005 and 3015 are turned on when the column systems 1600 to 1670 enter the active states, and turned off when the column systems 1600 to 1670 enter the standby states.

The transistor 3006 is connected between the main power-supply line MVCC and the sub power supply line SVCCout, and has a gate receiving the control signal /CF. The transistor 3016 is connected between the main ground line MVSS and the sub ground line SVSSout, and has a gate receiving the control signal CF. When the data input system 1700 is in the active state, the control signal /CF goes low while the control signal CF goes high. When the data input system 1700 is in the standby state, the control signal /CF goes high while the control signal CF goes low. Therefore, the transistors 3006 and 3016 are turned on when the data input system 1700 enters the active state, and turned off when the data input system 1700 enters the standby state.

In the SDRAM 1000, further, diodes 3022 and 3032 are provided in correspondence to the center system 1300, with further provision of a P-channel MOS transistor 3042 and an N-channel MOS transistor 3052. Diodes 3023 and 3033 are provided in correspondence to the intermediate system 1400, with further provision of a P-channel MOS transistor 3043 and an N-channel MOS transistor 3053. Diodes 3024 and 3034 are provided in correspondence to the row systems 1500 to 1570, with further provision of a P-channel MOS transistor 3044 and an N-channel MOS transistor 3054. Diodes 3025 and 3035 are provided in correspondence to the column systems 1600 to 1670, with further provision of a P-channel MOS transistor 3045 and an N-channel MOS transistor 3055.

The diode 3022 is forwardly connected between the main power supply line MVCC and the sub power supply line SVCCc, while the diode 3032 is forwardly connected between the main ground line MVSS and the sub ground line SVSSc. The transistor 3042 is serially connected with the diode 3022, and has a gate receiving the control signal /PPUctr. The transistor 3052 is serially connected with the diode 3032, and has a gate receiving the control signal PPUctr. As described later, the control signal /PPUctr goes low and the control signal PPUctr goes high before the center system 1300 enters the active state. Therefore, the transistors 3042 and 3052 are turned on before the center system 1300 enters the active state.

The diode 3023 is forwardly connected between the main power supply line MVCC and the sub power supply line SVCCm. The diode 3033 is forwardly connected between the main ground line MVSS and the sub ground line SVSSm. The transistor 3043 is serially connected with the diode 3023, and has a gate receiving the control signal /PPUctr. The transistor 3053 is serially connected with the diode 3033, and has a gate receiving the control signal PPUctr. As described later, the control signal /PPUctr goes low and the control signal PPUctr goes high before the intermediate system 1400 enters the active state. Therefore, the transistors 3043 and 3053 are turned on before the intermediate system 1400 enters the active state.

The diode 3024 is forwardly connected between the main power supply line MVCC and the sub power supply line SVCCBi. The diode 3034 is forwardly connected between the main ground line MVSS and the sub ground line SVSSBi. The transistor 3044 is serially connected with the diode 3024, and has a gate receiving the control signal /RF. The transistor 3054 is serially connected with the diode 3034, and has a gate receiving the control signal RF. As described later, the control signal /RF goes low and the control signal RF goes high before the row systems 1500 to 1570 enter the active states. Therefore, the transistors 3044 and 3054 are turned on before the row systems 1500 to 1570 enter the active states.

The diode 3025 is forwardly connected between the main power supply line MVCC and the sub power supply line SVCCCi. The diode 3035 is forwardly connected between the main ground line MVSS and the sub ground line SVSSCi. The transistor 3045 is serially connected with the diode 3025, and has a gate receiving the control signal /PPU. The transistor 3055 is serially connected with the diode 3035, and has a gate receiving the control signal PPD. As described later, the control signal /PPU goes low and the control signal PPD goes high before the column systems 1600 to 1670 enter the active states. Therefore, the transistors 3045 and 3055 are turned on before the column systems 1600 to 1670 enter the active states.

Each of the diodes 3022 to 3025 and 3032 to 3035 is formed by a P–N junction and has a contact potential difference of about 0.7 V. Therefore, the diode 3022 and the transistor 3042 can precharge the sub power supply line SVCCc at a prescribed voltage (e.g., 0.8 V) lower than the power supply voltage VCC (e.g., 1.5 V) and higher than the ground voltage VSS (e.g., 0 V) before the center system 1300 enters the active state. The remaining diodes 3023 to 3025 and transistors 3043 to 3045 have similar functions. The diode 3032 and the transistor 3052 can precharge the sub ground line SVSSc at a prescribed voltage (e.g., 0.7 V) lower than the power supply voltage VCC (e.g., 1.5 V) and lower than the ground voltage VSS (e.g., 0 V) before the center system 1300 enters the active state. The remaining diodes 3033 to 3035 and transistors 3053 to 3055 have similar functions.

Figure 35:
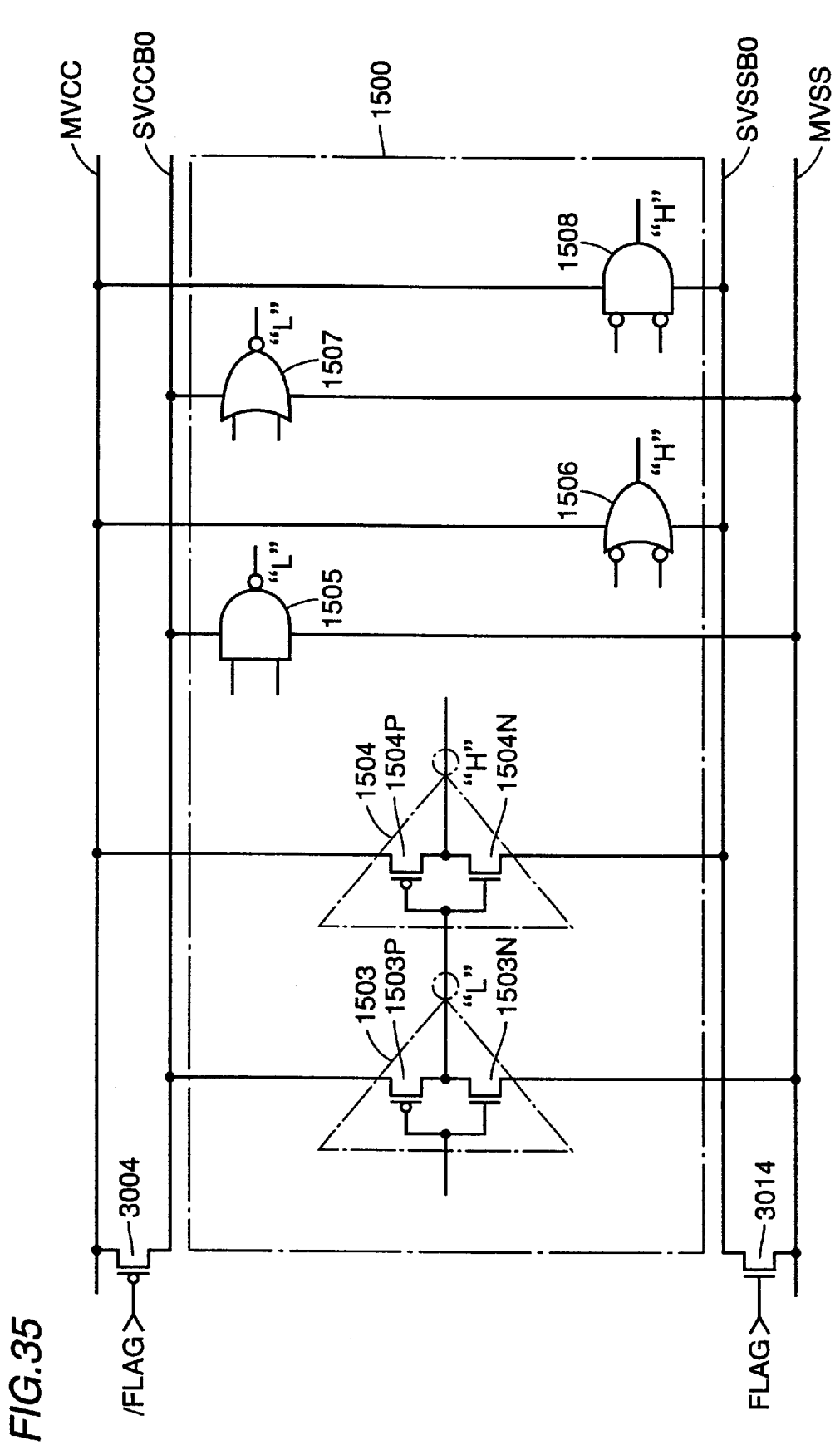
FIG. 35 is a circuit diagram showing a logic circuit included in a row system of the bank #0 shown in FIG. 32.

All row control circuits 1502 to 1572 and row decoders 1501 to 1571 included in the row systems 1500 to 1570 have well-known identical structures. As shown in FIG. 35, therefore, the row system 1500, for example, is formed by connection of a number of logic circuits such as invertor circuits 1503 and 1504, NAND circuits 1505 and 1506, NOR circuits 1507 and 1508 and the like. The invertor circuit 1503 includes a P-channel MOS transistor 1503P and an N-channel MOS transistor 1503N. When the row system 1500 is in the active state, the invertor circuit 1503 supplies a low- or high-level output signal in response to a high- or low-level input signal. When the row system 1500 is in the standby state, the invertor circuit 1503 regularly receives a high-level input signal. Therefore, the invertor circuit 1503 regularly supplies a low-level output signal in response to the high-level input signal. A power supply terminal of the invertor 1503 is connected to the sub power supply line SVCCBO, while a ground terminal thereof is connected to the main ground line MVSS. The transistors 3004 and 3014 are turned on when the row system 1500 is in the active state as described above, and hence the invertor circuit 1503 can supply the power supply voltage VCC as the high-level output signal or the ground potential VSS as the low-level output signal. While the transistors 3004 and 3014 are turned off when the row system 1500 is in the active state, the invertor circuit 1503 having the ground terminal connected to the main ground line MVSS can regularly supply the ground voltage VSS as the low-level output signal. Further, the power supply terminal of the invertor circuit 1503 is connected to the sub power supply line SVCCBO disconnected from the main power supply line MVCC, and hence a subthreshold current flowing in the transistor 1503P is suppressed.

The invertor circuit 1504 includes a P-channel MOS transistor 1504P and an N-channel MOS transistor 1504N. The invertor circuit 1504 supplies a low- or high-level output signal in response to a high- or low-level input signal when the row system 1500 is in the active state. When the row system 1500 is in the standby state, on the other hand, the invertor circuit 1504 regularly supplies a high-level output signal in response to a low-level input signal. A power supply terminal of the invertor circuit 1504 is connected to the main power supply line MVCC, while a ground terminal thereof is connected to the sub ground line SVSSBO. The transistors 3004 and 3014 are turned on when the row system 1500 is in the active state, and hence the invertor circuit 1504 can supply the power supply voltage VCC as the high-level output signal or the ground voltage VSS as the low-level signal. While the transistors 3004 and 3014 are turned on when the row system 1500 is in the standby state, the invertor circuit 1504 having the power supply terminal connected to the main power supply line MVCC can regularly supply the power supply voltage VCC as the high-level output signal. The ground terminal of the invertor circuit 1504 is connected to the sub ground line SVSSBO disconnected from the main ground line MVSS, and hence a subthreshold current flowing in the transistor 1504N is suppressed.

Similarly, the NAND circuit 1505 and the NOR circuit 1507 supplying low-level output signals when the row system 1500 is in the standby state are connected to the sub power supply line SVCCBO and the main ground line MVSS. The NAND circuit (negative logic) 1506 and the NOR circuit (negative logic) 1508 supplying high-level output signals when the row system 1500 is in the standby state are connected to the main power supply line MVCC and the sub ground line SVSSBO. Therefore, subthreshold currents flowing in the logic circuits 1505 to 1508 are suppressed when the row system 1500 is in the standby state.

The internal circuit groups of the remaining input system 1200, center system 1300, intermediate system 1400, column systems 1600 to 1670 and data input/output system 1700 also include a number of organically connected logic circuits, and logic circuits supplying low-level output signals in the standby state are connected to the sub power supply lines SVCCin, SVCCm, SVCCCi and SVCCout and the main ground line MVSS, while those supplying high-level output signals in the standby state are connected to the main power supply line MVCC and the sub ground lines SVSSin, SVSSc, SVSSm, SVSSci and SVSSout.

Figure 36:
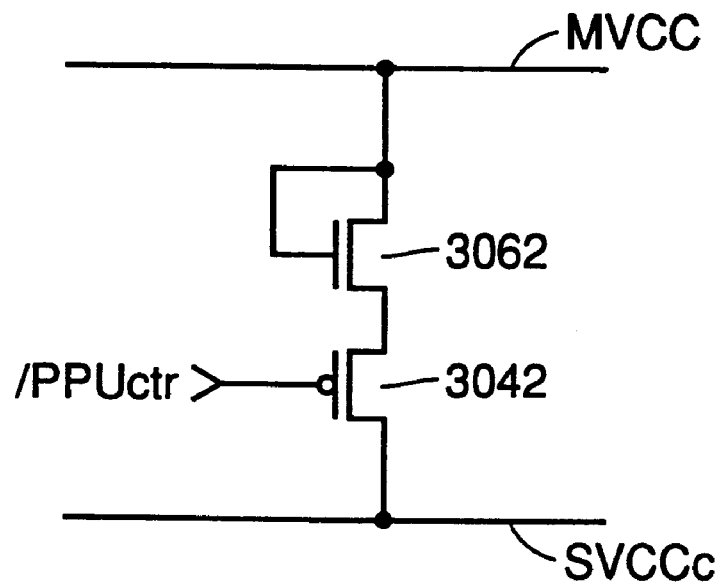
FIG. 36 is a circuit diagram showing an N-channel MOS transistor substituting for a power supply side diode shown in FIG. 34.
Figure 37:
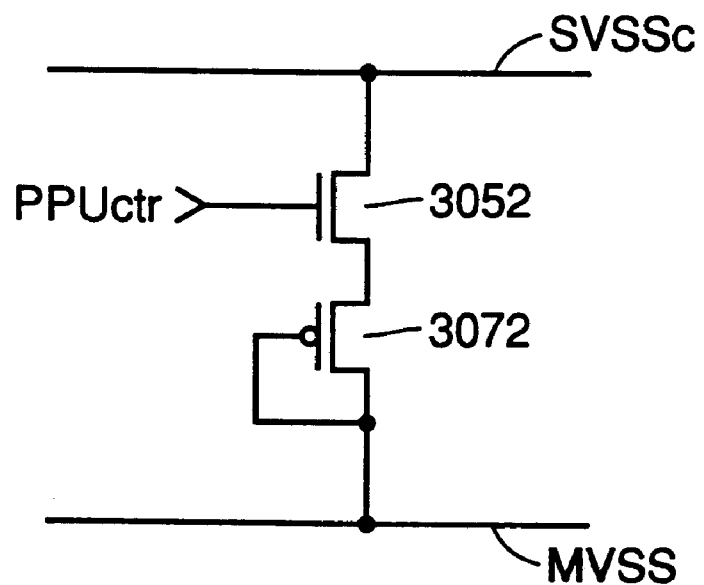
FIG. 37 is a circuit diagram showing an N-channel MOS transistor substituting for a grounded side diode shown in FIG. 34.

When the power supply voltage VCC is at a relatively low level of 1.5 V, for example, diode-connected MOS transistors having low threshold values can be employed in place of the diodes 3022 to 3025 and 3032 to 3035. In more concrete terms, a diode-connected N-channel MOS transistor 3062 is serially connected with the transistor 3042, as representatively shown in FIG. 36. The gate and the drain of the transistor 3062 are connected with each other. Further, a diode-connected P-channel MOS transistor 3072 is serially connected with the transistor 3052, as representatively shown in FIG. 37. The gate and the drain of the transistor 3072 are connected with each other. While the threshold values of MOS transistors are generally controllable, the transistors 3062 and 3042 can precharge the sub power supply line SVCCc at 4.0 V when the power supply voltage VCC is 1.5 V, assuming that the threshold values of the transistors 3062 and 3072 are set at 0.1 V. Further, the transistors 3072 and 3052 can precharge the sub ground line SVSSc at 0.1 V.

The diodes 3022 to 3025, which are connected between the main power supply line MVCC and the transistors 3042 to 3045 in the above description, may alternatively be connected between the transistors 3042 to 3045 and the sub power supply lines SVCCc, SVCCm, SVCCBi and SVCCCi respectively. Similarly, the diodes 3032 to 3035 may be connected between the sub ground lines SVSSc, SVSSm, SVSSBi and SVSSCi and the transistors 3052 to 3055 respectively. Further similarly, the transistor 3062 shown in FIG. 35 may be connected between the transistor 3042 and the sub power supply line SVCCc, and the transistor 3072 shown in FIG. 37 may be connected between the sub ground line SVSSc and the transistor 3052.

Figure 38:
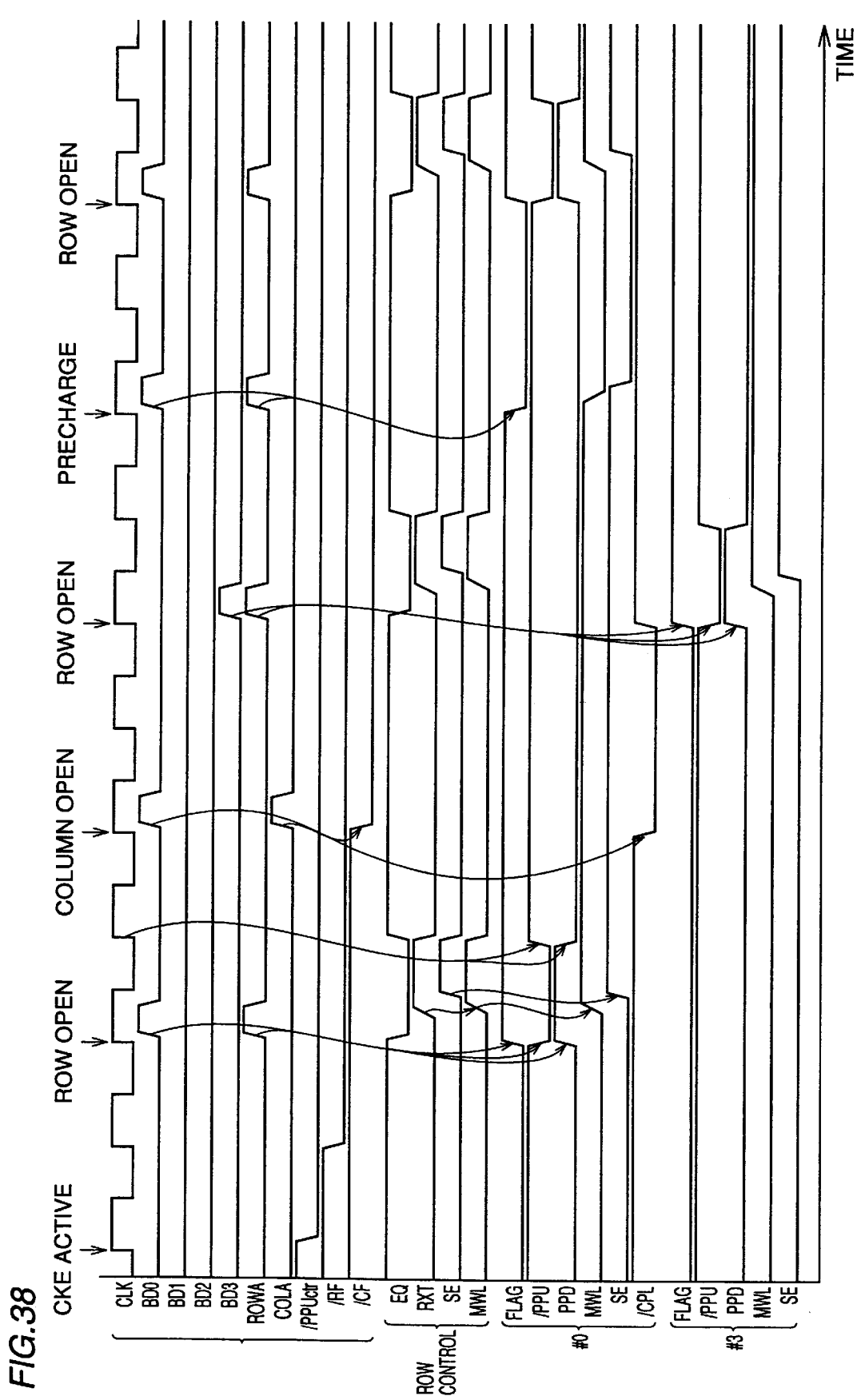
FIG. 38 is a timing chart showing operations of the SDRAM having a split hierarchical power supply structure shown in FIG. 34.

Operations of the SDRAM 1000 having the aforementioned structure are now described with reference to a timing chart shown in FIG. 38.

When the clock enable signal CKE goes high, the buffers 1204 to 1209 are rendered operable and hence the SDRAM 1000 can be accessed. Thus, the internal clock signals Int.CLK and /Int.CLK are generated in response to the external clock signals CLK and /CLK, and the control signal /PPUctr first goes low. The transistor 3001 shown in FIG. 34 is turned on in response to the low-level control signal /PPUctr, and the transistor 3011 is turned on in response to the high-level control signal PPUctr. Thus, the input system 1200 first enters the active state.

The control signals /PPUctr and PPUctr are also supplied to the gates of the transistors 3042 and 3052 shown in FIG. 34, for also turning on the transistors 3042 and 3052. While the transistors 3002 and 3012 are in OFF states at this time since the control signal /RF is at a high level and the control signal RF is at a low level, the diode 3022 and the transistor 3042 precharge (pre-pull up) the sub power supply line SVCCc at a prescribed voltage lower than the power supply voltage VCC by a contact potential difference of the diode 3022. Further, the diode 3032 and the transistor 3052 precharge (pre-pull up) the sub ground line SVSSc at a prescribed voltage higher than the power supply voltage VCC by a contact potential difference of the diode 3032. While the center system 1300 is still in the standby state at this time, the sub power supply line SVCCC and the sub ground line SVSSc are preliminarily precharged. The control signals /PPUctr and PPUctr are supplied also to the gates of the transistors 3043 and 3053 corresponding to the intermediate system 1400, whereby the sub power supply line SVCCm and the sub ground line SVSSm corresponding to the intermediate system 1400 are also preliminarily precharged similarly to those of the center system 1300.

Then, the center system 1300 enters the active state in response to a signal from the input system 1200, and hence the control signal /RF goes low. The transistor 3002 corresponding to the center system 1300 is turned on in response to the low-level control signal /RF and the transistor 3012 corresponding to the center system 1300 is turned on in response to the high-level control signal RF, whereby the sub power supply line SVCCc is shorted to the main power supply line MVCC and the sub ground line SVSSc is shorted to the main ground line MVSS. The control signals /RF and RF are supplied also to the gates of the transistors 3003 and 3013 corresponding to the intermediate system 1400, and hence the sub power supply line SVCCm and the sub ground line SVSSm corresponding to the intermediate system 1400 are also shorted to the main power supply line MVCC and the main ground line MVSS respectively. The sub power supply line SVCCc and the sub ground line SVSSc are already preliminarily precharged at the prescribed voltages before the center system 1300 enters the active state as described above, and hence the sub power supply line SVCCc and the sub ground line SVSSc quickly reach the power supply voltage VCC and the ground voltage VSS respectively when the center system 1300 enters the active state. Therefore, the internal circuits of the center system 1300 can immediately start operations.

While the intermediate system 1400, operating in response to a signal from the center system 1300, enters the active state subsequently to the center system 1300, the internal circuits of the intermediate system 1400 can also immediately start operations since the sub power supply line SVCCm and the sub ground line SVSSm corresponding to the intermediate system 1400 are also preliminarily precharged before the intermediate system 1400 enters the active state.

The control signals /RF and RF are supplied also to the gates of the transistors 3044 and 3054 corresponding to the row systems 1500 to 1570, and hence the transistors 3044 and 3054 are turned on when the center system 1300 and the intermediate system 1400 are in the active states. While the transistors 3004 and 3014 are in OFF states at this time since the control signal /FLAG is at a high level and the control signal FLAG is at a low level, the sub power supply line SVCCBi and the sub ground line SVSSBi are precharged at prescribed voltages.

The row systems 1500 to 1570, operating in response to a signal from the intermediate system 1400, enter the active states subsequently to the intermediate system 1400. Among the bank decode signals BD0 to BD7, the bank decode signal BD0 goes high for selecting the bank #0. At the same time, the control signal ROWA for activating the row systems 1500 to 1570 goes high. In the selected bank #0, an equalization signal EQ goes low for completing equalization of the pair of bit lines BL and /BL by an equalization circuit (not shown). Then, a word line driving signal RXT is supplied to a word line driver (not shown but included in the row decoder 1501) selected in response to the row predecode signal from the row predecoder 1401. Thus, the word line driver drives the corresponding word line WL to raise the voltage MWL thereof. In response to this, a data signal is read on the pair of bit lines BL and /BL from the memory cell MC connected to the word line WL, and then a sense amplifier enable signal SE goes high. Thus, the sense amplifier SA amplifies the data signal read on the pair of bit lines BL and /BL.

Simultaneously with activation of the row system 1500, the control signal /FLAG goes low and the control signal FLAG goes high in the bank #0. Therefore, the transistors 3004 and 3014 corresponding to the row system 1500 are turned on for connecting the sub power supply line SVCCBi and the sub ground line SVSSBi to the main power supply line MVCC and the main ground line MVSS respectively. The sub power supply line SVCCB0 and the sub ground line SVSSB0 are preliminarily precharged before the row system 1500 enters the active state, and hence the voltages of the sub power supply line SVCCB0 and the sub ground line SVSSB0 immediately reach the power supply voltage VCC and the ground voltage VSS respectively when the transistors 3004 and 3014 are turned on. Therefore, the row decoders 1501 and 1502 included in the row system 1500 can immediately start operations. When the bank decode signal BD0 and the control signal ROWA go high, the control signal /PPU goes low and the control signal PPD goes high. Therefore, the transistors 3045 and 3055 corresponding to the column system 1600 of the bank #0 are turned on for preliminarily precharging the sub power supply line SVCCC0 and the sub ground line SVSSC0.

Then, the bank decode signal BD0 and the signal COLA indicating activation of the column system 1600 go high and the control signals /CF and /CPL go high in response thereto. Therefore, the control signals CF and CPL complementary therewith go high. The transistor 3005 corresponding to the column system 1600 is turned on in response to the low-level control signal /CPL and the transistor 3015 is turned on in response to the high-level control signal CPL. Consequently, the sub power supply line SVCCC0 and the sub ground line SVSSC0 are shorted to the main power supply line MVCC and the main ground line MVSS respectively. At the same time, the transistor 3006 corresponding to the data input/output system 1700 is turned on in response to the low-level control signal /CF and the transistor 3016 is turned on in response to the high-level control signal CF.

Consequently, the sub power supply line SVCCout and the sub ground line SVSSout corresponding to the data input/output system 1700 are shorted to the main power supply line MVCC and the main ground line MVSS respectively.

At this time, the voltages of the sub power supply line SVCCC0 and the sub ground line SVSSC0 corresponding to the column system 1600, precharged before the column system 1600 enters the active state, immediately reach the power supply voltage VCC and the ground voltage VSS respectively when the transistors 3005 and 3015 are turned on. Therefore, the column decoder 1601, the column control circuit 1602 and the I/O port 1603 included in the column system 1600 can immediately start operations.

Then, a bank decode signal BD3 and the control signal ROWA indicating activation of the row system go high, whereby the bank #3 is selected so that the circuits included in the bank #3 operate similarly to those included in the bank #0. When the control signal FLAG goes high, the sub power supply line and the sub ground line corresponding to the row system of the bank #3 are shorted to the main power supply line MVCC and the main ground line MVSS respectively. At this time, the row decoder and the row control circuit included in the row system can immediately start operations since the sub power supply line and the sub ground line are already precharged.

The control signal /PPU goes low and the control signal PPD goes high at the same time, whereby the sub power supply line and the sub ground line corresponding to the column system of the bank #3 are preliminarily precharged.

Then, the mode decoder 1226 outputs the control signal PC indicating a precharge operation while the bank decode signal BD0 and the control signal ROWA indicating activation of the row system go high, whereby the pair of bit lines BL and /BL are precharged in the bank #0 for ending the read operation of the bank #0. The control signal FLAG goes low in the bank #0 at this time, whereby the transistors 3004 and 3014 corresponding to the row system 1500 of the bank #0 are turned off for disconnecting the sub power supply line SVCCB0 and the sub ground line SVSSB0 from the main power supply line MVCC and the main ground line MVSS respectively.

While the control signals /PPU and PPD are activated only for a prescribed period before activation of the control signal /CPL in the embodiment 12, the sub power supply line SVCCCi and the sub ground line SVSSCi corresponding to the column systems 1600 to 1670 are sufficiently precharged during this prescribed period. Therefore, no excessive power is consumed for precharging the sub power supply line SVCCCi and the sub ground line SVSSCi.

Precharging of the sub power supply line SVCCCi and the sub ground line SVSSCi corresponding to the column systems 1600 to 1670 is started on the leading edge of the external clock signal CLK for activating the row systems 1500 to 1570, while the precharging is ended on the next leading edge of the external clock signal CLK.

In the embodiment 12, the sub power supply line SVCCin and the sub ground line SVSSin corresponding to the input system 1200 are not preliminarily precharged since the sub power supply line SVCCin and the sub ground line SVSSin are immediately shorted to the main power supply line MVCC and the main ground line MVSS respectively in response to the external clock enable signal CLK. Further, the sub power supply line SVCCout and the sub ground line SVSSout corresponding to the data input/output system 1700 are not preliminarily precharged. This is because the data input/output system 1700 finally enters the active state in the read operation and the voltages of the sub power supply line SVCCout and the sub ground line SVSSout sufficiently reach the power supply voltage VCC and the ground voltage VSS respectively before the data input/ output system 1700 starts outputting the data signal if the sub power supply line SVCCout and the sub ground line SVSSout are shorted to the main power supply line MVCC and the main ground line MVSS respectively in activation of the column systems 1600 to 1670.

According to the embodiment 12, as hereinabove described, precharging of the corresponding sub power supply line and sub ground line is started and ended before each of the center system 1300, the intermediate system 1400, the row systems 1500 to 1570 and the column systems 1600 to 1670 enters the active state, whereby the internal circuits of each system can start operations when entering the active state. Consequently, neither operation delay nor malfunction takes place while power consumption necessary for the precharging is suppressed.

Further, the sub power supply lines SVCCc, SVCCm, SVCCBi, SVCCCi and SVCCout, which are precharged at the voltages lower than the power supply voltage VCC by the contact potentials of the diodes 3022 to 3025, can be precharged to voltages slightly lower than the power supply voltage VCC even if the power supply voltage VCC is at a low level, so that the voltages of the sub power supply lines SVCCc, SVCCm, SVCCBi, SVCCCi and SVCCout can more quickly reach the power supply voltage VCC. The sub ground lines SVSSc, SVSSm, SVSSBi, SVSSCi and SVSSout, which are precharged at the potentials higher than the ground voltage VSS by the contact potential differences of the diodes 3032 to 3035, can more quickly reach the ground voltage VSS similarly to the above.

While the sub power supply lines and the sub ground lines are provided on both sides of the power supply and the ground in the embodiment 12, the sub power supply lines and the sub ground lines may alternatively be provided only on the power supply or ground side.

Embodiment 13

Figure 39:
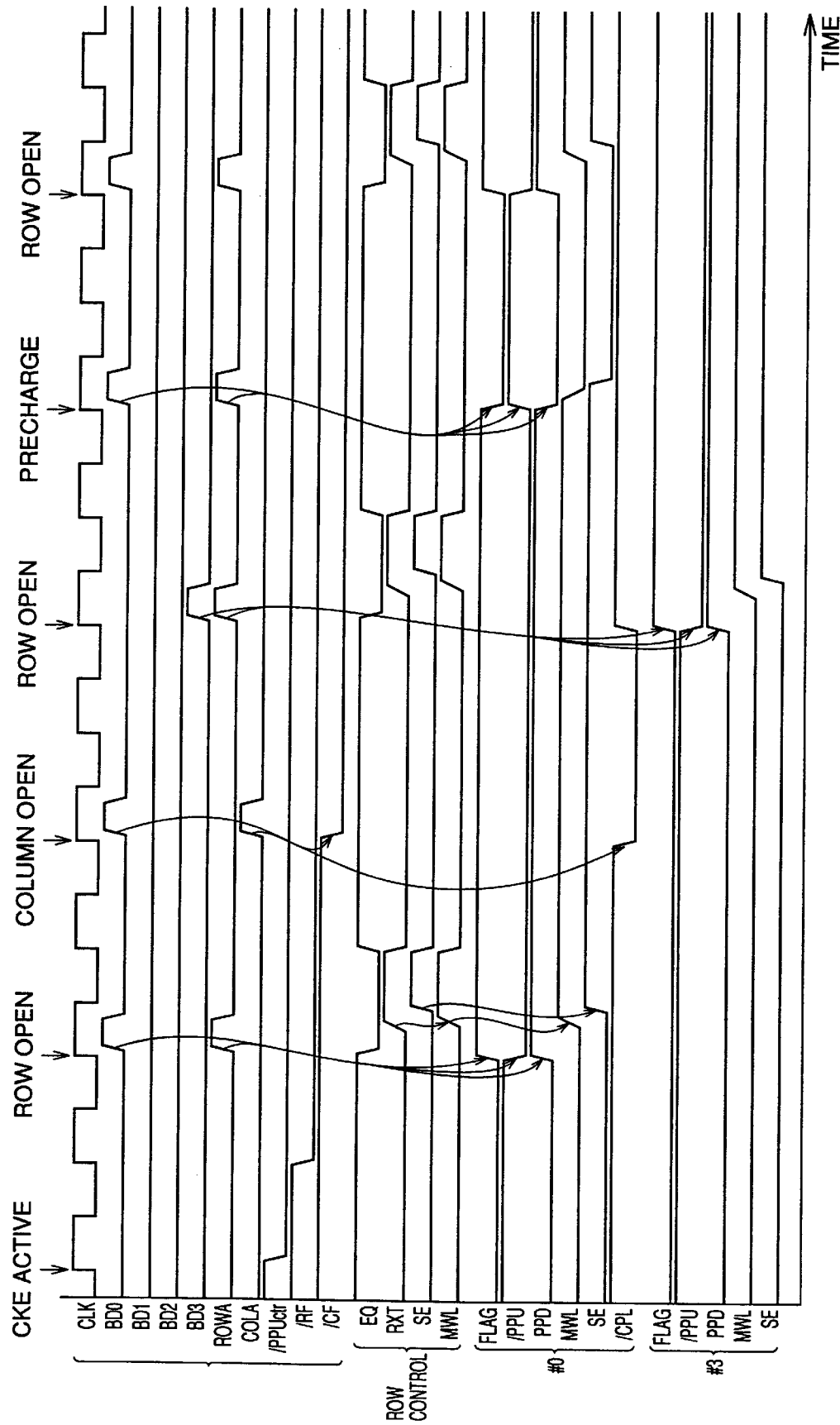
FIG. 39 is a timing chart showing operations of an SDRAM according to an embodiment 13 of the present invention.

While precharging of the sub power supply line and the sub ground line is started and ended before the column systems 1600 to 1670 enter the active states in the embodiment 12, precharging of a sub power supply line and a sub ground line is started before column systems 1600 to 1670 enter active states and continued during the active periods of the column systems 1600 to 1670 in an embodiment 13 of the present invention. As shown in FIG. 39, a control signal /PPU goes low at the same timing as that in FIG. 37, while this control signal /PPU goes high in a precharge operation for a pair of bit lines for ending a series of read operations. A control signal PPD, which is an inverted signal of the control signal /PPU, goes high when the control signal /PPU goes low, and goes low when the control signal /PPU goes high.

Therefore, precharging of corresponding sub power supply line SVCCCi and sub ground line SVSSCi is started before the column systems 1600 to 1670 enter active states and the sub power supply line SVCCCi and the sub ground line SVSSCi are continuously charged while the column systems 1600 to 1670 are in the active states, i.e., while a control signal /CPL is t a high level.

According to the embodiment 13, as hereinabove described, the sub power supply line SVCCCi and the sub ground line SVSSCi are continuously charged while the column systems 1600 to 1670 are in the active states, for supplying power to the column systems 1600 to 1670 with compensation for transistors 3005 and 3015.

Embodiment 14

Figure 40:
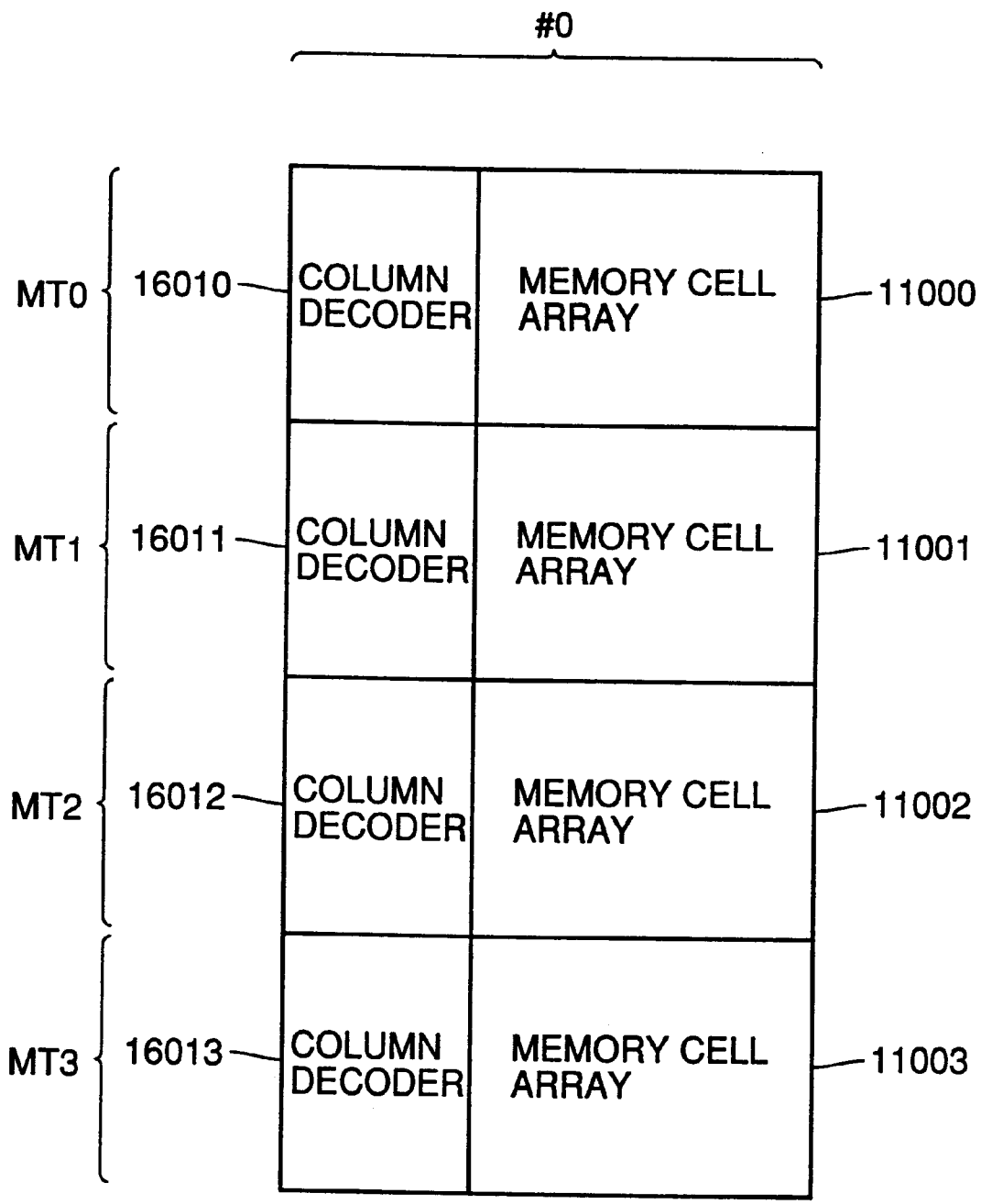
FIG. 40 is a block diagram showing the structure of a column system of a bank #0 in an SDRAM according to an embodiment 14 of the present invention.

In an SDRAM according to an embodiment 14 of the present invention, a column decoder and a memory cell array of each bank are split into a plurality of mats. A column decoder 1601 and a memory cell array 1100 of a bank #0 similar to that shown in FIG. 32 are split into four mats MT0 to MT3, as representatively shown in FIG. 40. A column decoder 16010 of the mat MT0 selectively drives a column selection line in a memory cell array 11000 of the mat MT0. A column decoder 16011 of the mat MT1 selectively drives a column selection line in a memory cell array 11001 of the mat MT1. A column decoder 16012 of the mat MT2 selectively drives a column selection line in a memory cell array 11002 of the mat MT2. A column decoder 16013 of the mat MT3 selectively drives a column selection line in a memory cell array 11003 of the mat MT3. The remaining banks similar to those shown in FIG. 32 are similar in structure to the bank #0.

While the sub power supply line SVCCCi and the sub ground line SVSSCi corresponding to the column systems 1600 to 1670 are provided for each bank in the embodiment 12, a sub power supply line and a sub ground line provided for each bank are split for each mat in the embodiment 14.

Figure 41:
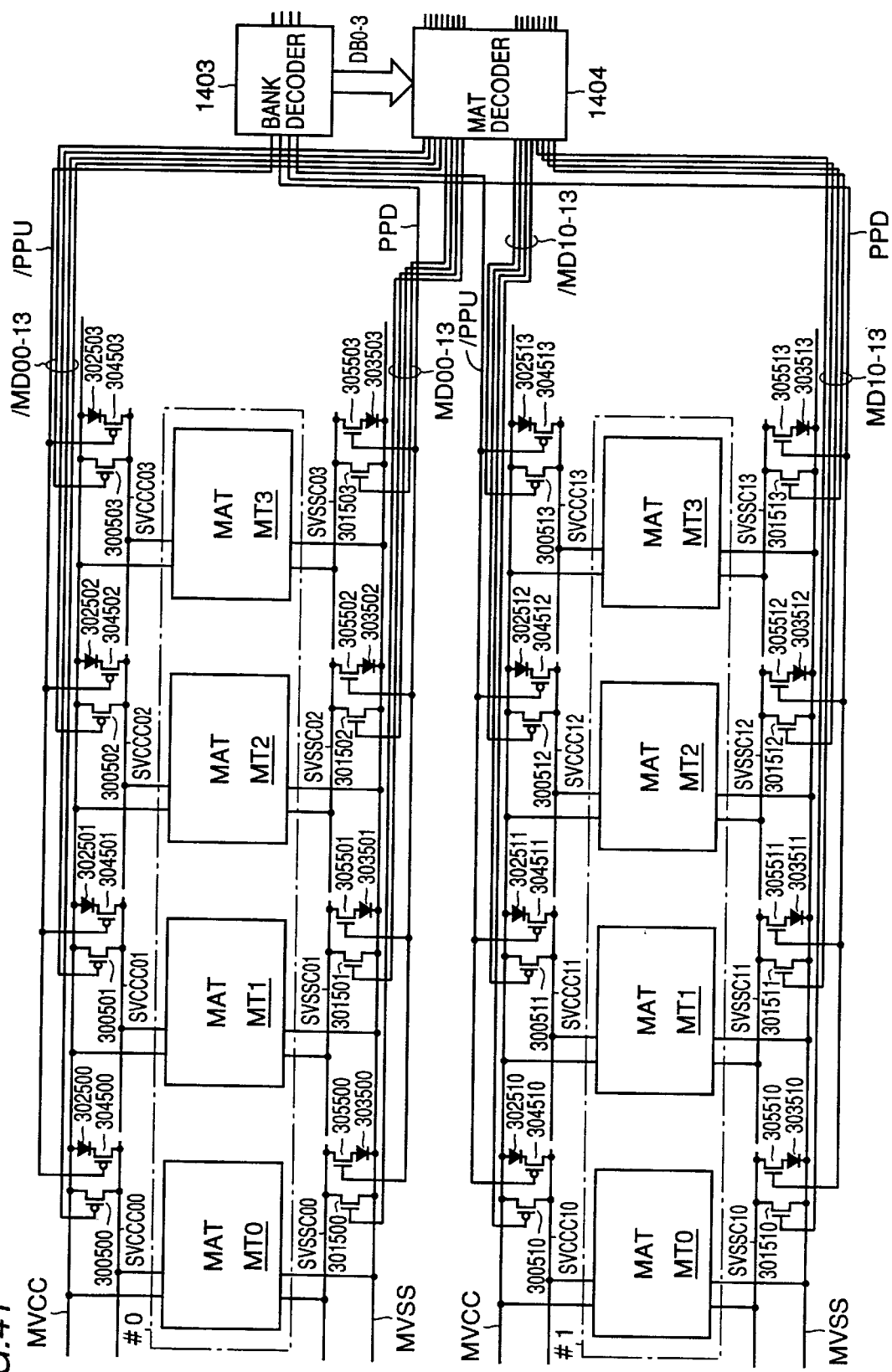
FIG. 41 is a block diagram showing the structure (left half) of the SDRAM having a column decoder split into mats as shown in FIG. 40.
Figure 42:
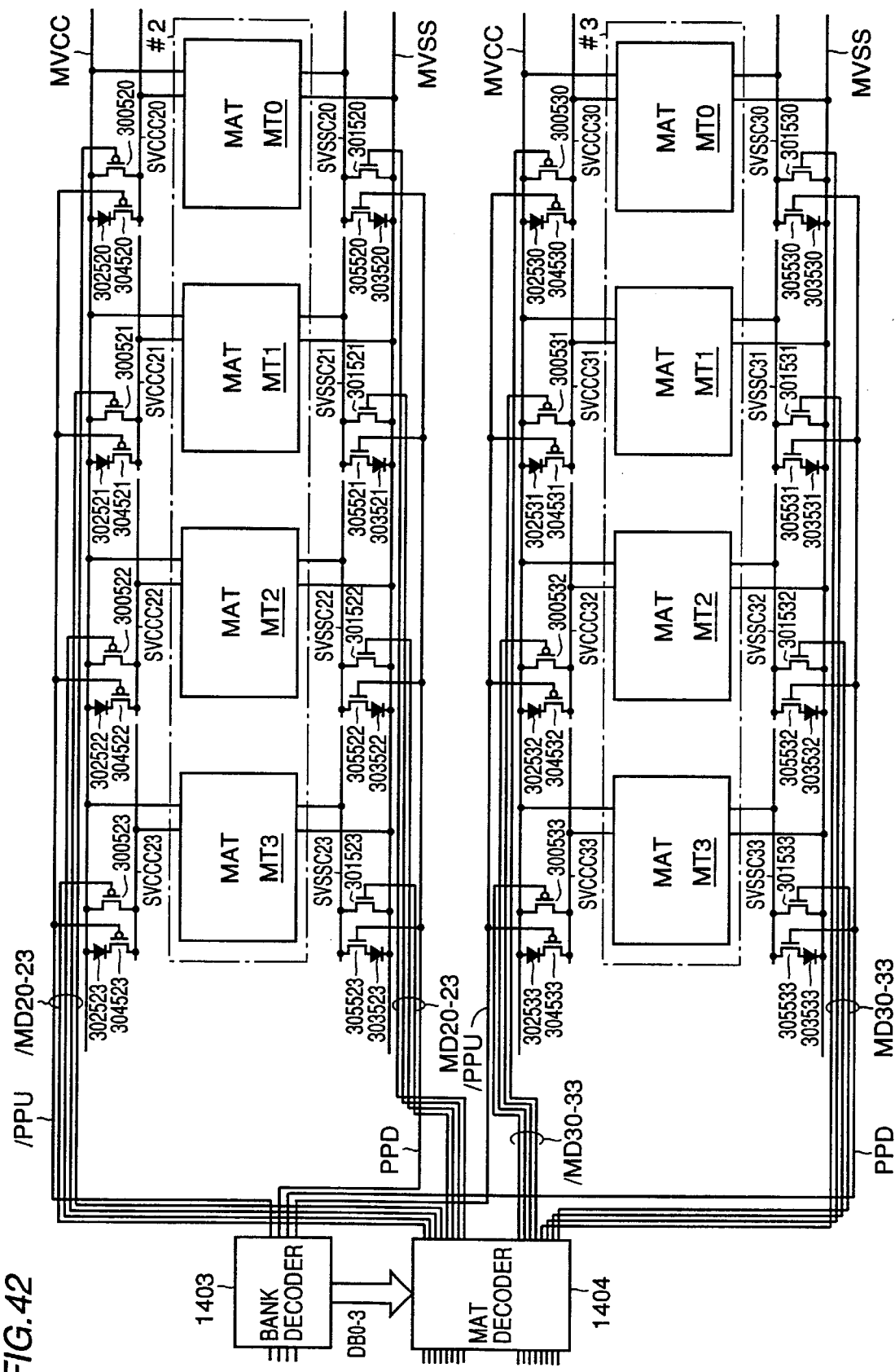
FIG. 42 is a block diagram showing the structure (right half) of the SDRAM having the column decoder split into mats as shown in FIG. 40.

As shown in FIGS. 41 and 42, sub power supply lines SVCCC00 to SVCCC03 and sub ground lines SVSSC00 to SVSSC03 are provided in correspondence to the mats MT0 to MT3 in the bank #0. Sub power supply lines SVCCC10 to SVCCC13 and sub ground lines SVSSC10 to SVSSC13 are provided in correspondence to the mats MT0 to MT3 in the bank #1. Sub power supply lines SVCCC20 to SVCCC23 and sub ground lines SVSSC20 to SVSSC23 are provided in correspondence to the mats MT0 to MT3 in the bank #2. Sub power supply lines SVCCC30 to;

SVCCC33 and sub ground lines SVSSC30 to SVSSC33 are provided in correspondence to the mats MT0 to MT3 in the bank #3.

This SDRAM is further provided with a mat decoder 1404 decoding bank decode signals BD0 to BD3 from a bank decoder 1403 and generating mat decode signals MD00 to MD03, /MD00 to /MD03, MD10 to MD13, /MD10 to /MD13, MD20 to MD23, /MD20 to /MD23, MD30 to MD33 and /MD30 to /MD33.

The sub power supply lines and the sub ground lines are split for each mat as described above, and hence P-channel MOS transistors 300500 to 300503 are provided in the bank #0 in correspondence to the mats MT0 to MT3 respectively. The transistors 300500 to 300503 are connected between a main power supply line MVCC and the sub power supply lines SVCCC00 to SVCCC03 respectively, and have gates receiving the mat decode signals /MD00 to /MD03 respectively. Further, N-channel MOS transistors 301500 to 301503 are provided in correspondence to the mats MT0 to MT3 respectively. The transistors 301500 to 301503 are connected between a main ground line MVSS and the sub ground lines SVSSC00 to SVSSCO3 respectively, and have gates receiving the predecode signals MD00 to MD03 respectively.

Also in the bank #1, P-channel MOS transistors 300510 to 300513 iare connected between the main power supply line MVCC and the sub power supply lines SVCCC10 to SVCCC13 respectively, and have gates receiving the mat decode signals /MD10 to /MD13 respectively. Further, N-channel MOS transistors 301510 to 301513 are connected between the main ground line MVSS and the sub ground lines SVSSC10 to SVSSC13 respectively, and have gates receiving the mat decode signals MD 10 to MD13 respectively.

Also in the bank #2, P-channel MOS transistors 300520 to 300523 are connected between the main power supply line MVCC and the sub power supply lines SVCCC20 to SVCCC23 respectively, and have gates receiving the mat decode signals /MD20 to /MD23 respectively. Further, N-channel MOS transistors 301520 to 301523 are connected between the main ground line MVSS and the sub ground lines SVSSC20 to SVSSC23 respectively, and have gates receiving the mat decode signals MD20 to MD23 respectively.

Also in the bank #3, P-channel MOS transistors 300530 to 300533 are connected between the main power supply line MVCC and the sub power supply lines SVCCC30 to SVCCC33 respectively, and have gates receiving the mat decode signals /MD30 to /MD33 respectively. Further, N-channel MOS transistors 301530 to 301533 are connected between the main ground line MVSS and the sub ground lines SVSSC30 to SVSSC33 respectively, and have gates receiving the mat decode signals MD30 to MD33 respectively.

Since the sub power supply lines and the sub ground lines are split for each mat, diodes 302500 to 302503 are provided in correspondence to the mats MT0 to MT3 respectively in the bank #0. The diodes 302500 to 302503 are forwardly connected between the main power supply line MVCC and the sub power supply lines SVCCC00 to SVCCC03 respectively. P-channel MOS transistors 304500 to 304503 are also provided in correspondence to the mats MT0 to MT3 respectively, and serially connected with the diodes 302500 to 302503 respectively. The aforementioned control signal /PPU is supplied in common to the gates of the transistors 304500 to 304503. Similarly, diodes 303500 to 303503 are forwardly connected between the main ground line MVSS and the sub ground lines SVSSC10 to SVSSC03 respectively. N-channel MOS transistors 305500 to 305503 are serially connected with the diodes 303500 to 303503 respectively. The aforementioned control signal PPD is supplied in common to the gates of the transistors 305500 to 305503.

Also in the remaining banks #1 to #3, diodes 302510 to 302513, 303510 to 303513, 302520 to 302523, 303520 to 303523, 302530 to 302533 and 303530 to 303533 are connected. Transistors 304510 to 304513, 305510 to 305513, 304520 to 304523, 305520 to 305523, 304530 to 304533 and 305530 to 305533 are also connected similarly to the above. The control signal /PPU is supplied in common to the gates of the P-channel MOS transistors, and the control signal PPD is supplied in common to the gates of the N-channel MOS transistors.

The bank decoder 1403 independently generates the control signals /PPU and PPD for each bank. Therefore, the control signals /PPU and PPD for an accessed bank are activated for charging the sub power supply lines and discharging the sub ground lines.

In the SDRAM having the aforementioned structure, the mat decoder 1404 selects the mats MT0 to MT3 so that four sub power supply lines and four sub ground lines corresponding to the mats MT0 to MT3 are shorted to the main power supply line MVCC and the main ground line MVSS respectively in response to the control signals /PPU and PPD generated for decoding a bank address before the sub power supply lines and the sub ground lines corresponding to the selected mats MT0 to MT3 are connected to the main power supply line MVCC and the main ground line MVSS respectively. Before the column decoders 16010 to 16013 of the mats MT0 to MT3 enter active states, therefore, the corresponding sub power supply lines and sub ground lines are so preliminarily precharged that neither operation delay nor malfunction takes place in the column decoders 16010 to 16013.

Embodiment 15

Figure 43:
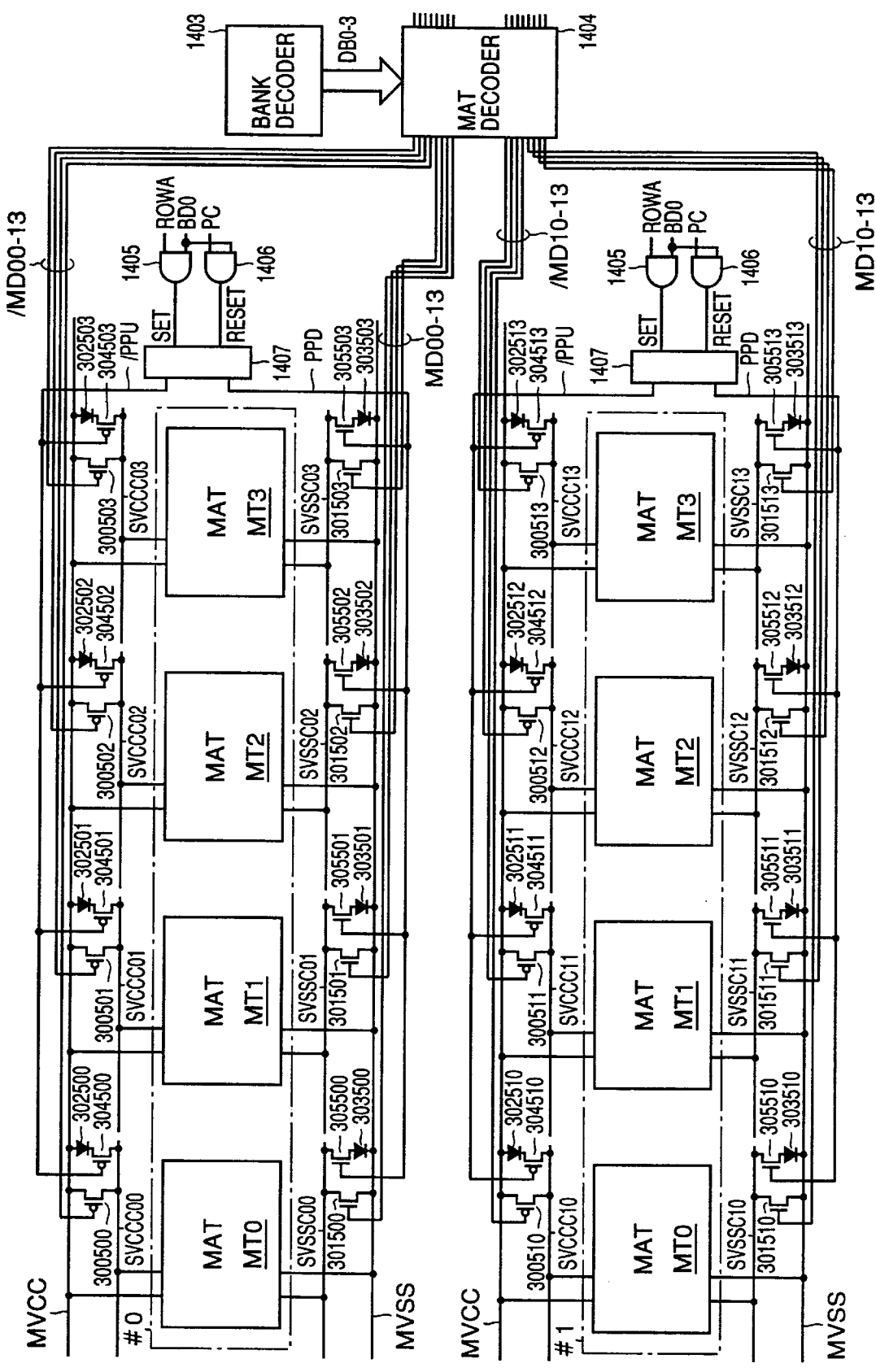
FIG. 43 is a block diagram showing the structure (left half) of an SDRAM according to an embodiment 15 of the present invention.
Figure 44:
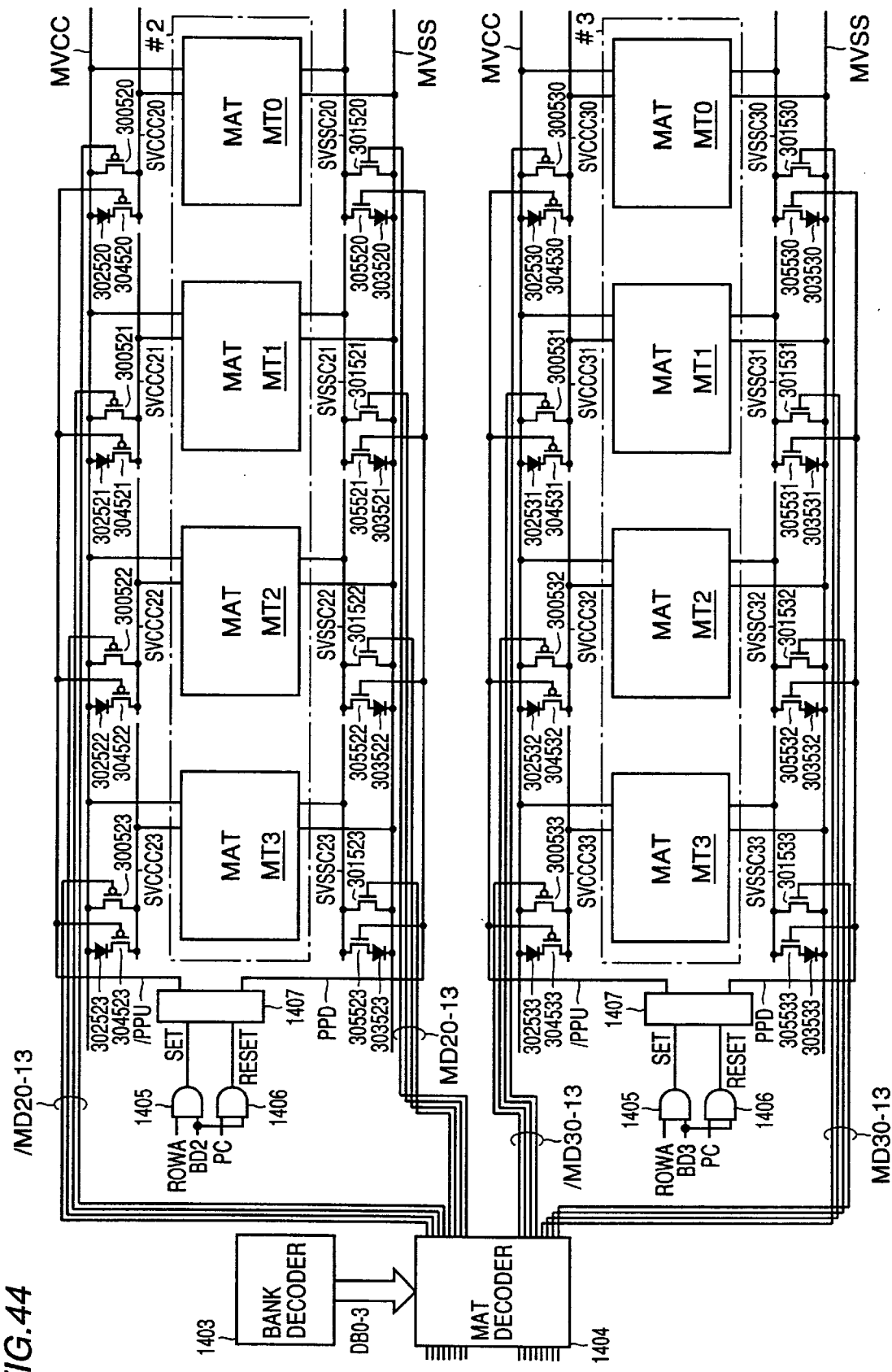
FIG. 44 is a block diagram showing the structure (right halo of the SDRAM according to the embodiment 15 of the present invention.

An SDRAM according to an embodiment 15 of the present invention is additionally provided with AND circuits 1405 and 1406 and an RS flip-flop circuit 1407, as shown in FIGS. 43 and 44. These circuits 1405 to 1407 are provided for each bank. In a bank #0, the AND circuit 1405 receives a control signal ROWA indicating activation of a row system and a bank decode signal BD0 and supplies a set signal SET to the flip-flop circuit 1407. The AND circuit 1406 receives a control signal PC instructing precharging and the bank decode signal BD0 and supplies a reset signal RSET to the flip-flop circuit 1407. The flip-flop circuit 1407 generates a low-level control signal /PPU when set in response to the set signal SET, while generating a high-level control signal PPD when reset in response to the reset signal RSET. Also in remaining banks #1 to #3, the circuits 1405 to 1407 are structured similarly to the above.

A timing chart showing operations of the SDRAM having the aforementioned structure is similar to that shown in FIG. 39. One of bank decode signals BD0 to BD3 goes high, so that the control signal /PPU goes low and the control signal PPD goes high when the control signal ROWA goes high in the bank selected in response. When the control signal PC goes high, the control signal /PPU goes high and the control signal PPD goes low.

Therefore, four sub power supply lines and four sub ground lines corresponding to mats MT0 to MT3 are simultaneously precharged in activation of the row system, i.e., before activation of column decoders (column systems) of the mats MT0 to MT3. Then, charging of the sub power supply lines and the sub ground lines is ended in precharging of pairs of bit lines. Therefore, precharging of the sub power supply lines and the sub ground lines is started before activation of the column systems, and continued during the activation period of the column systems.

Embodiment 16

While the diodes and the transistors for precharging the sub power supply lines and the sub ground lines are provided for each mat in each of the embodiments 12 to 15, a level shift circuit is provided for precharging four sub power supply lines and another level shift circuit is provided for precharging four sub ground lines in an embodiment 16 of the present invention.

Figure 45:
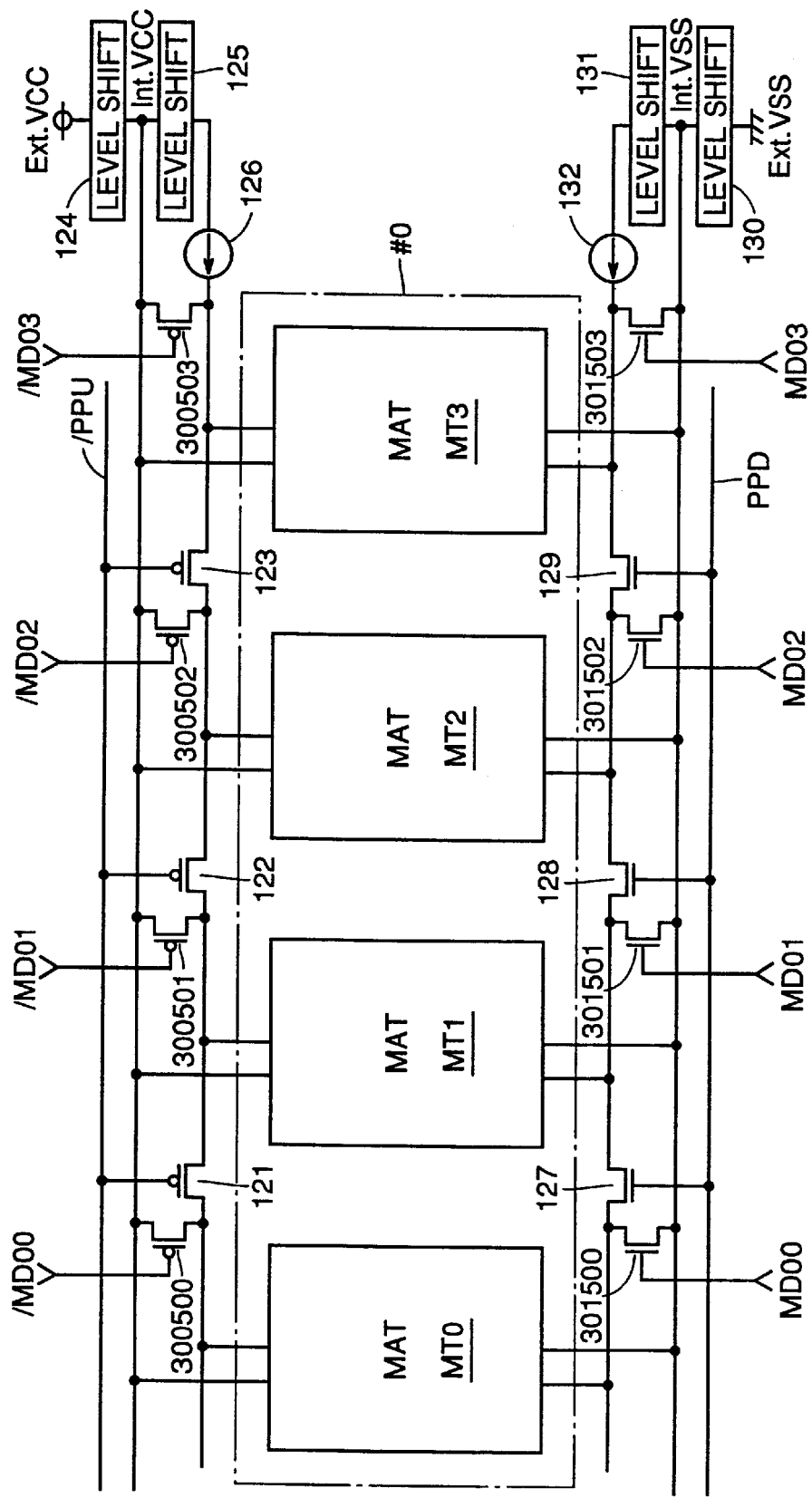
FIG. 45 is a block diagram showing the structure of a bank in an SDRAM according to an embodiment 16 of the present invention.

As representatively shown in FIG. 45, three P-channel MOS transistors 121 to 123 are connected between sub power supply lines SVCCC00 to SVCCC03 respectively in a bank #0. A control signal /PPU is supplied in common to the gates of the transistors 121 to 123. On the basis of an external power supply voltage Ext.VCC, a level shift circuit 124 supplies a lower internal power supply voltage Int.VCC to a main power supply line MVCC. On the basis of the internal power supply voltage Int.VCC, another level shift circuit 125 supplies an equal or higher prescribed voltage to one sub power supply line SVCCC03 through a constant current circuit 126.

On the other hand, N-channel MOS transistors 127 to 129 are connected between the sub power supply lines SVSSC00 to SVSSC03 respectively. A control signal PPD is supplied in common to the gates of the transistors 127 to 129. On the basis of an external ground voltage Ext.VSS, a level shift circuit 130 supplies a higher internal ground voltage Int.VSS to a main ground line MVSS. On the basis of the internal ground voltage Int.VSS, another level shift circuit 131 supplies an equal or higher prescribed voltage to one sub ground line SVSSC03 through a constant current circuit 132.

In the SDRAM having the aforementioned structure, the transistors 121 to 123 are turned on in response to the low-level control signal /PPU generated in activation of a row system, whereby the single level shift circuit 125 preliminarily precharges all sub power supply lines SVCCC00 to SVCCC03 before column decoders (column systems) in the mats MT0 to MT3 are activated. Similarly, the transistors 127 to 129 are turned on in response to the high-level control signal PPD generated in activation of the row system, whereby the single level shift circuit 131 preliminarily precharges all sub ground lines SVSSC00 to SVSSC03 before activation of the column systems.

A peak current flowing in precharging can be suppressed due to the constant current circuits 126 and 132.

In this case, the transistors 121 to 123 are preferably turned off when the sub power supply lines SVCCC00 to SVCCC03 are shorted to the main power supply line MVCC while the transistors 127 to 129 are also preferably turned off when the sub ground lines SVSSC00 to SVSSC03 are shorted to the main ground line MVSS. Alternatively, control signals /PPU and PPD of intermediate voltages may be supplied to the gates of the transistors 121 to 123 and 127 to 129 so that the transistors 121 to 123 and 127 to 129 enter high-resistance states. The resistance values in the high-resistance states are so set that a certain sub power supply line and a certain sub ground line exert no remarkable influence on the voltages of the remaining sub power supply lines when shorted to the main power supply line MVCC and the main ground line MVSS respectively. In this case, the resistance values are effectively set at values capable of holding the voltage of each sub power supply line constant. A large leakage current flowing in a mat corresponding to an accessed sub power supply line suppresses increase of leakage currents flowing in the mats corresponding to the remaining sub power supply lines. In the direct current, a time required for recovering the voltage of each sub power supply line to the power supply voltage when each mat is accessed can be reduced by holding the voltage of each sub power supply line constant.

The level shift circuit 124 can be formed by a well-known voltage down convertor (VDC), and this also applies to the level shift circuit 125.

Figure 46:
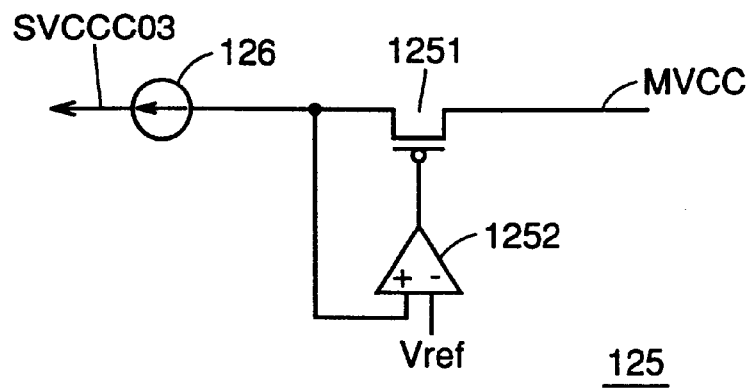
FIG. 46 is a circuit diagram showing the structure of a level shift circuit shown in FIG. 45.

As shown in FIG. 46, the level shift circuit 125 includes a P-channel MOS transistor 1251 and a differential amplifier 1252. The P-channel MOS transistor 1251 is connected between the main power supply line MVCC and the sub power supply line SVCCC03, and controlled in response to an output voltage of the differential amplifier 1252. The differential amplifier 1252 so controls the transistor 1251 that a prescribed voltage for precharging the sub power supply line SVCCC03 is fed back and equalized with a reference voltage Vref.

Figure 47:
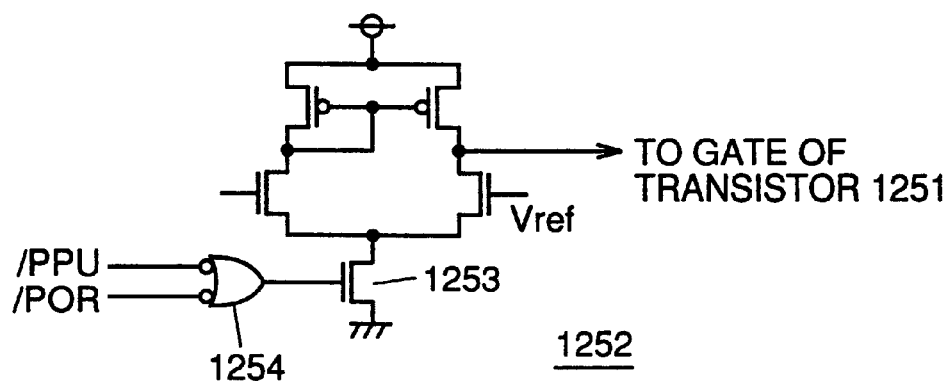
FIG. 47 is a circuit diagram showing the structure of a differential amplifier shown in FIG. 46.

As shown in FIG. 47, the differential amplifier 1252 has a well-known structure, and a NAND circuit (negative logic) 1254 is provided for supplying an output signal to the gate of an N-channel MOS transistor 1253 included in the differential amplifier 1252. The NAND circuit 1254 receives the control signal /PPU and a power-on reset signal /POR. The power-on reset signal /POR goes low for a prescribed period immediately after power supply. Therefore, the level shift circuit 125 precharges the sub power supply lines SVCCC00 to SVCCC03 immediately after power supply, while precharging the sub power supply lines SVCCC00 to SVCCC03 also in activation of the row system before activation of the column system.

Figure 48:
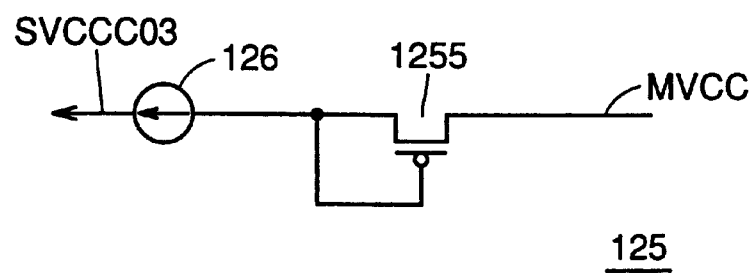
FIG. 48 is a circuit diagram showing another structure of the level shift circuit shown in FIG. 45.

The level shift circuit 125 may be replaced with a diode-connected P-channel MOS transistor 1255, as shown in FIG. 48. In this case, the sub power supply line SVCCC03 is supplied with a voltage lower than the power supply voltage VCC of the main power supply line MVCC by the threshold voltage of the transistor 1255.

Figure 49:
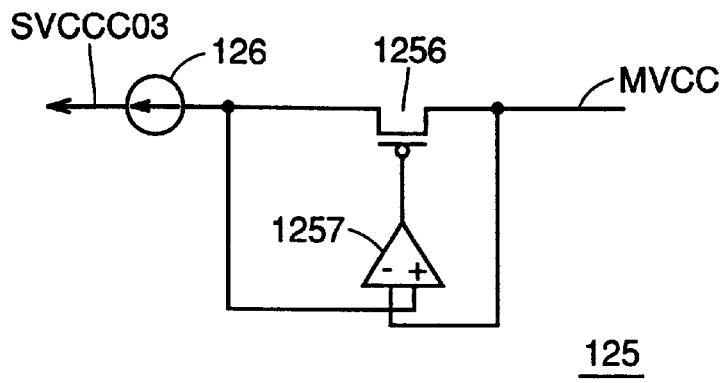
FIG. 49 is a circuit diagram showing still another structure of the level shift circuit shown in FIG. 45.

The level shift circuit 125 may alternatively be formed by a P-channel MOS transistor 1256 and a differential amplifier 1257 having a prescribed offset voltage, as shown in FIG. 49. The offset voltage of the differential amplifier 1257 can be generated by rendering the threshold value of a transistor closer to an inversion input terminal (−) different from that of a transistor closer to a non-inversion input terminal (+). In this case, the differential amplifier 1257 so controls the transistor 1256 that the difference between the voltage VCC of the main power supply line MVCC and the voltage for precharging the sub power supply line SVCCC03 is equal to the offset voltage. Therefore, the sub power supply line SVCCC03 is supplied with a voltage lower than the power supply voltage VCC by the offset voltage.

Figure 50:
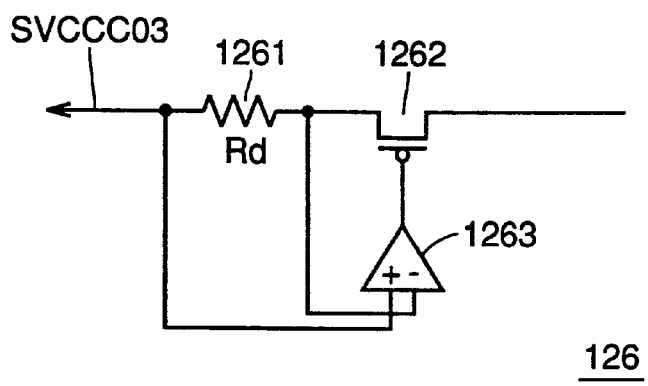
FIG. 50 is a circuit diagram showing the structure of a constant current circuit shown in FIG. 45.

The constant current circuit 126 shown in FIG. 45 includes a dummy resistance 1261 connected between the level shift circuit 125 and the sub power supply line SVCCC03, a P-channel MOS transistor 1262 serially connected with the dummy resistance 1261, and a differential amplifier 1263 having a prescribed offset voltage as shown in FIG. 50, for example. The voltages on both sides of the dummy resistance 1261 are supplied to an inversion amplification terminal (−) and a non-inversion amplification terminal (+) of the differential amplifier 1263 respectively. An output terminal of the differential amplifier 1263 is connected to the gate of the transistor 1262. Therefore, the differential amplifier 1263 so controls the transistor 1262 that the voltage across the dummy resistance 1261 is equal to the offset voltage. Assuming that Rd represents the resistance value of the dummy resistance 1261 and Voff represents the offset voltage, a constant current Vofid flows in the constant current circuit 126.

Figure 51:
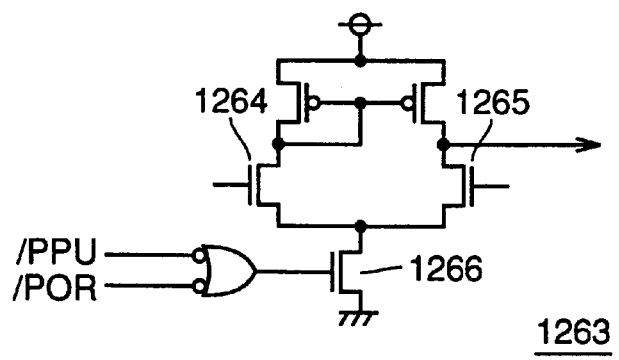
FIG. 51 is a circuit diagram showing the structure of a differential amplifier shown in FIG. 50.

The differential amplifier 1263 shown in FIG. 50 has a well-known structure as shown in FIG. 51, for example. The threshold value of a transistor 1264 is different from that of a transistor 1265, so that the differential amplifier 1263 has an offset voltage. A NAND circuit (negative logic) 1267 is provided for supplying an output signal to the gate of a transistor 1266. Therefore, the differential amplifier 1263 operates in power supply similarly to the differential amplifier 1252 shown in FIG. 47, and operates in activation of the row system before activation of the column system. Consequently, the constant current circuit 126 including such a differential amplifier 1263 can supply a constant current to the sub power supply line SVCCC03 immediately after power supply and in activation of the row system.

Embodiment 17

Figure 52:
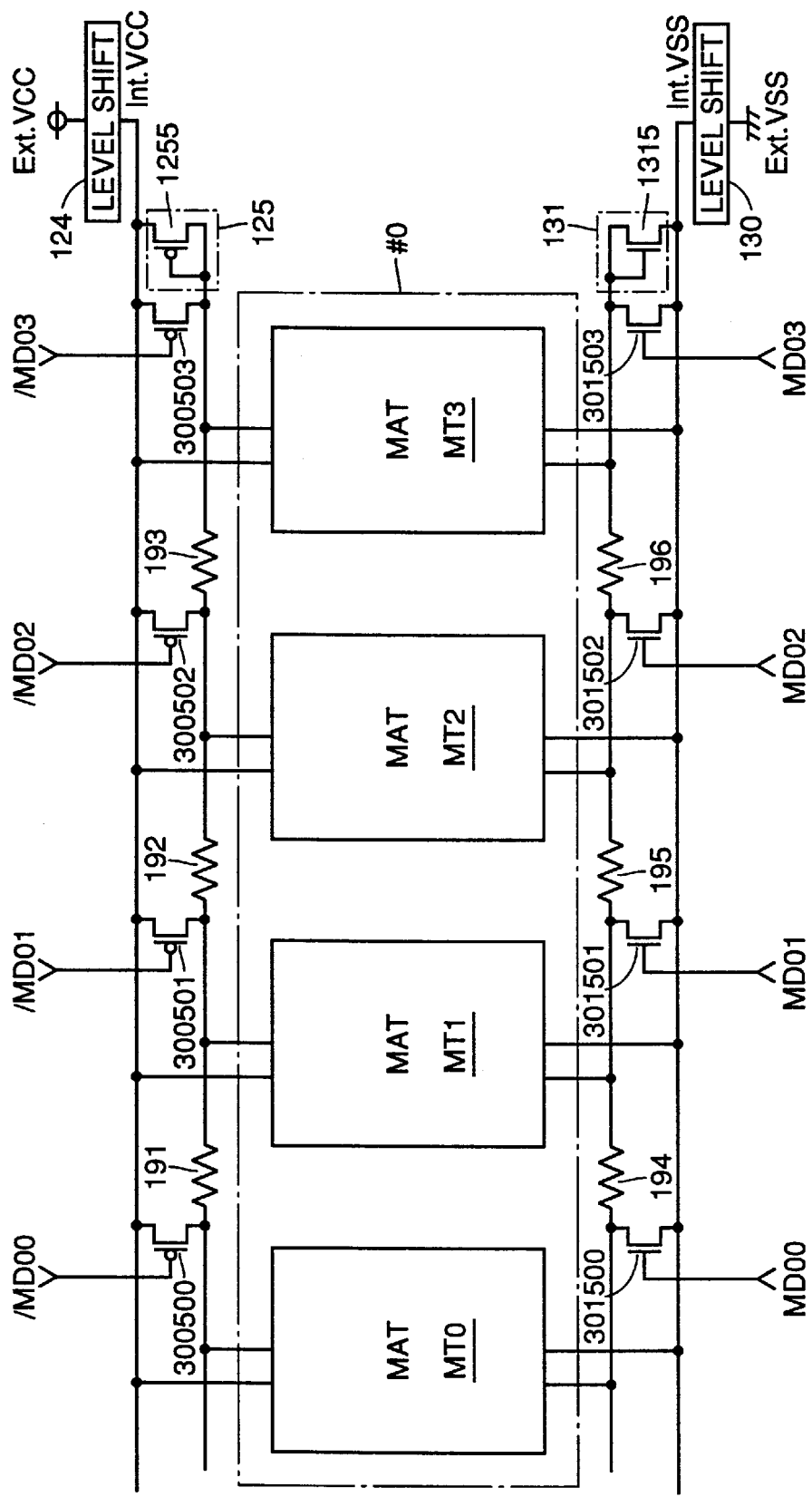
FIG. 52 is a block diagram showing the structure of a bank in an SDRAM according to an embodiment 17 of the present invention.

While the P-channel MOS transistors 121 to 123 are connected between the sub power supply lines SVCCC00 to SVCCC03 respectively and the N-channel MOS transistors 127 to 129 are connected between the sub ground lines SVSSC00 to SVSSC03 respectively in the embodiment 16, high resistive elements 191 to 196 are connected in place of these transistors according to an embodiment 17 of the present invention, as shown in FIG. 52. Further, a diode-connected P-channel MOS transistor 1255 similar to that shown in FIG. 48 is connected between a main power supply line MVCC and a sub power supply line SVCCC03 as a level shift circuit 125. In addition, a diode-connected N-channel MOS transistor 1315 is connected between a main ground line MVSS and a sub ground line SVSSCO3 as a ground-side level shift circuit 131.

In the embodiment 17, the high resistive elements 191 to 193 substitute for the P-channel MOS transistors 121 to 123 receiving the control signal /PPU of the intermediate voltage, and the high resistive elements 194 to 196 substitute for the N-channel MOS transistors 127 to 129 receiving the control signal PPD of the intermediate voltage. Therefore, the resistance values of the high resistive elements 191 to 196 are so properly set that certain sub power supply line and sub ground line shorted to the main power supply line MVCC and the main ground line MVSS respectively exert no influence on the remaining sub power supply lines and sub ground lines.

Embodiment 18

Figure 53:
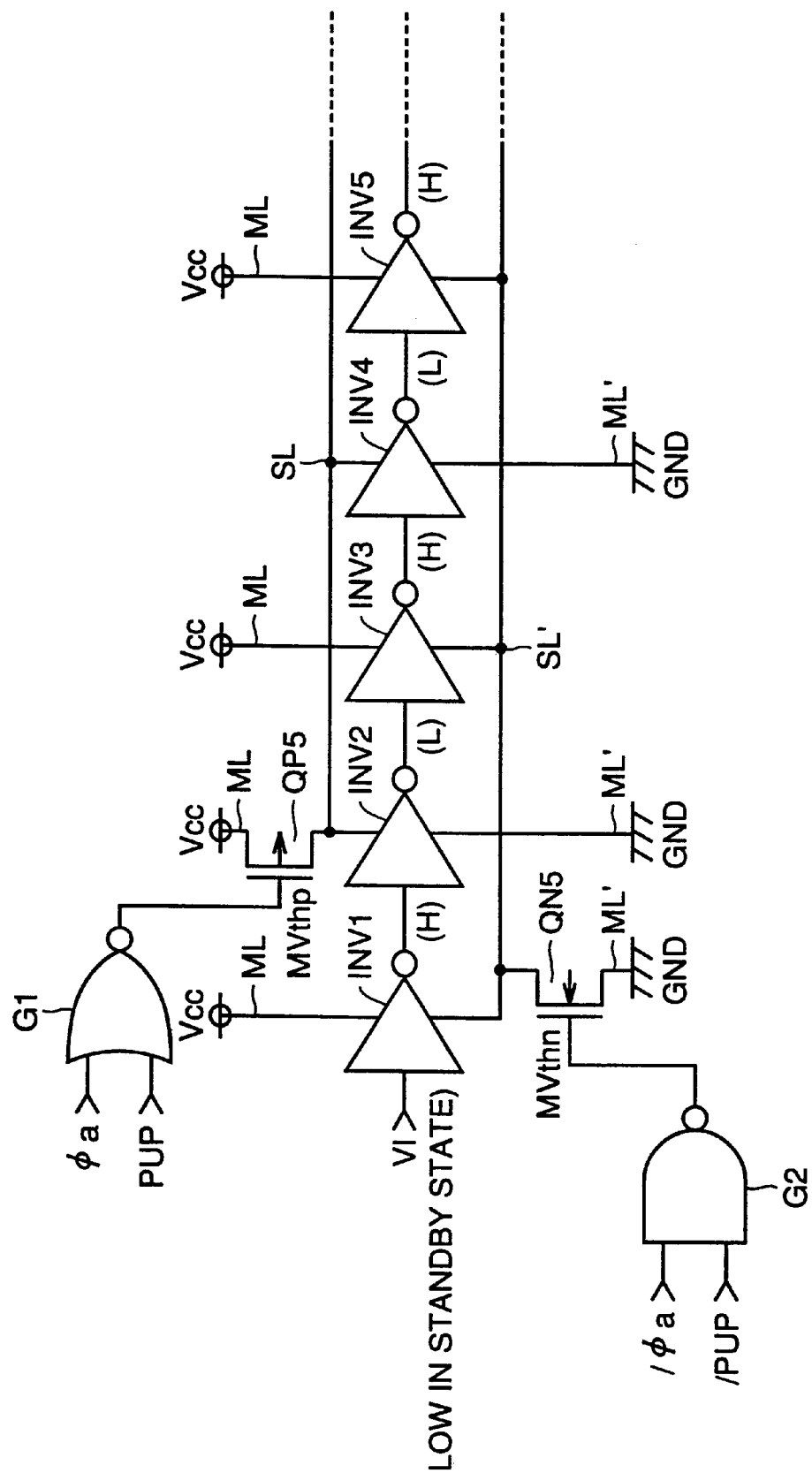
FIG. 53 is a circuit diagram showing the structure of a principal part of a CMOS semiconductor integrated circuit device according to an embodiment 18 of the present invention.
Figure 54:
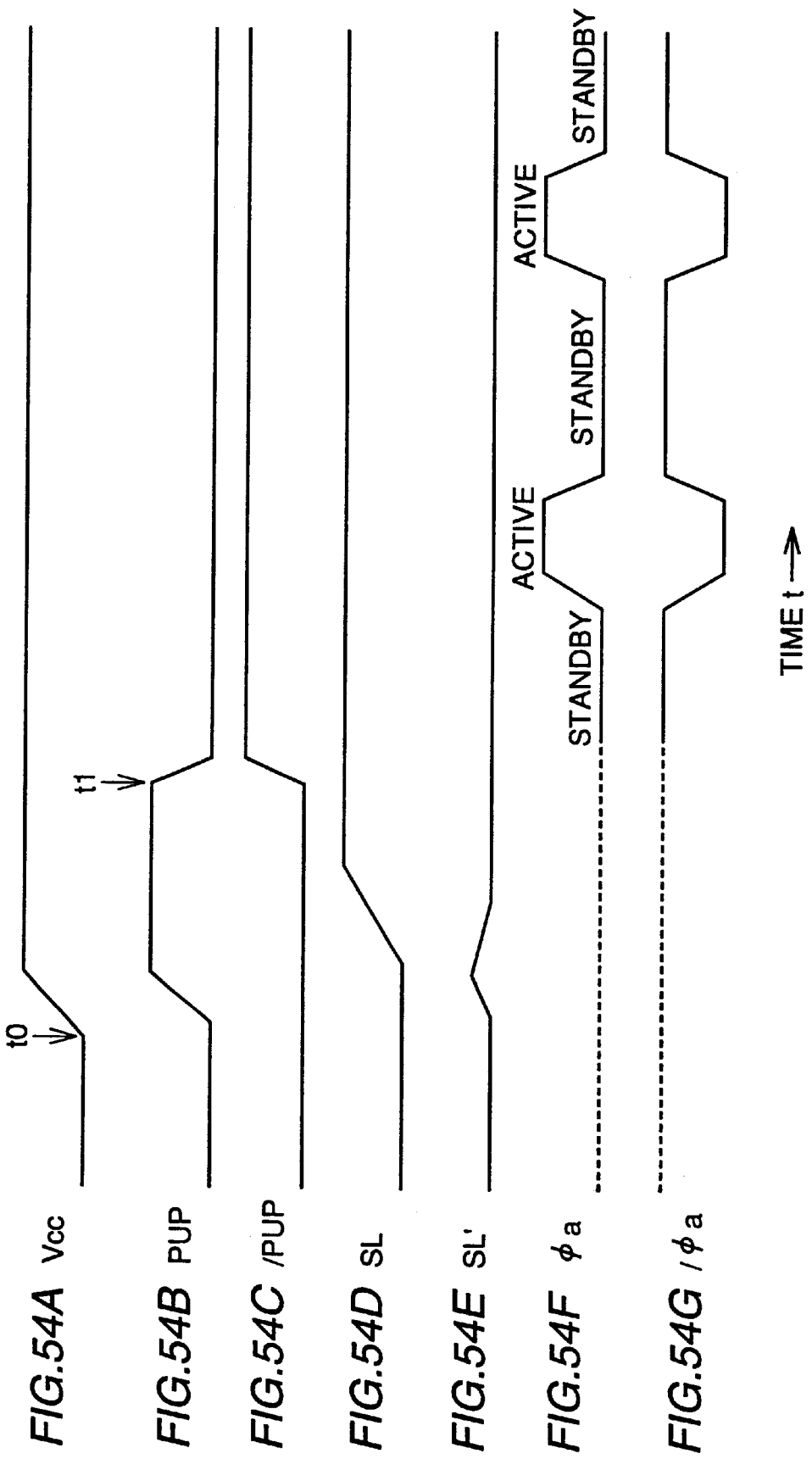
FIGS. 54A to 54G are timing charts showing operations of the CMOS semiconductor integrated circuit device shown in FIG. 53.
Figure 61:
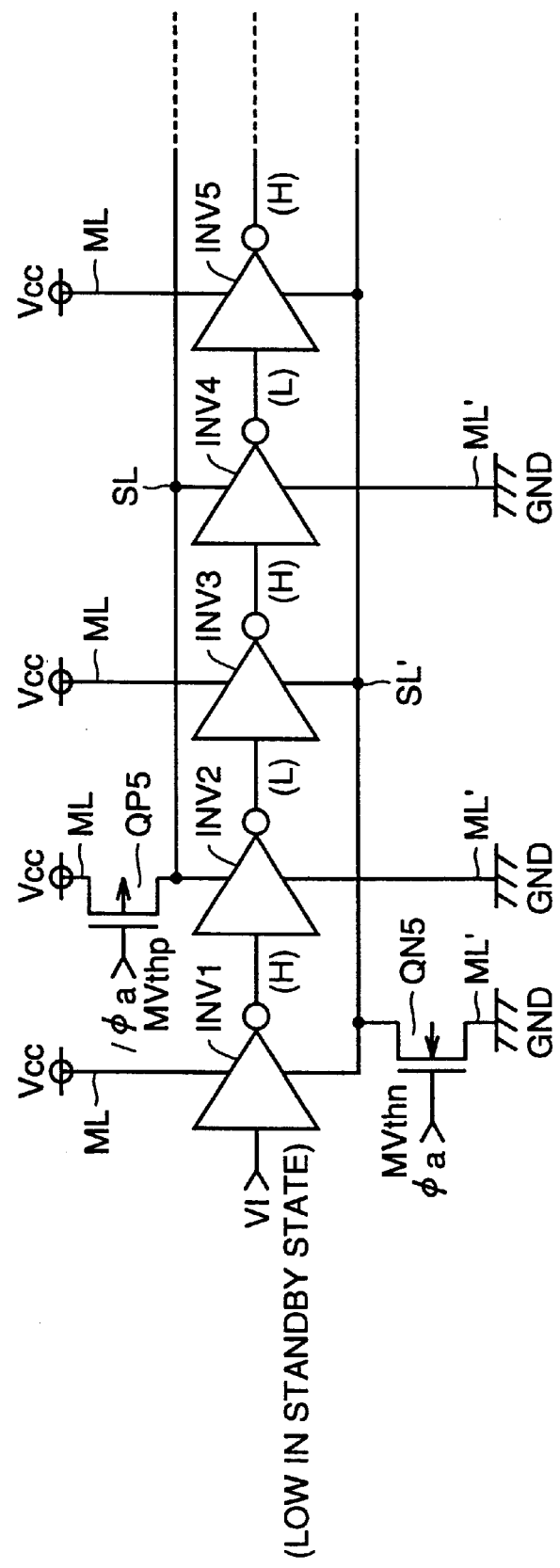
FIG. 61 is a circuit diagram showing the structure of a principal part of a conventional CMOS semiconductor integrated circuit device employing a hierarchical power supply system.

FIG. 53 is a circuit diagram showing a principal part of a CMOS semiconductor integrated circuit device according to an embodiment 18 of the present invention in contrast with FIG. 61.

Referring to FIG. 53, the CMOS semiconductor integrated circuit device according to the embodiment 18 is different from that shown in FIG. 61 in a point that a NOR gate G1 and a NAND gate G2 are newly provided.

The NOR gate GI receives signals φa and PUP, and its output is inputted in the gate of a P-channel MOS transistor QP5. The NAND gate G2 receives signals /φa and /PUP, and its output is inputted in the gate of an N-channel MOS transistor QN5. Therefore, the P-channel MOS transistor QP5 is rendered conductive when at least one of the signals φa and PUP goes high, while the N-channel MOS transistor QN5 is rendered conductive when at least one of the signals /φa and IPUP goes low.

FIGS. 54A to 54G are timing charts showing operations of the CMOS semiconductor integrated circuit device shown in FIG. 53. Before power supply, the signals PUP and /PUP are at low levels while a sub power supply line SL and a sub ground line SL' are at a ground potential GND. When a power supply potential Vcc is applied at a certain time t0, the signal PUP rises to a high level and the signal /PUP goes low. Thus, the MOS transistors QP5 and QN5 are turned on for coupling a main power supply line ML and the sub power supply line SL with each other and precharging the sub power supply line SL at the power supply potential Vcc. while coupling a main ground line ML' and the sub ground line SL' with each other and precharging the sub ground line SL' at the ground potential GND.

At this time, an input signal VI is held at a low level of a standby state. Thus, the main power supply line ML or the main ground line ML' having relatively large current suppliability supplies an output level of each invertor, whereby the output level of each invertor is defined in a short time and a through current flowing when an input of the invertor is at an intermediate level can be minimized. If the input signal VI is set high in a precharge period, the sub power supply line SL or the sub ground line SL' having relatively small current suppliability supplies the output level of each invertor and hence a long time is required for defining the output level of each invertor and the through current continuously flows when the input of the invertor is at the intermediate level.

At a time t1 after a lapse of a prescribed time from the time t0, the signal PUP falls to a low level and the signal /PUP goes high. Thus, the MOS transistors QP5 and QN5 are turned off to disconnect the main power supply line ML and the sub power supply line SL from each other while disconnecting the main ground line ML' and the sub ground line SL' from each other.

Thereafter the main power supply line ML and the main ground line ML' are disconnected from the sub power supply line SL and the sub ground line SL' respectively in a standby state for reducing a standby current while the main power supply line ML and the main ground line ML' are connected with the sub power supply line SL and the sub ground line SL' respectively for supplying the power supply potential Vcc to invertors INV1, INV2, . . . in an active state, similarly to the CMOS semiconductor integrated circuit device shown in FIG. 61.

According to the embodiment 18, the sub power supply line SL and the sub ground line SL' are precharged at the power supply potential Vcc and the ground potential GND respectively at a constant time after power supply. Therefore, the operating time is not increased to cause a malfunction in the first active cycle after power supply, dissimilarly to the prior art performing no precharging.

This is also applicable to the SDRAM according to the embodiment 1. In the circuit shown in FIG. 3, the sub power supply lines SL1 to SL4 and SL10 require a certain degree of time to reach the power supply potential Vcc after the MOS transistors 21 to 24 and 45 are turned on when the signals Y20 to Y23 and BH0 are first inputted after power supply and hence it takes a long time to raise the potentials of the column selection lines CSL and SCSL, leading to a malfunction.

Figure 55:
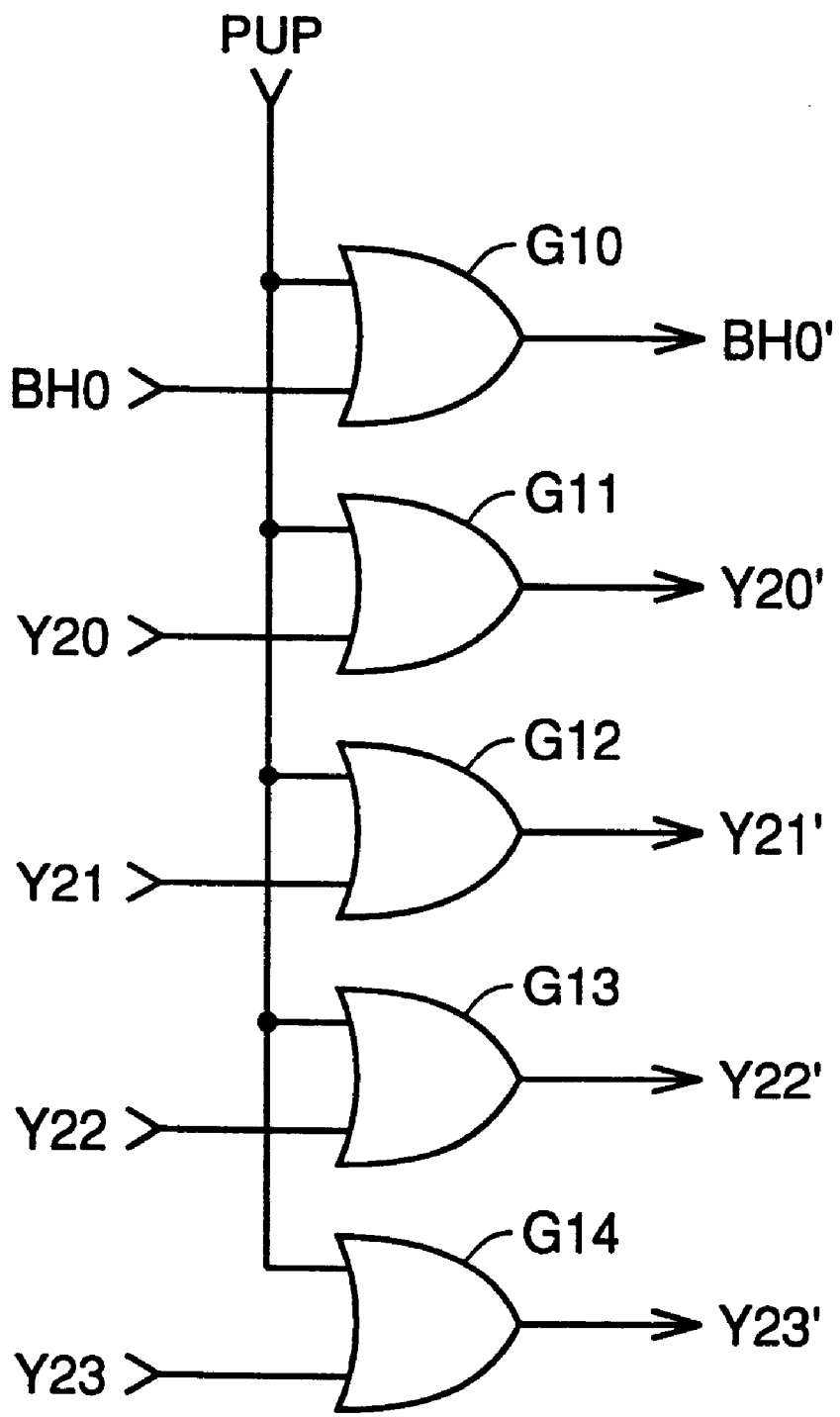
FIG. 55 is a circuit diagram showing a modification of the embodiment 18.

Therefore, OR gates G10 to G14 are provided as shown in FIG. 55. The signal PUP is inputted in first input nodes of the OR gates G10 to G14. The signals BH0 and Y20 to Y23 are inputted in second input nodes of the OR gates G10 to G14 respectively. Output signals BH0' and Y20' to Y23' from the OR gates G10 to G14 are inputted in the invertors 31 and 25 to 28 shown in FIG. 3 in place of the signals BH0 and Y20 to Y23 respectively.

Therefore, the sub power supply lines SL1 to SL4 and SL10 are precharged at the power supply potential Vcc in the precharge period after power supply, to cause no malfunction.

Embodiment 19

In the CMOS semiconductor integrated circuit device shown in FIG. 53, each of the invertors INV1, INV2, . . . is formed by a P-channel MOS transistor and an N-channel MOS transistor having relatively low threshold voltages LVthp and LVthn respectively in order to increase the operating speed.

If transition from an active state to a standby state may not be performed at a high speed, however, current consumption can be further reduced by replacing the MOS transistor turned on in the standby state with a MOS transistor having a relatively high threshold voltage MVth.

Figure 56:
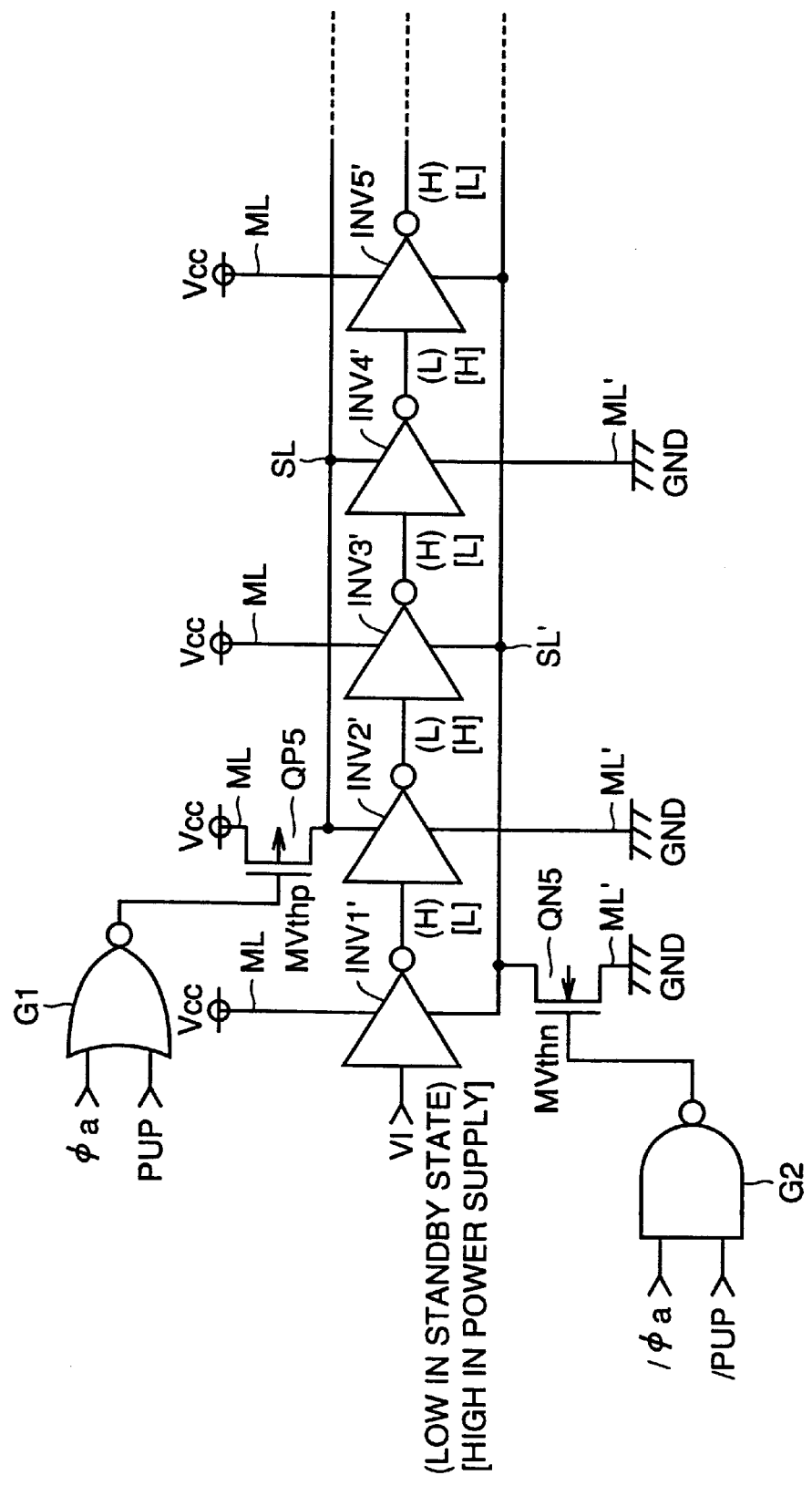
FIG. 56 is a circuit diagram showing the structure of a principal part of a CMOS semiconductor integrated circuit device according to an embodiment 19 of the present invention.

FIG. 56 is a circuit diagram showing a principal part of a CMOS semiconductor integrated circuit device according to an embodiment 19 of the present invention in contrast with FIG. 53.

Referring to FIG. 56, the CMOS semiconductor integrated circuit device according to the embodiment 19 is different from that shown in FIG. 53 in points that inventors NV1', INV2', . . . substitute for the invertors INV1, INV2, . . . respective land an input signal VI pulsatingly goes high for a constant time after power supply.

Figure 57:
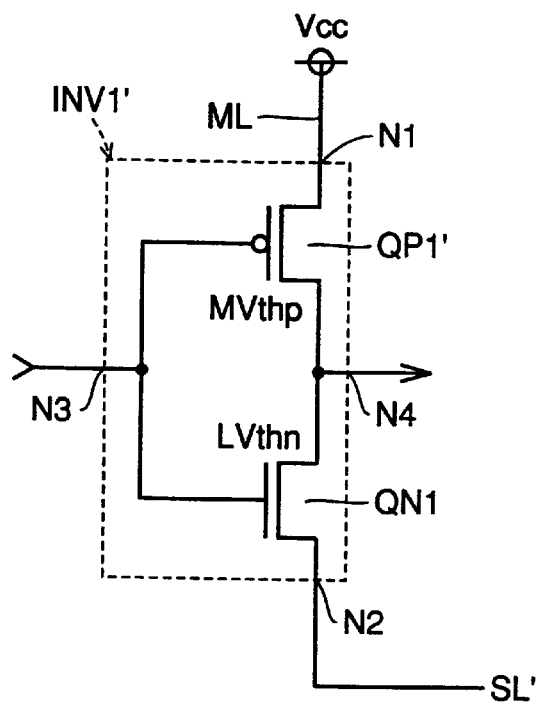
FIG. 57 is a circuit diagram showing the structure of an invertor INV1' shown in FIG. 56.

Each of the odd-stage invertors INV1', INV3', . . . outputting high levels in a standby state includes a P-channel MOS transistor QP1' having a relatively high threshold voltage MVthp and an N-channel MOS transistor QN1' having a relatively low threshold voltage LVthn serially connected between a power supply node N1 and a ground node N2, as shown in FIG. 57.

Figure 58:
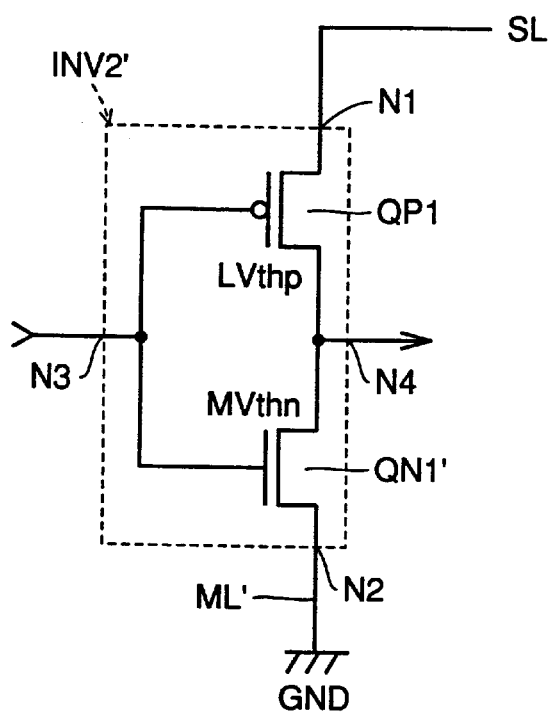
FIG. 58 is a circuit diagram showing the structure of an invertor INV2' shown in FIG. 56.
Figure 59:
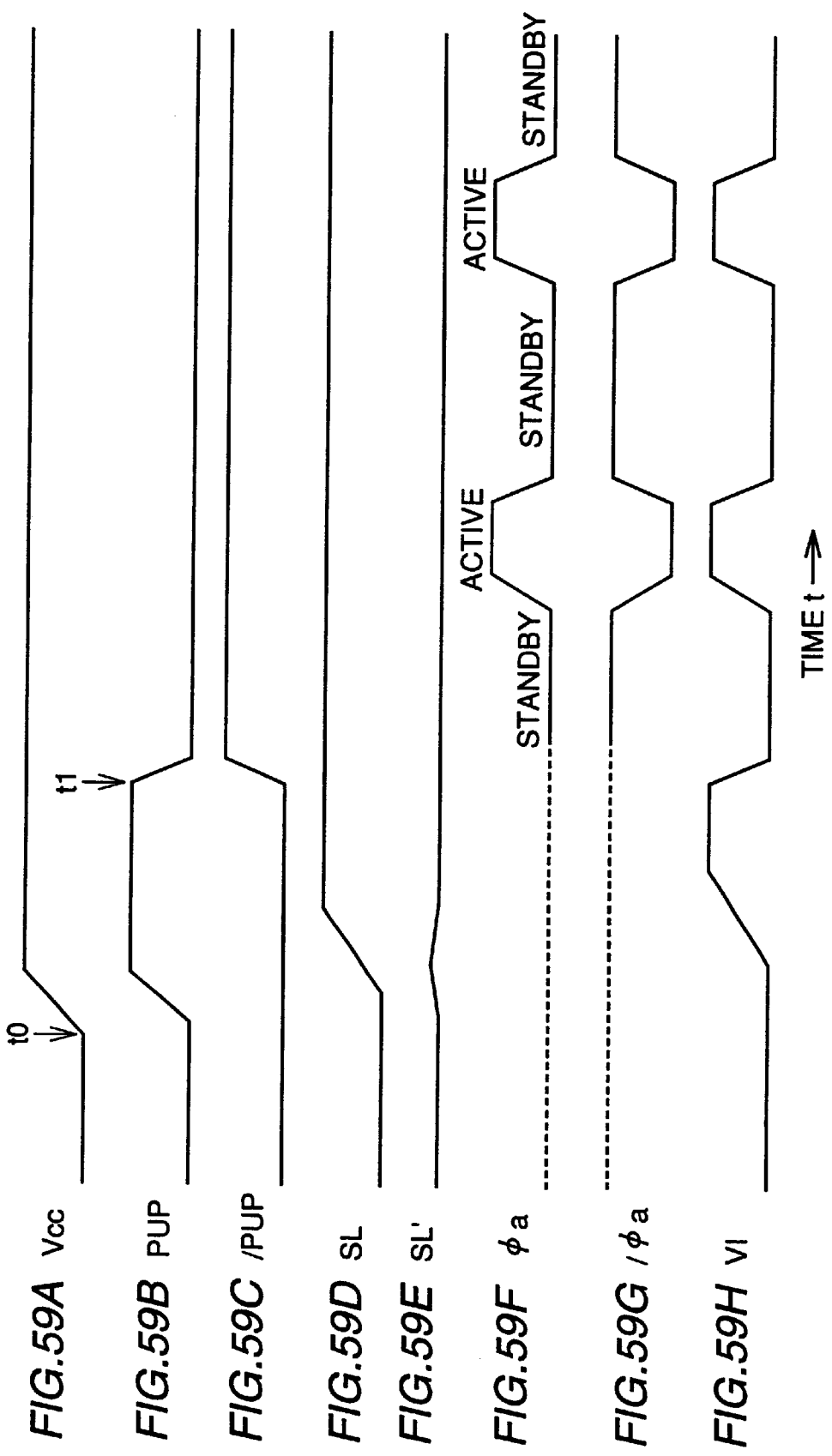
FIGS. 59A to 59H are timing charts showing operations of the CMOS semiconductor integrated circuit device shown in FIG. 56.
Figure 60:
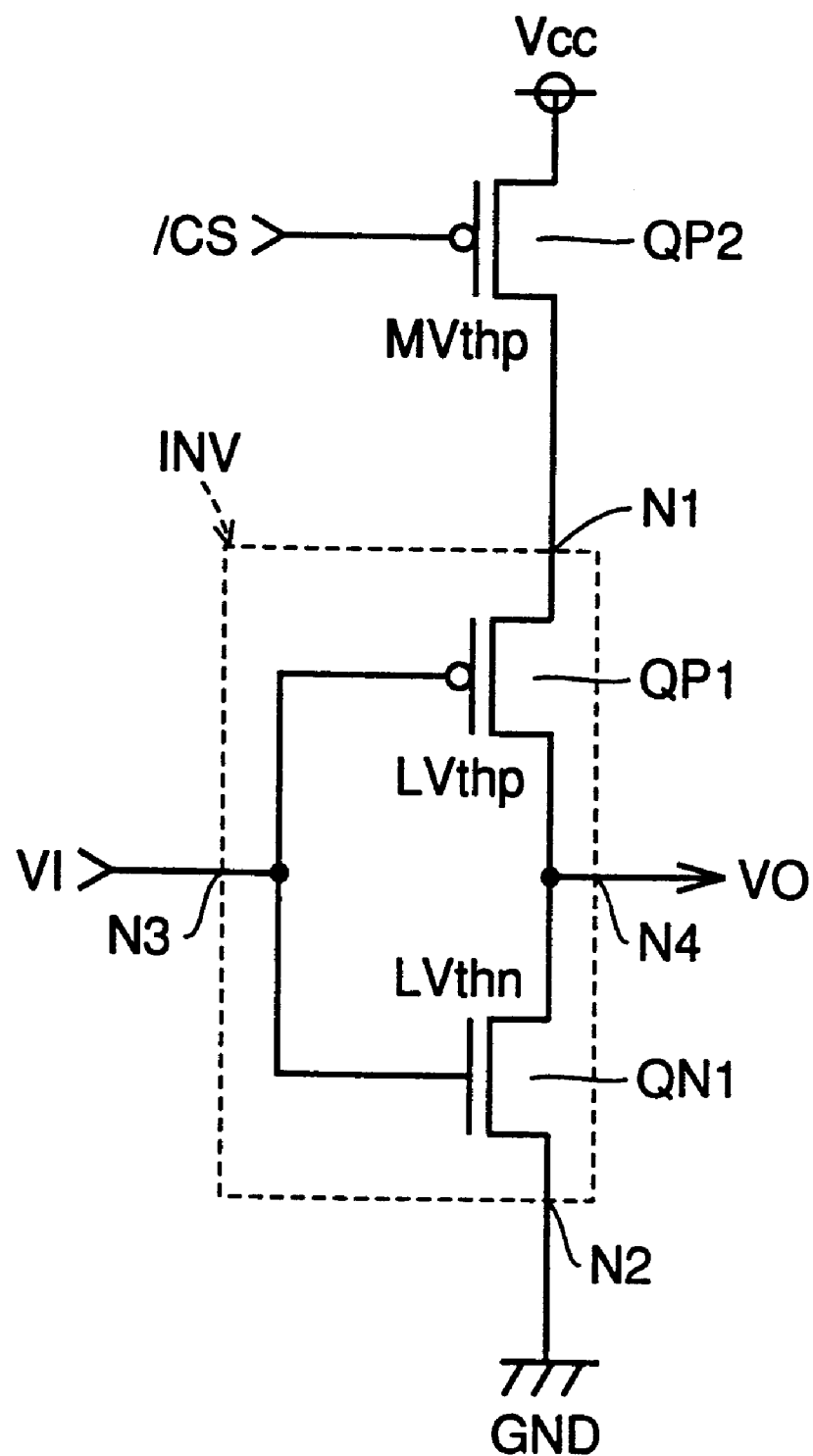
FIG. 60 is a circuit diagram showing the structure of a principal part of a conventional CMOS semiconductor integrated circuit device.

Each of the even-stage invertors INV2', INV4', . . . outputting low levels in the standby state includes a P-channel MOS transistor QP1 having a relatively low threshold voltage LVthp and an N-channel MOS transistor QN1' having a relatively high threshold voltage MVthn serially connected between a power supply node NI and a ground node N2, as shown in FIG. 58.

FIGS. 59A to 59H are timing charts showing operations of the CMOS semiconductor integrated circuit device. An input signal VI goes high for a constant period after power supply. Thus, all MOS transistors having the relatively high threshold voltages MVthp and MVthn included in the invertors INV1', INV2', . . . enter OFF states to reduce subthreshold leakage currents upon power supply. Thus, the time required for defining the potential of each node in the circuit device is reduced as compared with the circuit device shown in FIG. 53.

According to this embodiment, the threshold voltage of one of the pair of MOS transistors included in each of the invertors INV1', INV2', . . . turned on in the standby state is relatively increased an the input signal VI is set high for a constant period in power supply, whereby subthreshold leakage currents in power supply and an active state can be reduced for reducing the time for defining the potential of each node and saving current consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a plurality of memory cells, a memory cell selection line provided in correspondence to each said memory cell, a spare memory cell for substituting for defective said memory cell among said plurality of memory cells and a spare memory cell selection line provided in correspondence to said spare memory cell with a specific address signal allocated to each said memory cell, said semiconductor memory device comprising:

a main power supply line supplied with a power supply potential;

first and second transistors, having first electrodes connected to said main power supply line respectively, responsively rendered conductive when said address signal is inputted;

first and second sub power supply lines connected to second electrodes of said first and second transistors respectively;

a decoder provided in correspondence to each said memory cell selection line and driven by said power supply potential supplied from said first sub power supply line for responsively setting corresponding said memory cell selection line at a selection potential and activating corresponding said memory cell when corresponding said address signal is inputted;

a determination circuit storing said address signal allocated to said defective memory cell and responsively outputting a hit signal when said address signal is inputted;

a redundancy decoder driven by said power supply potential supplied from said second sub power supply line for responsively setting said spare memory cell selection line at a selection potential and activating said spare memory cell when said determination circuit outputs said hit signal; and a data input/output circuit inputting/outputting data between said spare memory cell activated by said redundancy decoder and an external device when said determination circuit outputs said hit signal while inputting/outputting data between said memory cell activated by said decoder and said external device when said determination circuit outputs no said hit signal.

2. The semiconductor memory device according to claim 1, wherein said decoder is responsively inactivated when corresponding said determination circuit outputs said hit signal.

3. The semiconductor memory device according to claim 1, wherein said decoder includes:

a logic circuit responsively outputting a memory cell selection signal when corresponding said address signal is inputted; and a third transistor connected between said first sub power supply line and corresponding said memory cell selection line and responsively rendered conductive when said logic circuit outputs said memory cell selection signal, and said redundancy decoder includes a fourth transistor connected between said second sub power supply line and said spare memory cell selection line and responsively rendered conductive when said determination circuit outputs said hit signal.

4. The semiconductor memory device according to claim 3, wherein the threshold voltage of said third transistor is smaller than that of said first transistor, and the threshold voltage of said fourth transistor is smaller than that of said second transistor.

5. The semiconductor memory device according to claim 3, wherein the threshold voltage of said third transistor is equal to that of said first transistor, and the threshold voltage of said fourth transistor is equal to that of said second transistor.

6. The semiconductor memory device according to claim 1, wherein said first and second transistors are responsively rendered conductive by a predetermined time when said main power supply line is supplied with said power supply potential.

7. A semiconductor memory device including a plurality of memory cells and a memory cell selection line provided in correspondence to each said memory cell with a specific address signal allocated to each said memory cell, said semiconductor memory device comprising:

a main power supply line supplied with a power supply potential;

a first transistor, having a first electrode connected to said main power supply line, responsively rendered conductive when said address signal is inputted;

a sub power supply line connected to a second electrode of said first transistor;

a decoder provided in correspondence to each said memory cell selection line and driven by said power supply potential supplied from said sub power supply line for responsively setting corresponding said memory cell selection line at a selection potential and activating corresponding said memory cell when corresponding said address signal is inputted; and a data input/output circuit for inputting/outputting data between said memory cell activated by said decoder and an external device.

8. The semiconductor memory device according to claim 7, wherein said plurality of memory cells are split into a plurality of groups each including at least one said memory cell and a specific group selection signal included in said address signal is allocated to each said group, said first transistor is provided in correspondence to each said group and responsively rendered conductive when corresponding said group selection signal is inputted, said sub power supply line is provided in correspondence to each said group and connected to said second electrode of corresponding said first transistor, and said decoder is driven by said power supply potential supplied from corresponding said sub power supply line.

9. The semiconductor memory device according to claim 7, wherein said plurality of memory cells are split into a plurality of groups each including at least one said memory cell and a specific group selection signal included in said address signal is allocated to each said group, said semiconductor memory device further including a second transistor provided in correspondence to each said group and connected between a portion of said sub power supply line close to corresponding said decoder and said main power supply line and responsively rendered conductive when corresponding said group selection signal is inputted.

10. The semiconductor memory device according to claim 7, wherein said decoder includes:

a logic circuit responsively outputting a memory cell selection signal when corresponding said address signal is inputted, and a third transistor connected between said sub power supply line and corresponding said memory cell selection line and responsively rendered conductive when said logic circuit outputs said memory cell selection signal.

11. The semiconductor memory device according to claim 10, wherein the threshold voltage of said third transistor is smaller than that of said first transistor.

12. The semiconductor memory device according to claim 10, wherein the threshold voltage of said third transistor is equal to that of said first transistor.

13. The semiconductor memory device according to claim 10, wherein a plurality of said memory cell selection lines are arranged at a predetermined pitch, a plurality of said third transistors are arranged at said predetermined pitch, and said first transistor is dispersively arranged between a plurality of said third transistors.

14. The semiconductor memory device according to claim 7, wherein said first transistor is further responsively rendered conductive by a predetermined time when said main power supply line is supplied with said power supply potential.

15. A semiconductor memory device including a plurality of memory arrays, each including a plurality of memory cells, split into a plurality of memory blocks and a memory cell selection line provided in correspondence to each said memory cell with a specific memory array selection signal allocated to each said memory array, a specific address signal allocated to each said memory cell in each said memory cell and a specific block selection signal included in said address signal allocated to each said memory block, said semiconductor memory device comprising:

a main power supply line supplied with a power supply potential;

a first transistor provided in correspondence to each said memory block with its first electrode connected to said main power supply line and responsively rendered conductive when corresponding said memory array selection signal and said block selection signal are inputted;

a first sub power supply line provided in correspondence to each said memory block and connected to a second electrode of corresponding said first transistor;

a first decoder provided in correspondence to each said memory cell selection line and driven by said power supply potential supplied from corresponding said first sub power supply line for responsively setting corresponding said memory cell selection line at a selection potential and activating corresponding said memory cell when corresponding said memory array selection signal and said address signal are inputted; and a data input/output circuit for inputting/outputting data between said memory cell activated by said first decoder and an external device.

16. The semiconductor memory device according to claim 15, wherein said first decoder includes:

a logic circuit responsively outputting a memory cell selection signal when corresponding said memory array selection signal and said address signal are inputted, and a second transistor connected between corresponding said first sub power supply line and corresponding said memory cell selection line and responsively rendered conductive when said logic circuit outputs said memory cell selection signal.

17. The semiconductor memory device according to claim 16, wherein the threshold voltage of said second transistor is smaller than that of said first transistor.

18. The semiconductor memory device according to claim 16, wherein the threshold voltage of said second transistor is equal to that of said first transistor.

19. The semiconductor memory device according to claim 16, wherein a plurality of said memory cell selection lines are arranged at a predetermined pitch, a plurality of said second transistors are arranged at said predetermined pitch, and said first transistor is dispersively arranged between a plurality of said second transistors.

20. The semiconductor memory device according to claim 16, further including:

a third transistor provided in correspondence to at least each pair of said memory blocks with its first electrode connected to said main power supply line and responsively rendered conductive when at least one of corresponding said memory array selection signal and said block selection signal is inputted, and a second sub power supply line provided in correspondence to at least each pair of said memory blocks and connected to a second electrode of corresponding said third transistor, wherein said logic circuit is driven by said power supply potential supplied from said second sub power supply line.

21. The semiconductor memory device according to claim 15, further including a second decoder provided in correspondence to each said memory array for generating said block selection signal in according to corresponding said memory array selection signal and said address signal and supplying the same to an input electrode of corresponding said first transistor.

22. The semiconductor memory device according to claim 15, wherein said first transistor is further responsively rendered conductive by a predetermined time when said main power supply line is supplied with said power supply potential.

23. A semiconductor memory device including a plurality of memory cells, a memory cell selection line provided in correspondence to each said memory cell, a spare memory cell for substituting for defective said memory cell among said plurality of memory cells and a spare memory cell selection line provided in correspondence to said spare memory cell with a specific address signal allocated to each said memory cell, said semiconductor memory device comprising:

a main power supply line supplied with a power supply potential;

a transistor, having a first electrode connected to said main power supply line, responsively rendered conductive when said address signal is inputted;

a sub power supply line connected to a second electrode of said transistor;

a decoder provided in correspondence to each said memory cell selection line and driven by said power supply potential supplied from said sub power supply line for responsively setting corresponding said memory cell selection line at a selection potential and activating corresponding said memory cell when corresponding said address signal is inputted;

a determination circuit storing said address signal allocated to said defective memory cell and responsively outputting a hit signal when said address signal is inputted;

a redundancy decoder driven by said power supply potential supplied from said sub power supply line for responsively setting said spare memory cell selection line at a selection potential and activating said spare memory cell when said determination circuit outputs said hit signal; and a data input/output circuit inputting/outputting data between said spare memory cell activated by said redundancy decoder and an external device when said determination circuit outputs said hit signal while inputting/outputting data between said memory cell activated by said decoder and said external device when said determination circuit outputs no said hit signal.

24. The semiconductor memory device according to claim 23, wherein said transistor is further responsively rendered conductive by a predetermined time when said main power supply line is supplied with said power supply potential.

25. A semiconductor device including an internal circuit operating in response to a control signal, said semiconductor device comprising:

a main power supply line supplied with a power supply potential;

a transistor, having a first electrode connected to said main power supply line, responsively rendered conductive when said control signal is inputted;

a sub power supply line, connected to a second electrode of said transistor, for supplying said power supply potential to said internal circuit; and a capacitor connected between said sub power supply line and a line of a reference potential.

26. A semiconductor device including first and second internal circuits operating in response to a control signal, said semiconductor device comprising:

a main power supply line supplied with a power supply potential;

a first transistor, having a first electrode connected to said main power supply line, responsively rendered conductive when said control signal is inputted;

a first sub power supply line, connected to a second electrode of said first transistor, for supplying said power supply potential to said first internal circuit;

a second transistor, having a first electrode connected to said main power supply line, responsively rendered conductive when said control signal in inputted with current drivability smaller than that of said first transistor; and a second sub power supply line, connected to a second electrode of said second transistor, for supplying said power supply potential to said second internal circuit with a capacitance value smaller than that of said first sub power supply line.

27. A semiconductor device including first and second internal circuits operating in response to a control signal, said semiconductor device comprising:

a main power supply line supplied with a power supply potential;

a first transistor, having a first electrode connected to said main power supply line, responsively rendered conductive when said control signal is inputted;

a first sub power supply line, connected to a second electrode of said first transistor, for supplying said power supply potential to said first internal circuit;

a second transistor, having a first electrode connected to said main power supply line, responsively rendered conductive when said control signal is inputted with current drivability larger than that of said first transistor; and a second sub power supply line, connected to a second electrode of said second transistor, for supplying said power supply potential to said second internal circuit with a capacitance value smaller than that of said first sub power supply line.

28. A semiconductor device including first and second internal circuits operating in response to first and second control signal respectively, said semiconductor device comprising:

a main power supply line supplied with a power supply potential;

a first transistor, having a first electrode connected to said main power supply line, responsively rendered conductive when said first control signal is inputted;

a first sub power supply line, connected to a second electrode of said first transistor, for supplying said power supply potential to said first internal circuit;

a second transistor, having a first electrode connected to said main power supply line, responsively rendered conductive when said second control signal is inputted with current drivability equivalent to that of said first transistor;

a second sub power supply line, connected to a second electrode of said second transistor, for supplying said power supply potential to said second internal circuit with a capacitance value smaller than that of said first sub power supply line; and a first capacitor connected between said second sub power supply line and a line of reference potential.

29. The semiconductor device according to claim 28, further including a second capacitor connected between said first sub power supply line and a line of said reference potential.

* * * * *